United States Patent
Wang et al.

(10) Patent No.: US 9,944,846 B2
(45) Date of Patent: Apr. 17, 2018

(54) COMPOSITIONS FOR ELECTRONIC APPLICATIONS

(71) Applicant: E I DU PONT DE NEMOURS AND COMPANY, Wilmington, DE (US)

(72) Inventors: Ying Wang, West Chester, PA (US); Steven Kit Chow, Brooklyn, NY (US); Norman Herron, Newark, DE (US); Michael Henry Howard, Jr., Montchanin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 773 days.

(21) Appl. No.: 14/471,661

(22) Filed: Aug. 28, 2014

(65) Prior Publication Data

US 2016/0060512 A1 Mar. 3, 2016

(51) Int. Cl.
*H01L 51/54* (2006.01)
*C09K 11/06* (2006.01)
(Continued)

(52) U.S. Cl.
CPC ............ *C09K 11/025* (2013.01); *C09K 11/06* (2013.01); *H01L 51/0054* (2013.01);
(Continued)

(58) Field of Classification Search
CPC ...... H05B 33/20; C09K 11/025; C09K 11/06; C09K 2211/00; C09K 2211/10; C09K 2211/1003; C09K 2211/1007; C09K 2211/1011; C09K 2211/1014; C09K 2211/1029; C09K 2211/1044; C09K 2211/1074; C09K 2211/185; H01L 51/0032; H01L 51/005; H01L 51/0051; H01L 51/0052; H01L 51/0054; H01L 51/0061; H01L 51/0062; H01L 51/0067; H01L 51/0071; H01L 51/0072; H01L 51/0077; H01L 51/0085; H01L 51/50; H01L 51/5012; H01L 51/5016; H01L 51/5206; H01L 2251/301; H01L 2251/5384
USPC ....... 428/690, 691, 411.4, 336, 917; 429/58, 429/66; 313/500–512; 257/40, 88–104, 257/E51.001–E51.052; 252/301.16–301.35
See application file for complete search history.

(56) References Cited

U.S. PATENT DOCUMENTS 5,247,190 A 9/1993 Friend et al.
5,408,109 A 4/1995 Heeger et al.
(Continued)

FOREIGN PATENT DOCUMENTS

EP 0443861 B1 7/1995
EP 2080762 A1 7/2009
(Continued)

OTHER PUBLICATIONS

Zhu, Lei et al., "An Improved Preparation of Arylboronates: Application in One-Pot Suzuki Biaryl Synthesis", J. Org. Chem., vol. 68, No. 9, 2003, pp. 3729-3732.
(Continued)

*Primary Examiner* — Andrew K Bohaty

(57) ABSTRACT

This invention relates to a composition including (a) a dopant, (b) a first host having at least one unit of Formula I, and (c) a second host compound having Formula II. The formulae have the structures:

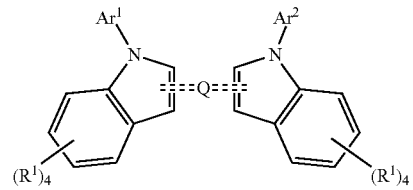

Formula I

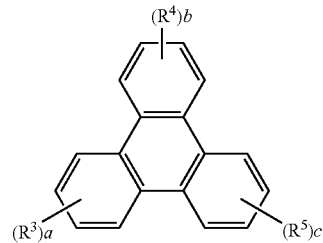

Formula II where Q is a fused ring linkage having the formula

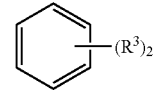

In Formula I: $Ar^1$ is an aromatic group including at least one electron-withdrawing group or a deuterated analog; $Ar^2$ is an aryl group, an aromatic group including at least one electron-withdrawing group or a deuterated analog; $R^1$ and $R^2$ are the same or different at each occurrence and are H, D, aryl or deuterated aryl. In Formula II: $R^3$ is the same or different at each occurrence and is D, aryl, or deuterated aryl, with the proviso that at least one $R^3$ is aryl or deuterated aryl; $R^4$ and $R^5$ are the same or different at each occurrence and are D, aryl, or deuterated aryl; a is an integer from 1-4; and b and c are the same or different and are an integer from 0-4.

20 Claims, 1 Drawing Sheet

(51) Int. Cl.
　　*C09K 11/02*　　(2006.01)
　　*H01L 51/00*　　(2006.01)
　　*H05B 33/20*　　(2006.01)
　　*H01L 51/50*　　(2006.01)

(52) U.S. Cl.
　　CPC ......... *H01L 51/0072* (2013.01); *H05B 33/20* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/185* (2013.01); *H01L 51/0085* (2013.01); *H01L 51/5016* (2013.01); *H01L 2251/5384* (2013.01)

(56) References Cited

U.S. PATENT DOCUMENTS

| | | | |
|---|---|---|---|
| 5,962,631 | A | 10/1999 | Woo et al. |
| 6,670,645 | B2 | 12/2003 | Grushin et al. |
| 6,875,524 | B2 | 4/2005 | Hatwar et al. |
| 8,062,769 | B2 | 11/2011 | Kai et al. |
| 8,154,195 | B2 | 4/2012 | Nishimura et al. |
| 8,211,552 | B2 | 7/2012 | Nishimura et al. |
| 8,330,350 | B2 | 12/2012 | Nishimura et al. |
| 8,587,192 | B2 | 11/2013 | Nishimura et al. |
| 8,652,652 | B2 | 2/2014 | Brooks et al. |
| 8,779,655 | B2 | 7/2014 | Nishimura et al. |
| 2002/0192497 | A1* | 12/2002 | Wang .................. C09K 11/06 428/690 |
| 2004/0102577 | A1 | 5/2004 | Hsu et al. |
| 2004/0127637 | A1 | 7/2004 | Hsu et al. |
| 2005/0158577 | A1 | 7/2005 | Ishibashi et al. |
| 2005/0205860 | A1 | 9/2005 | Hsu et al. |
| 2006/0024595 | A1 | 2/2006 | Tanaka et al. |
| 2007/0063638 | A1 | 3/2007 | Tokairin et al. |
| 2007/0292713 | A9 | 12/2007 | Dobbs et al. |
| 2009/0009065 | A1 | 1/2009 | Nishimura et al. |
| 2009/0045731 | A1 | 2/2009 | Nishimura et al. |
| 2010/0072887 | A1 | 3/2010 | Kwong et al. |
| 2011/0057173 | A1* | 3/2011 | LeCloux .............. C07B 59/001 257/40 |
| 2011/0084599 | A1* | 4/2011 | Brooks ................ C07C 15/38 313/504 |
| 2011/0254436 | A1 | 10/2011 | Cheng et al. |
| 2013/0082251 | A1 | 4/2013 | Park et al. |
| 2013/0112952 | A1* | 5/2013 | Adamovich ........ H01L 51/0054 257/40 |
| 2013/0214259 | A1 | 8/2013 | Watanabe et al. |
| 2014/0117343 | A1 | 5/2014 | Zeng et al. |

FOREIGN PATENT DOCUMENTS

| | | | |
|---|---|---|---|
| EP | 2166586 | A1 | 3/2010 |
| EP | 2166585 | A1 | 3/2011 |
| WO | 00/53565 | A1 | 9/2000 |
| WO | 2003/040257 | A1 | 5/2003 |
| WO | 2003/063555 | A1 | 7/2003 |
| WO | 2004/016710 | A1 | 2/2004 |
| WO | 2007/021117 | A1 | 2/2007 |
| WO | 2007/063638 | A1 | 6/2007 |
| WO | 2009008205 | A1 | 1/2009 |
| WO | 2009008215 | A1 | 1/2009 |
| WO | 2009008216 | A1 | 1/2009 |
| WO | 2009008360 | A1 | 1/2009 |
| WO | 2009008361 | A1 | 1/2009 |
| WO | 2009008364 | A1 | 1/2009 |
| WO | 2009008365 | A1 | 1/2009 |
| WO | 2009/018009 | A1 | 2/2009 |
| WO | 2009/021126 | A2 | 2/2009 |
| WO | 2009/136595 | A1 | 11/2009 |
| WO | 2010/113755 | A1 | 10/2010 |
| WO | 2011/053334 | A1 | 5/2011 |
| WO | 2012087955 | A1 | 6/2012 |
| WO | WO 2012122356 | A2 * | 9/2012 ......... H01L 51/5206 |
| WO | WO 2013112557 | A1 * | 8/2013 ............ C09K 11/06 |

OTHER PUBLICATIONS

Yamamoto, Takakzu, "Electrically Conducting and Thermally Stable" Progress in Polymer Science, vol. 17, 1992, pp. 1153-1205.
Wang, Y., Kirk-Othmer Encyclopedia of Chemical Technology, Fourth Edition, vol. 18. (1996) (Book Not Included).
Stille, John K . "The Palladium-Catalyzed Cross-Coupling Reactions of Organotin Reagents with Organic Electrophiles", Angew. Chem. Int. Ed. Engl. 25, 1986, pp. 508-524.
Robertson, Neil, et al. "Preparation, X-ray structure and properties of a hexabominated, symmetric indole trimer and its TCNQ adduct: a new route to functional molecular systems", Journal of Materials Chemistry, 10, 2000, pp. 2043-2047.
Pindur, Ulf et al., "Indolo[3,2-b]carbazol: Reaktionsprodukt der Umsetzung von 3,3'Bisindolylmethan mit", Arch. Pharm., 320, pp. 280-282 (1987).
Perez, Dolores et al. "Selected strategies for the synthesis of triphenylenes" Chem. Soc. Rev., vol. 33, 2004, pp. 274-283.
Negishi, E. "Palladium- or Nickel-Catalyzed Cross Coupling. A New Selective Method for Carbon-Carbon Bond Formation", Accounts of Chemical Research, vol. 15, 1982, pp. 340-348.
Naka, Hiroshi et al. "Generation of arylzinc reagents through an iodine-zinc exchange reaction promoted by a non-metallic organic superbase", New Journal of Chemistry, vol. 34, 2010, pp. 1700-1706.
Murata, Miki, et al. "Palladium-Catalyzed Borylation of Aryl Halides or Triflates with Dialkoxyborane: A Novel and Facile Synthetic Route to Arylboronates" J. Org. Chem. vol. 65, No. 1, pp. 164-168 (2000).
Murata, Miki et al., "Novel Palladium(0)- Catalyzed Coupling Reaction of Dialkoxyborane with Aryl Halides: Convenient Synthetic Route to Arylboronates", J. Org. Chem., vol. 62, Issue 19, 1997, pp. 6458-6459.
Markus Photoconductive Cell Electronics and Nucleonics Dictionary, 1966, pp. 470-471 and 476 McGraw Hill Inc.
Kumada, M. "Nickel Palladium Complex Catalyzed Cross-Coupling Reactions of Organometallic Reagents With Organic Halides", App Chem, vol. 52, 1980, pp. 669-679.
Knolker, Hans-Joachim et al., "Iron-Mediated Synthesis of Indolo[2,3,-b]carbazole", Tetrahedron Letters, 39, 1998, pp. 4007-4008.
King, Benjamin T. et al., "Controlling the Scholl Reaction", J. Org. Chem. vol. 72, No. 7, 2007, pp. 2279-2288.
Janosik, T. et al., "Reactions of 2,3'-biindolyl: Synthesis of Indolo[3,2-a]carbazoles", Tetrahedron, 55, 1999, pp. 2371-2380.
Ishiyama, Tatsuo, et al. "Palladium(0)-Catalyzed Cross-Coupling Reaction of Alkoxydiboron with Haloarenes: A Direct Procedure for Arylboronic Esters", J. Org. Chem. vol. 60, No. 23, 1995, pp. 7508-7510.
Ishikawa, Shunpei et al. "Repetitive Two-step Method for Oligoarene Synthesis through Rapid Cross-coupling of Hydroxyphenylboronic Acids and Anhydrides", Chemistry Letters, vol. 35, No. 2, 2006, pp. 164-165.
International Search Report, International Application No. PCT/US2015/046917, ISA KR, Authorized Officer Se Zu Oh. (dated Dec. 4, 2015).
Gustafsson, G. et al. "Flexible light-emitting diodes made from soluble conducting polymers" Letters to Nature, vol. 357, Jun. 11, 1992, pp. 477-479.
Desarbre, E. et al., "Synthesis of Symmetric and non-symmetric indolo[2,3-c]carbazole derivatives: preparation of indolo[2,3-c]pyrrolo[3,4-a]carbazoles", J. Chem. Soc., Perkin Trans. 1, 1998, pp. 2009-2016.
CRC Handbook of Chemistry and Physics, 81st Edition, 2000-2001 (Book Not Supplied).
Colon, I. et al., "High Molecular Weight Aromatic Polymers by Nickel Coupling of Aryl Polychlorides", Journal of Polymer Science: Part A Polymer Chemistry, vol. 28, 1990, pp. 367-383.

* cited by examiner

COMPOSITIONS FOR ELECTRONIC APPLICATIONS

BACKGROUND

Field of the Disclosure

This invention relates to compositions including indolocarbazole derivative compounds which are useful in electronic devices. It also relates to electronic devices in which at least one layer includes such a compound.

Description of the Related Art

Organic electronic devices that emit light, such as light-emitting diodes that make up displays, are present in many different kinds of electronic equipment. In all such devices, an organic electroactive layer is sandwiched between two electrical contact layers. At least one of the electrical contact layers is light-transmitting so that light can pass through the electrical contact layer. The organic electroactive layer emits light through the light-transmitting electrical contact layer upon application of electricity across the electrical contact layers.

It is well known to use organic electroluminescent compounds as the electroactive component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, U.S. Pat. No. 5,247,190, U.S. Pat. No. 5,408,109, and Published European Patent Application 443 861. In many cases the electroluminescent compound is present as a dopant in a host material.

There is a continuing need for new materials for electronic devices.

SUMMARY

There is provided a composition comprising:
(a) a dopant capable of electroluminescence having an emission maximum between 380 and 750 nm,
(b) a first host compound having at least one unit of Formula I

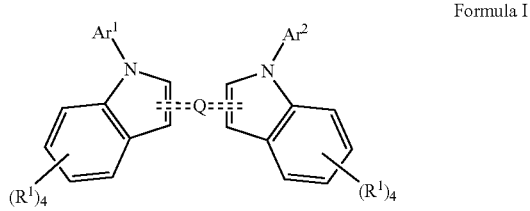

Formula I wherein:
Q is a fused ring linkage having the formula

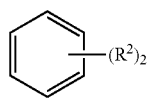

$Ar^1$ is selected from the group consisting of aromatic groups including at least one electron-withdrawing group and deuterated analogs thereof;
$Ar^2$ is selected from the group consisting of aryl groups, aromatic groups including electron transporting groups, and deuterated analogs thereof; and
$R^1$ and $R^2$ are the same or different at each occurrence and are selected from the group consisting of H, D, aryl, and deuterated aryl;
and
(c) a second host compound having Formula II

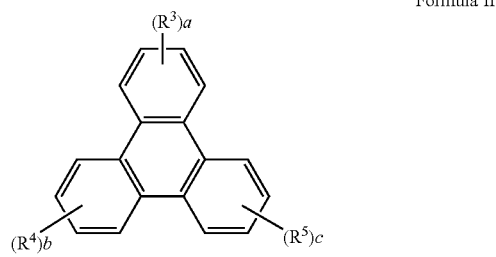

Formula II wherein:
$R^3$ is the same or different at each occurrence and are selected from the group consisting of D, aryl, and deuterated aryl, with the proviso that at least one $R^3$ is aryl or deuterated aryl;
$R^4$ and $R^5$ are the same or different at each occurrence and are selected from the group consisting of D, aryl, and deuterated aryl;
a is an integer from 1-4; and
b and c are the same or different and are an integer from 0-4.

There is also provided the above composition further comprising:
(d) a third host compound having Formula II.

There is also provided an electronic device comprising an electroactive layer comprising the above composition.

BRIEF DESCRIPTION OF THE DRAWINGS

Embodiments are illustrated in the accompanying figures to improve understanding of concepts as presented herein.

Figure 1:
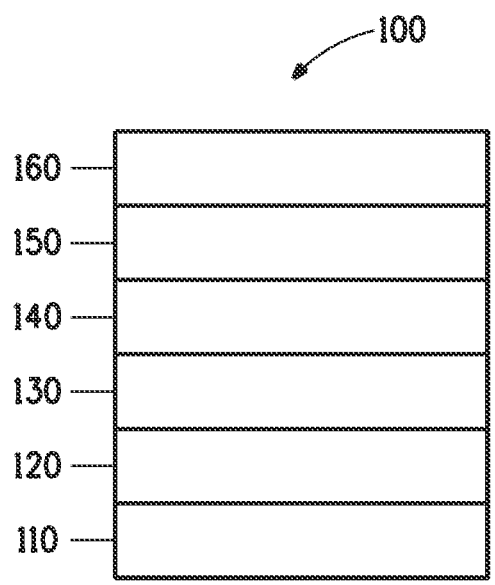
FIG. 1 includes a schematic diagram of another example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Composition, the Electronic Device, and finally Examples.

1. Definitions and Clarification of Terms

Before addressing details of embodiments described below, some terms are defined or clarified.

As used herein, the term "aliphatic ring" is intended to mean a cyclic group that does not have delocalized pi electrons. In some embodiments, the aliphatic ring has no unsaturation. In some embodiments, the ring has one double or triple bond.

The term "alkoxy" refers to the group RO—, where R is an alkyl.

The term "alkyl" is intended to mean a group derived from an aliphatic hydrocarbon having one point of attachment, and includes a linear, a branched, or a cyclic group. The term is intended to include heteroalkyls. The term "hydrocarbon alkyl" refers to an alkyl group having no heteroatoms. The term "deuterated alkyl" is a hydrocarbon alkyl having at least one available H replaced by D. In some embodiments, an alkyl group has from 1-20 carbon atoms.

The term "aryl" is intended to mean a group derived from an aromatic compound which may be unsubstituted or substituted. The term "aromatic compound" is intended to mean an organic compound comprising at least one unsaturated cyclic group having delocalized pi electrons. The term is intended to encompass both aromatic compounds having only carbon and hydrogen atoms, referred to as "hydrocarbon aryls", and heteroaromatic compounds wherein one or more of the carbon atoms within the cyclic group has been replaced by another atom, such as nitrogen, oxygen, sulfur, or the like. The term "deuterated aryl" refers to an aryl group having at least one available H bonded directly to the aryl replaced by D. In some embodiments, an aryl group has from 3-60 ring carbon atoms.

The term "aryloxy" refers to the group RO—, where R is an aryl.

The term "compound" is intended to mean an electrically uncharged substance made up of molecules that further consist of atoms, wherein the atoms cannot be separated by physical means. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

The term "deuterated" is intended to mean that at least one H has been replaced by deuterium ("D"). The deuterium is present in at least 100 times the natural abundance level. A "deuterated analog" of compound X has the same structure as compound X, but with at least one D replacing an H.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" when referring to a layer or material, is intended to mean a layer or material that exhibits electronic or electro-radiative properties. In an electronic device, an electroactive material electronically facilitates the operation of the device. Examples of electroactive materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "electron-withdrawing" as it refers to a substituent group is intended to mean a group which decreases the electron density of an aromatic ring.

The prefix "hetero" indicates that one or more carbon atoms have been replaced with a different atom. In some embodiments, the different atom is N, O, or S.

The term "host material" is intended to mean a material to which a dopant is added. The host material may or may not have electronic characteristic(s) or the ability to emit, receive, or filter radiation. In some embodiments, the host material is present in higher concentration.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "luminescence" refers to light emission that cannot be attributed merely to the temperature of the emitting body, but results from such causes as chemical reactions, electron bombardment, electromagnetic radiation, and electric fields. The term "luminescent" refers to a material capable of luminescence.

The term "N-heterocycle" refers to a heteroaromatic compound or group having at least one nitrogen in an aromatic ring.

The term "N,O-heterocycle" refers to a heteroaromatic compound or group having at least one nitrogen and at least one oxygen in an aromatic ring.

The term "N,S-heterocycle" refers to a heteroaromatic compound or group having at least one nitrogen and at least one sulfur in an aromatic ring.

The term "organic electronic device" or sometimes just "electronic device" is intended to mean a device including one or more organic semiconductor layers or materials.

The term "organometallic" refers to a material in which there is a carbon-metal bond.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "siloxane" refers to the group $(RO)_3Si$—, where R is the same or different at each occurrence and is H, D, C1-20 alkyl, deuterated alkyl, or fluoroalkyl.

The term "silyl" refers to the group $R_3Si$—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

All groups can be substituted or unsubstituted unless otherwise indicated. In some embodiments, the substituents are selected from the group consisting of D, alkyl, alkoxy, aryl, aryloxy, silyl, siloxane, $NR_2$, where R is alkyl or aryl, and deuterated analogs thereof.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The IUPAC numbering system is used throughout, where the groups from the Periodic Table are numbered from left to right as 1-18 (CRC Handbook of Chemistry and Physics, 81st Edition, 2000).

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

The terms "compound having at least one unit of Formula I", "host compound having at least one unit of Formula I" and "electroactive compound having at least one unit of Formula I" as used herein, all refer to the same material.

2. Composition

The composition comprises:
(a) a dopant capable of electroluminescence having an emission maximum between 380 and 750 nm,
(b) a first host compound having at least one unit of Formula I

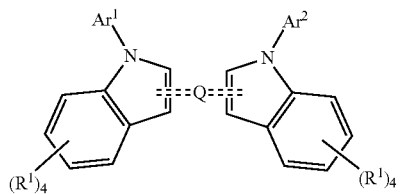

Formula I wherein:
Q is a fused ring linkage having the formula

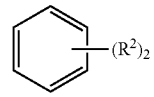

Ar$^1$ is selected from the group consisting of aromatic groups including at least one electron-withdrawing group and deuterated analogs thereof;
Ar$^2$ is selected from the group consisting of aryl groups, aromatic groups including electron transporting groups, and deuterated analogs thereof; and
R$^1$ and R$^2$ are the same or different at each occurrence and are selected from the group consisting of H, D, aryl, and deuterated aryl;
and
(c) a second host compound having Formula II

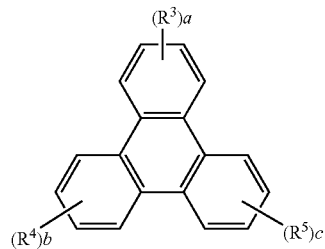

Formula II wherein:
R$^3$ is the same or different at each occurrence and are selected from the group consisting of D, aryl, and deuterated aryl, with the proviso that at least one R$^3$ is aryl or deuterated aryl;
R$^4$ and R$^5$ are the same or different at each occurrence and are selected from the group consisting of D, aryl, and deuterated aryl;
a is an integer from 1-4; and
b and c are the same or different and are an integer from 0-4.

In some embodiments, the composition further comprises:
(d) a third host compound having Formula II.

By "having at least one unit" it is meant that the host can be a compound having Formula I, an oligomer or homopolymer having two or more units of Formula I, or a copolymer, having units of Formula I and units of one or more additional monomers. The units of the oligomers, homopolymers, and copolymers can be linked through substituent groups.

The term "fused ring linkage" is used to indicate that the Q group is fused to both nitrogen-containing rings, in any orientation.

In some embodiments, the composition consists essentially of (a) a dopant capable of electroluminescence having an emission maximum between 380 and 750 nm, (b) a host compound having at least one unit of Formula I, and (c) a second host compound having Formula II, where additional components that would materially alter the properties or the distinguishing characteristics of the composition are not present therein.

In some embodiments, the composition consists essentially of (a) a dopant capable of electroluminescence having an emission maximum between 380 and 750 nm, (b) a host compound having at least one unit of Formula I, (c) a second host compound having Formula II, and (d) a third host compound having Formula II, where additional components that would materially alter the properties or the distinguishing characteristics of the composition are not present therein.

The amount of dopant present in the composition is generally in the range of 3-20% by weight, based on the total weight of the composition; in some embodiments, 5-15% by weight.

The ratio of first host having at least one unit of Formula I to the total amount of second host compound having Formula II is generally in the range of 1:20 to 20:1; in some embodiments, 5:15 to 15:5.

In some embodiments, the first host compound having at least one unit of Formula I is 15% to 90% by weight, based on the total weight of the composition; in some embodiments, 20% to 80% by weight.

In some embodiments, the total amount of host material having Formula II is 15% to 90% by weight, based on the total weight of the composition; in some embodiments, 20% to 80% by weight.

(a) Dopant

Electroluminescent ("EL") materials which can be used as a dopant in the photoactive layer, include, but are not limited to, small molecule organic luminescent compounds, luminescent metal complexes, conjugated polymers, and mixtures thereof. Examples of small molecule luminescent organic compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds and cyclometallated complexes of metals such as iridium and platinum. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Examples of red light-emitting materials include, but are not limited to, complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, complexes of Ir having phenylpyridine ligands, bis(diarylamino)anthracenes, and polyphenylenevinylene polymers. Green light-emitting materials have been disclosed in, for example, published PCT application WO 2007/021117.

Examples of blue light-emitting materials include, but are not limited to, complexes of Ir having phenylpyridine or phenylimidazole ligands, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, the dopant is an organometallic complex.

In some embodiments, the organometallic complex is cyclometallated. By "cyclometallated" it is meant that the complex contains at least one ligand which bonds to the metal in at least two points, forming at least one 5- or 6-membered ring with at least one carbon-metal bond.

In some embodiments, the metal is iridium or platinum. In some embodiments, the organometallic complex is electrically neutral and is a tris-cyclometallated complex of iridium having the formula $IrL_3$ or a bis-cyclometallated complex of iridium having the formula $IrL_2Y$. In some embodiments, L is a monoanionic bidentate cyclometalating ligand coordinated through a carbon atom and a nitrogen atom. In some embodiments, L is an aryl N-heterocycle, where the aryl is phenyl or napthyl, and the N-heterocycle is pyridine, quinoline, isoquinoline, pyrimidine, diazine, pyrrole, pyrazole, imidazole or benzimidazole. In some embodiments, Y is a monoanionic bidentate ligand. In some embodiments, L is a phenylpyridine, a phenylquinoline, or a phenylisoquinoline. In some embodiments, Y is a β-dienolate, a diketimine, a picolinate, or an N-alkoxypyrazole. The ligands may be unsubstituted or substituted with F, D, alkyl, perfluororalkyl, alkoxyl, alkylamino, arylamino, CN, silyl, fluoroalkoxyl or aryl groups.

In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is a complex having the formula $Ir(L1)_a(L2)_b(L3)_c$; where L1 is a monoanionic bidentate cyclometalating ligand coordinated through carbon and nitrogen;

L2 is a monoanionic bidentate ligand which is not coordinated through a carbon;

L3 is a monodentate ligand;

a is 1-3;

b and c are independently 0-2; and a, b, and c are selected such that the iridium is hexacoordinate and the complex is electrically neutral.

Some examples of formulae include, but are not limited to, $Ir(L1)_3$; $Ir(L1)_2(L2)$; and $Ir(L1)_2(L3)(L3')$, where L3 is anionic and L3' is nonionic.

Examples of L1 ligands include, but are not limited to phenylpyridines, phenylquinolines, phenylpyrimidines, phenylpyrazoles, thienylpyridines, thienylquinolines, and thienylpyrimidines. As used herein, the term "quinolines" includes "isoquinolines" unless otherwise specified. The fluorinated derivatives can have one or more fluorine substituents. In some embodiments, there are 1-3 fluorine substituents on the non-nitrogen ring of the ligand.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Monodentate ligand L3 can be anionic or nonionic. Anionic ligands include, but are not limited to, H− ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.
Examples of organometallic iridium complexes having red emission color include, but are not limited to compounds D1 through D10 below
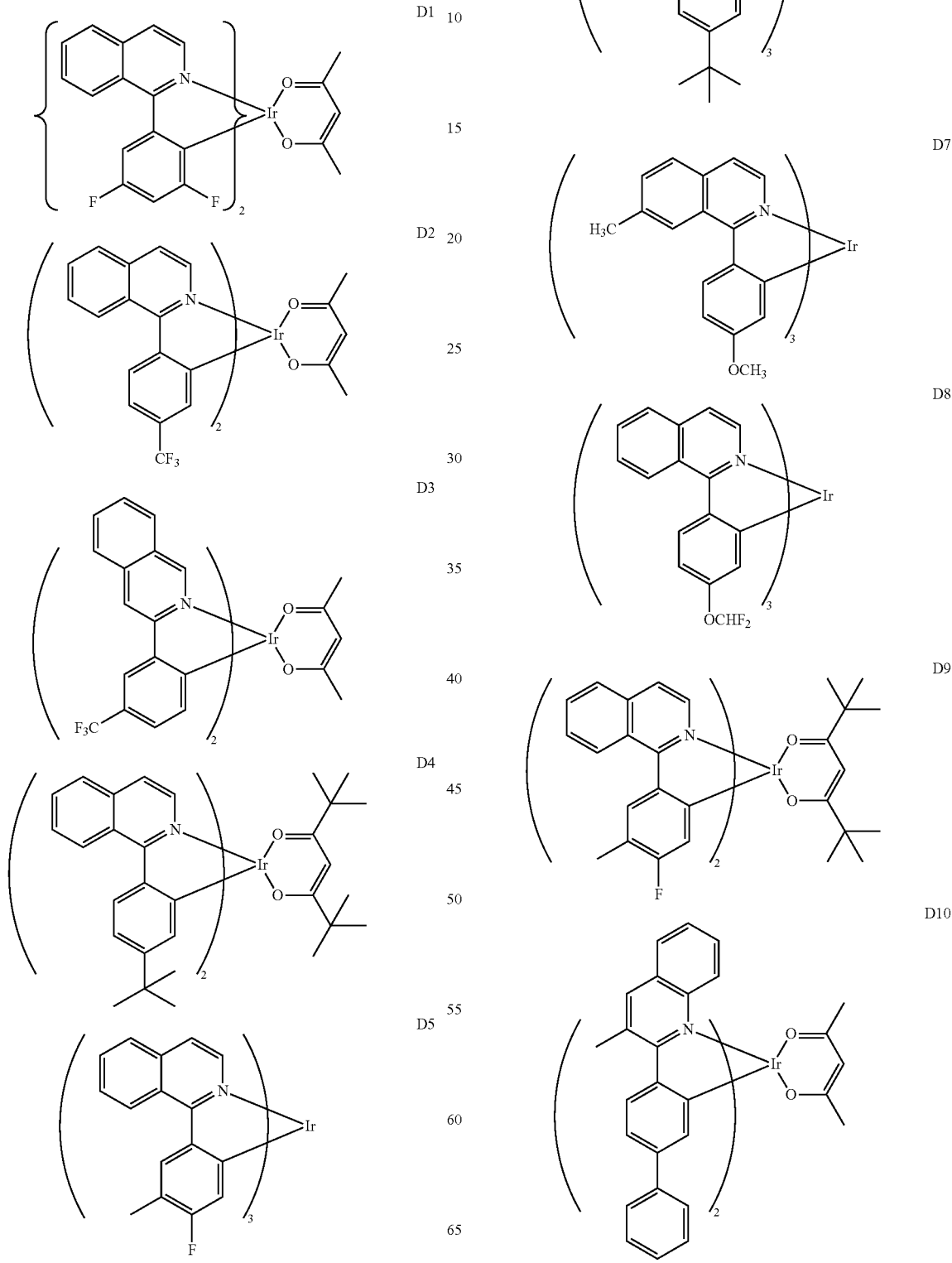

Examples of organometallic Ir complexes with green emission color include, but are not limited to, D11 through D33 below.
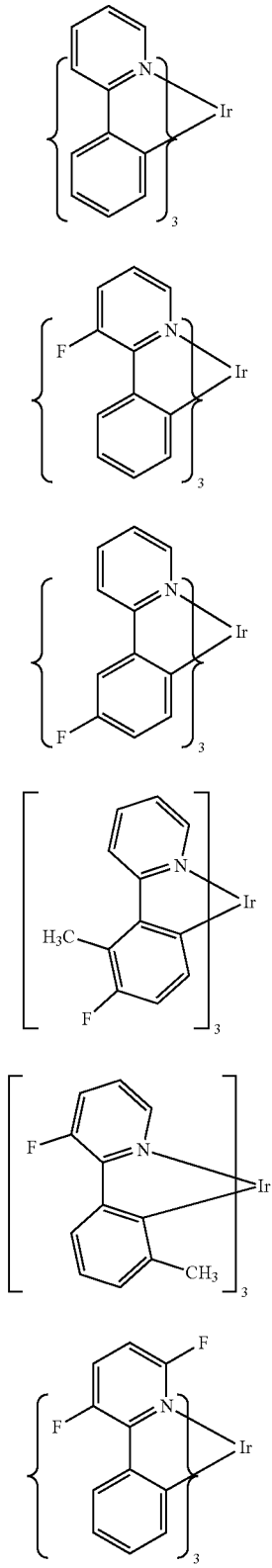
D11
D12
D13
D14
D15
D16
-continued
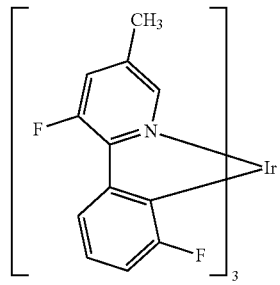
D17
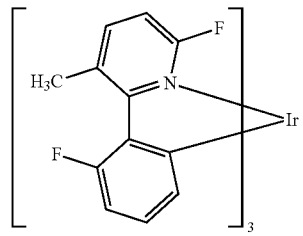
D18
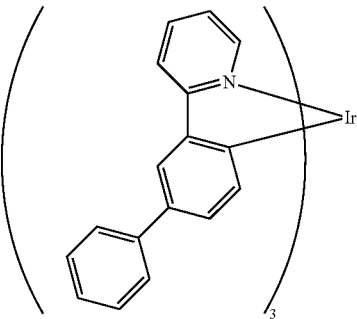
D19
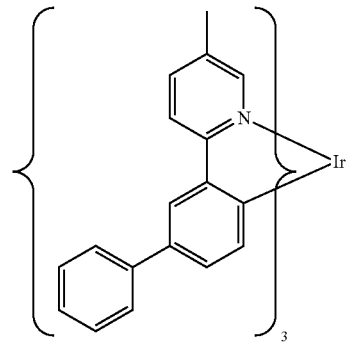
D20
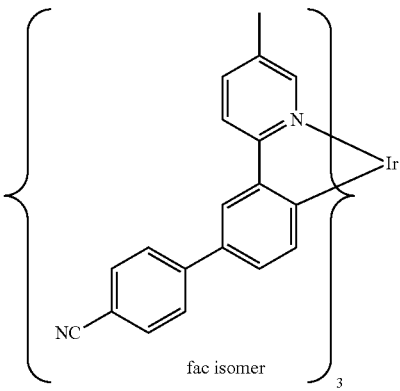
D21

-continued
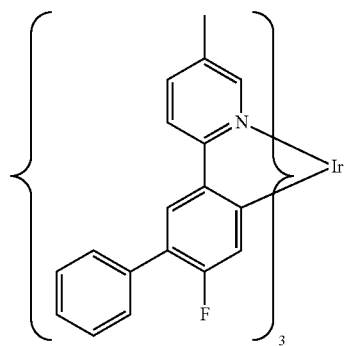
D22
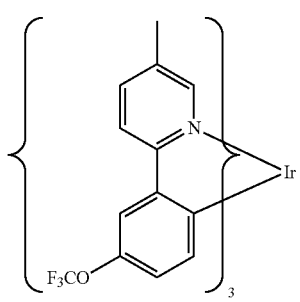
D23
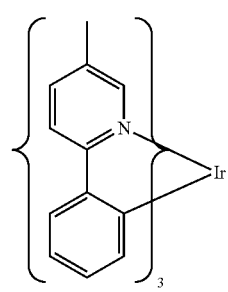
D24
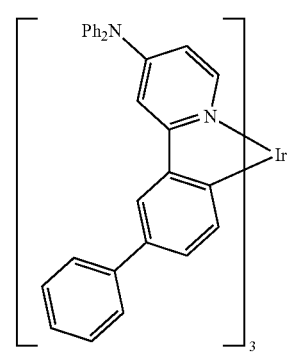
D25
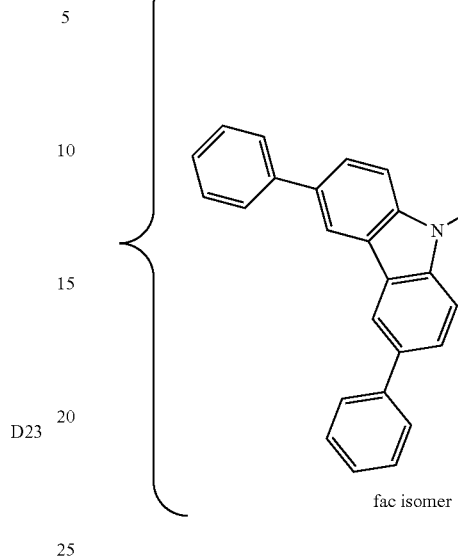
D26
fac isomer
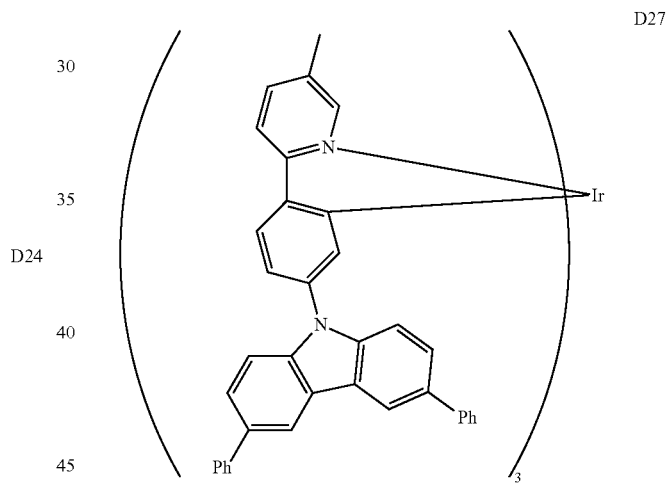
D27
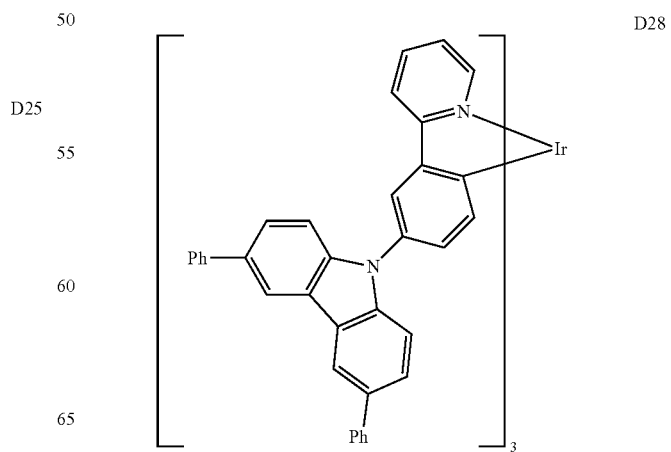
D28

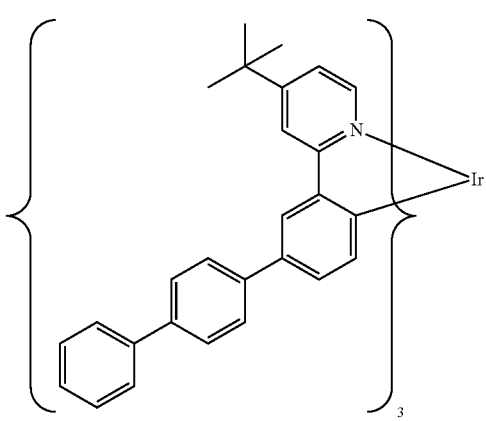
D29
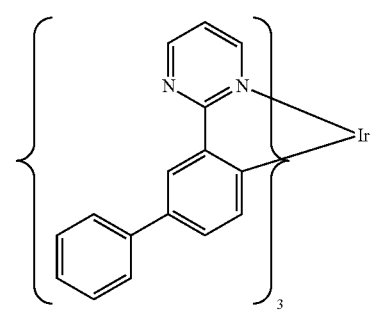
D30
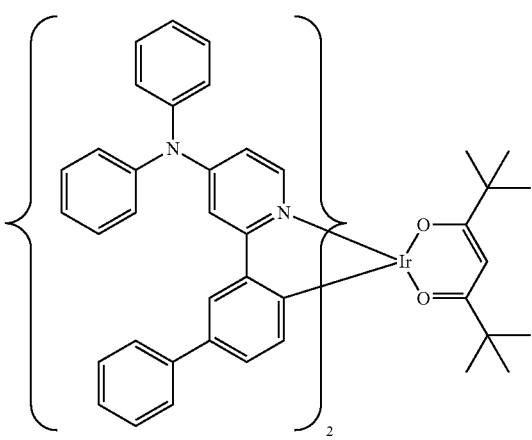
D31
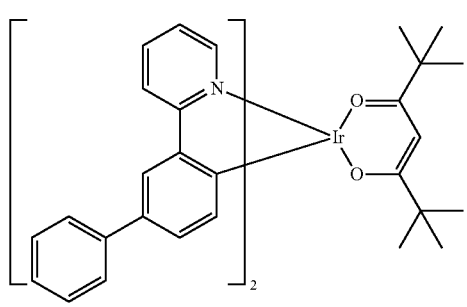
D32
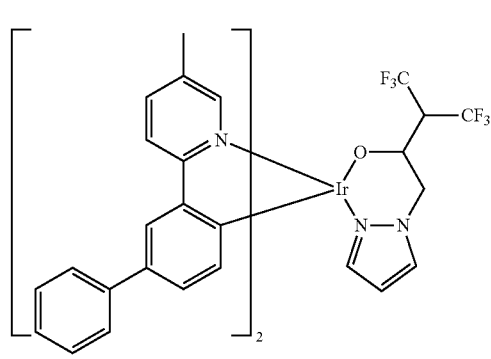
D33
Examples of organometallic Ir complexes with blue emission color include, but are not limited to, D34 through D51 below.
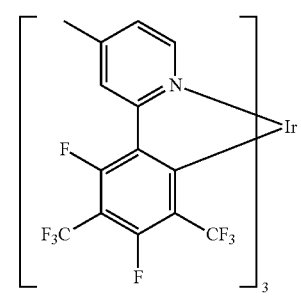
D34
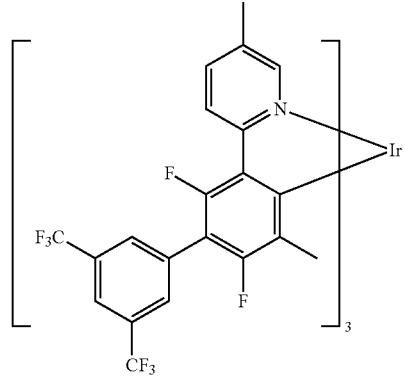
D35
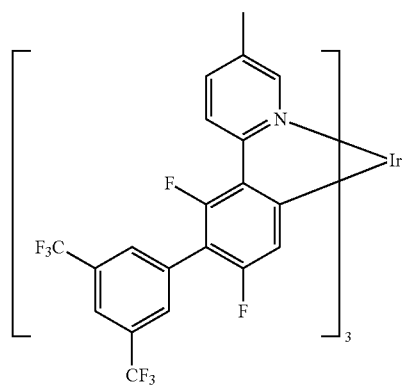
D36

D37 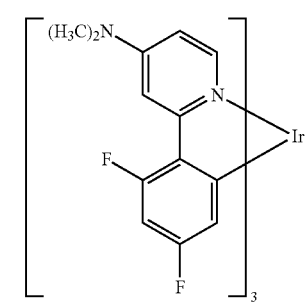
D38 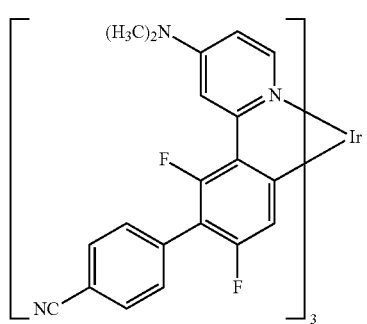
D39 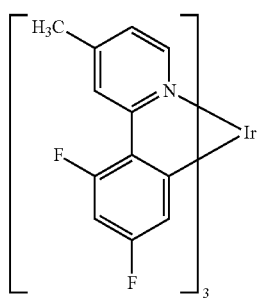
D40 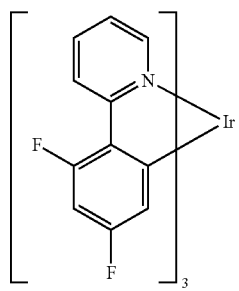
D41 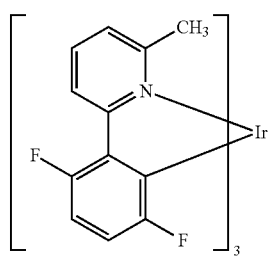
D42 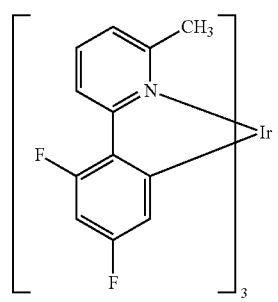
D43 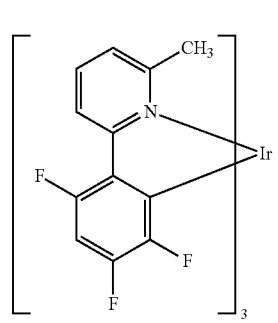
D44 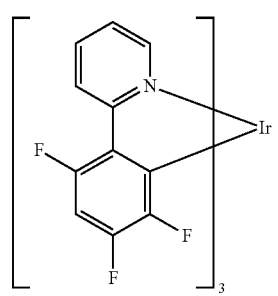
D45 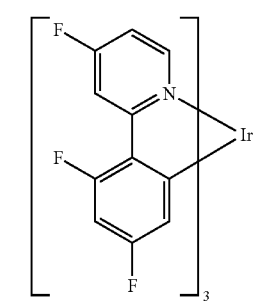
D46 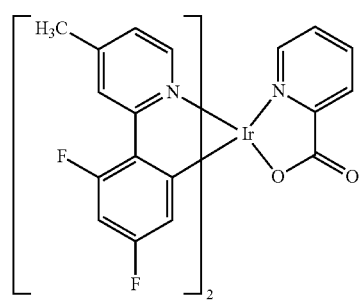

-continued

D47

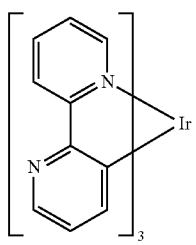

D48

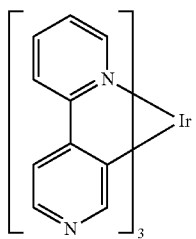

D49

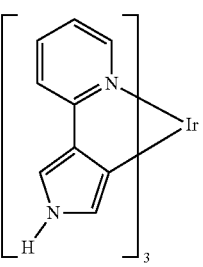

D50

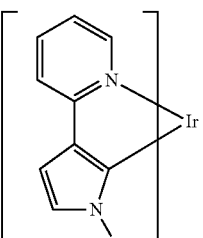

D51

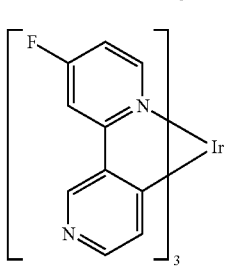

In some embodiments, the dopant is a small organic luminescent compound. In some embodiments, the dopant is selected from the group consisting of a non-polymeric spirobifluorene compound and a fluoranthene compound.

In some embodiments, the dopant is a compound having aryl amine groups. In some embodiments, the dopant is selected from the formulae below:

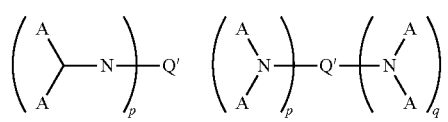

-continued

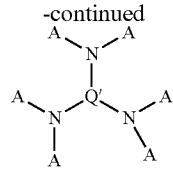

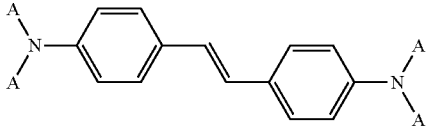

where:
A is the same or different at each occurrence and is an aromatic group having from 3-60 carbon atoms;
Q' is a single bond or an aromatic group having from 3-60 carbon atoms;
p and q are independently an integer from 1-6.

In some embodiments of the above formula, at least one of A and Q' in each formula has at least three condensed rings. In some embodiments, p and q are equal to 1.

In some embodiments, Q' is a styryl or styrylphenyl group.

In some embodiments, Q' is an aromatic group having at least two condensed rings. In some embodiments, Q' is selected from the group consisting of naphthalene, anthracene, benzofluorene, chrysene, pyrene, tetracene, xanthene, perylene, coumarin, rhodamine, quinacridone, and rubrene.

In some embodiments, A is selected from the group consisting of phenyl, biphenyl, tolyl, naphthyl, naphthylphenyl, and anthracenyl groups.

In some embodiments, the dopant has the formula below:

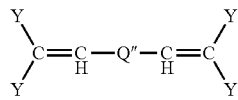

where:
Y is the same or different at each occurrence and is an aromatic group having 3-60 carbon atoms;
Q" is an aromatic group, a divalent triphenylamine residue group, or a single bond.

In some embodiments, the dopant is an aryl acene. In some embodiments, the dopant is a non-symmetrical aryl acene.

Some examples of small molecule organic green dopants include, but are not limited to, compounds D52 through D59 shown below.

D52

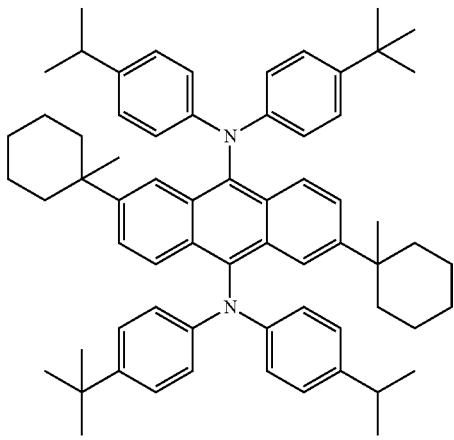

-continued
D53
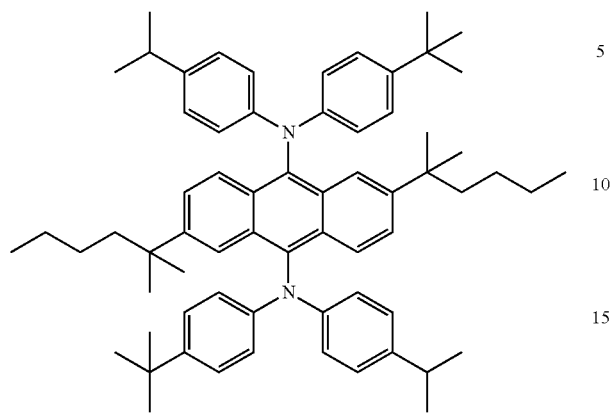
D54
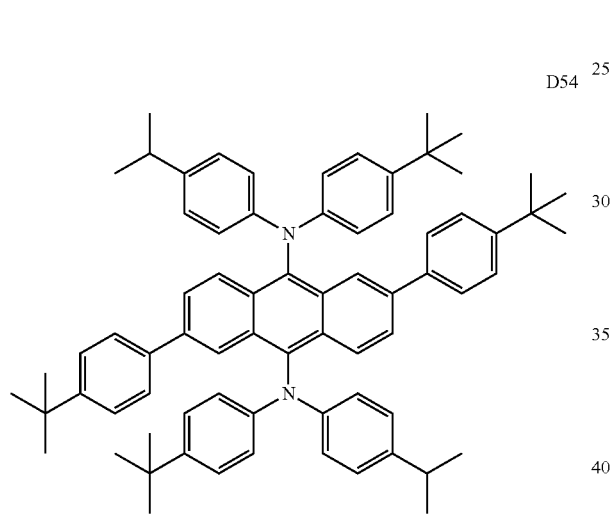
D55
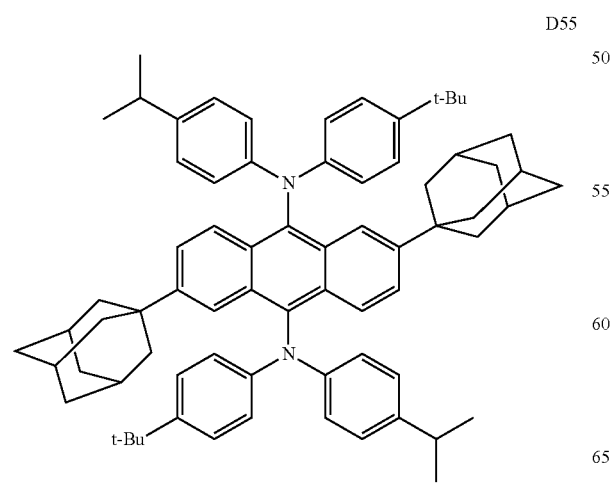
-continued
D56
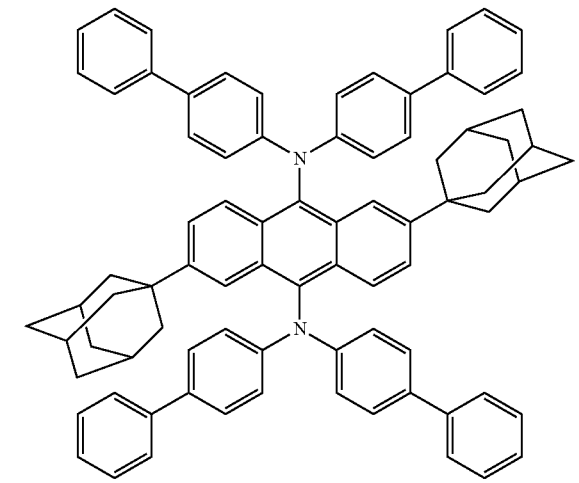
D57
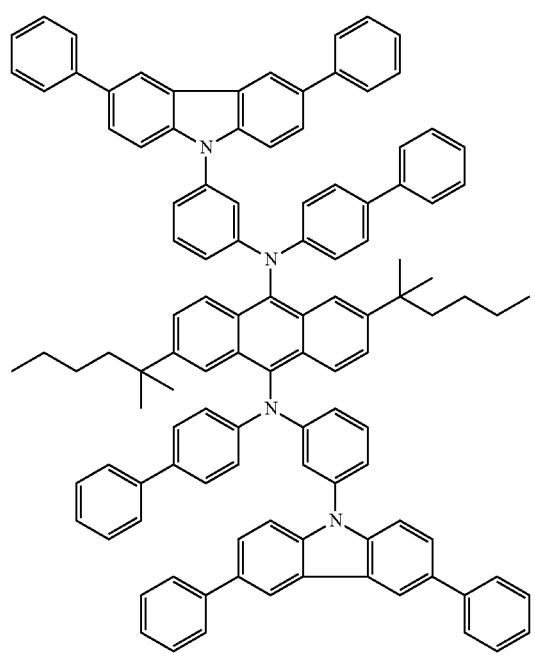
D58
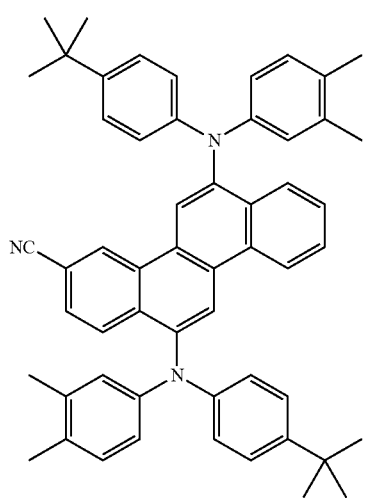

D59
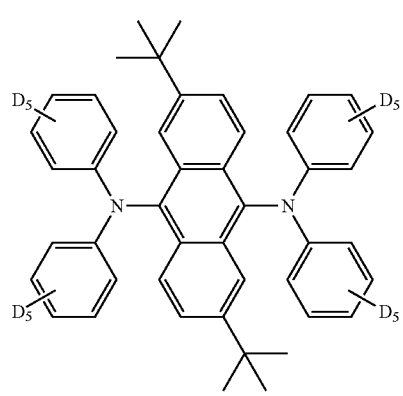
Examples of small molecule organic blue dopants include, but are not limited to compounds D60 through D67 shown below.
D60
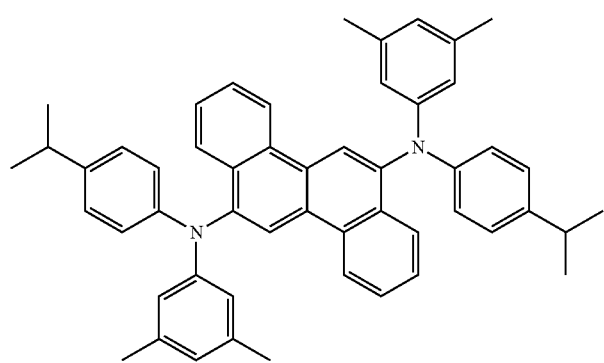
D61
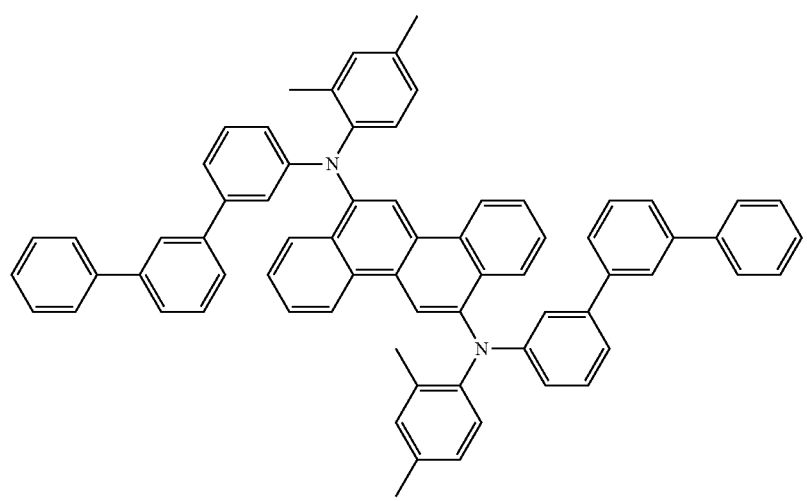

D62
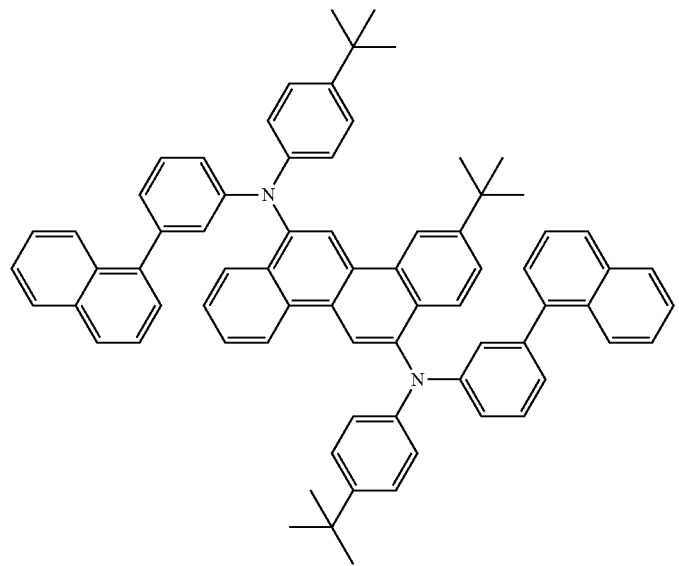
D63
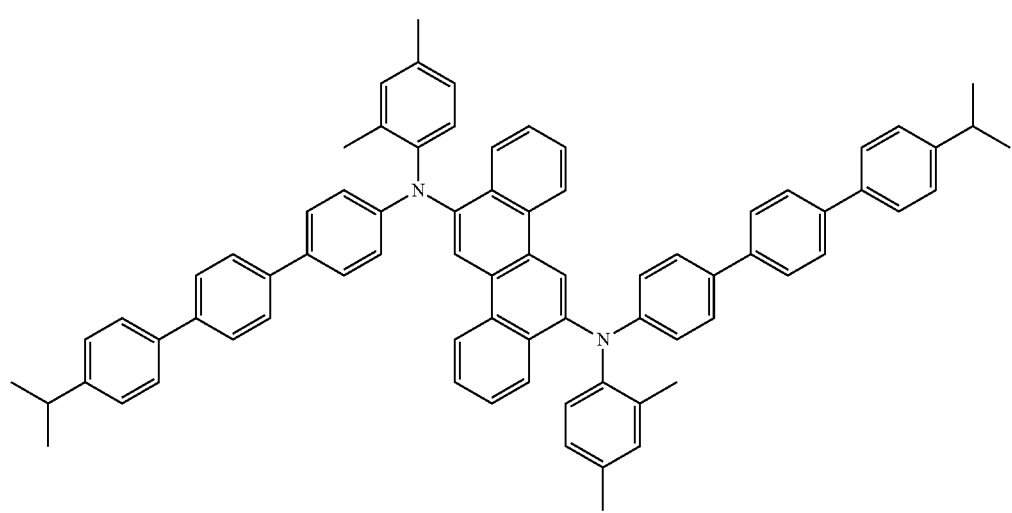

D64
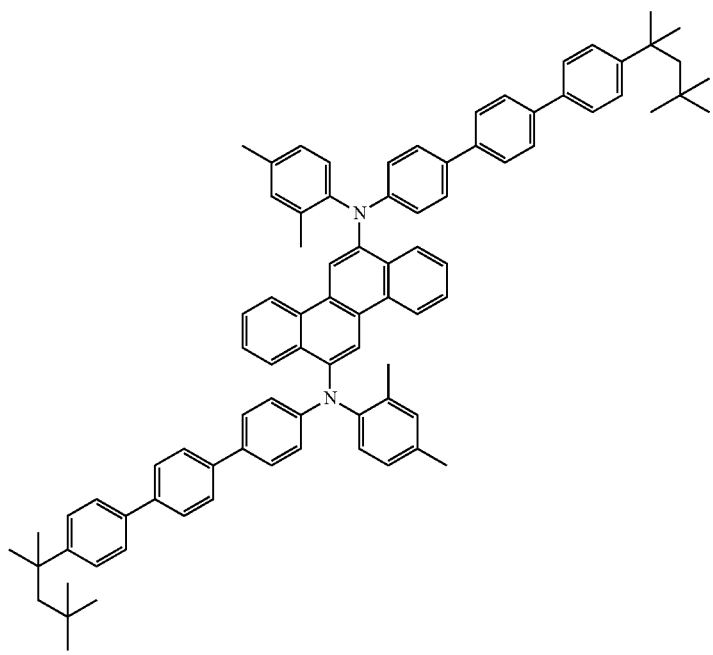
D65
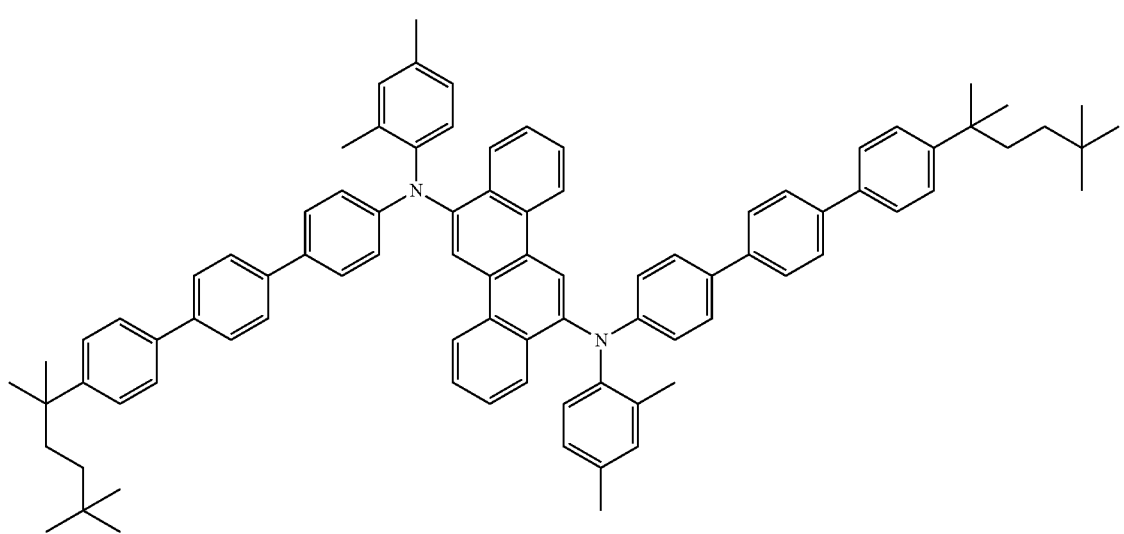

D66
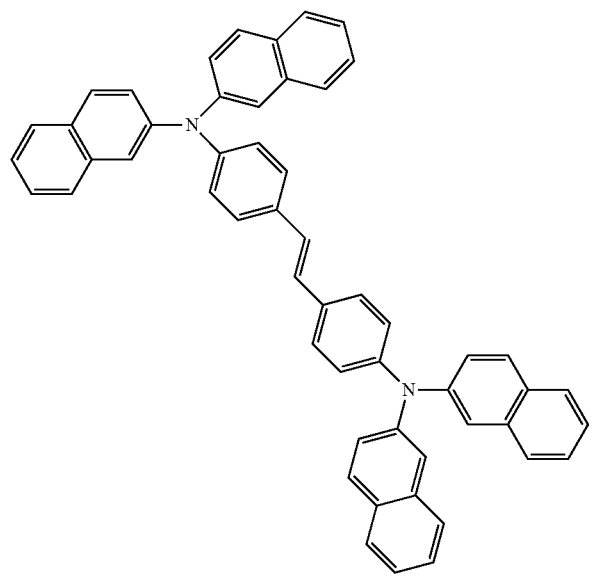
D67
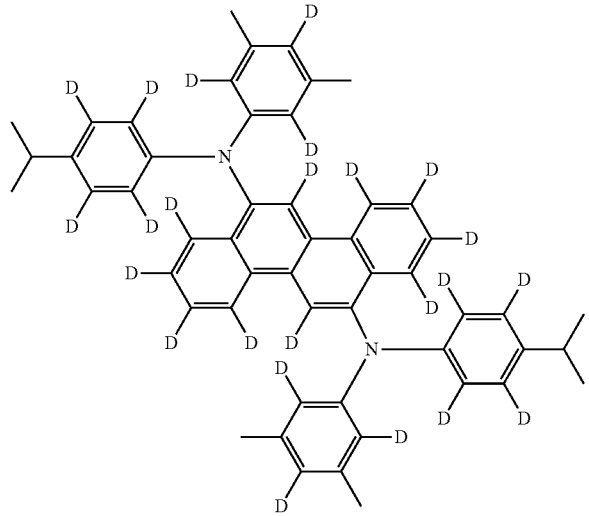
D68
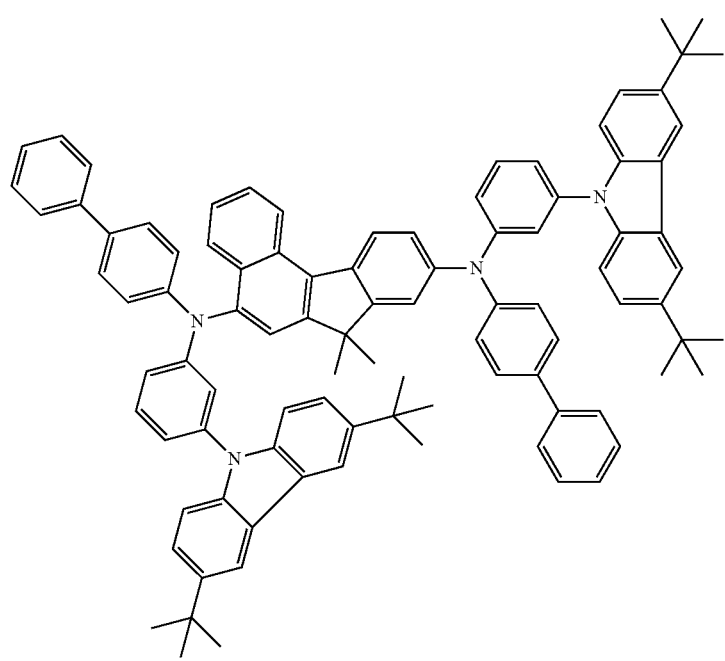

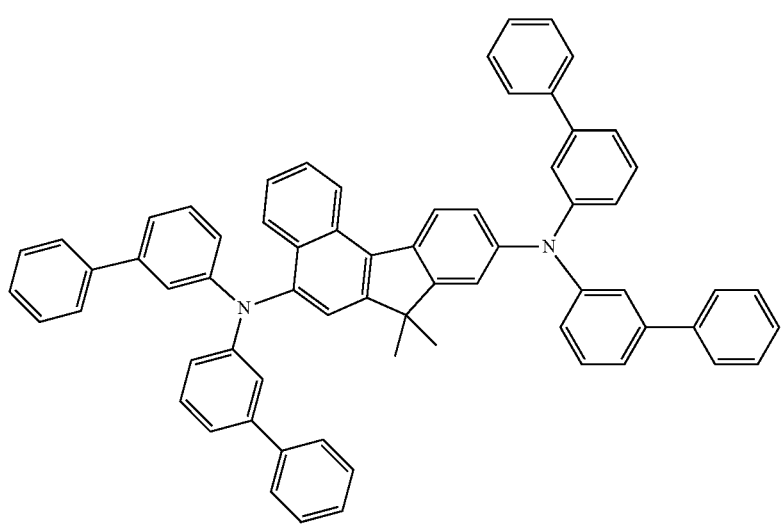
D69

In some embodiments, the dopant is selected from the group consisting of amino-substituted chrysenes, amino-substituted benzofluorenes, amino-substituted anthracenes, and deuterated analogs thereof.

(b) First Host

The first host has at least one unit of Formula I as given above.

In some embodiments, the compound is at least 10% deuterated. By this is meant that at least 10% of the H are replaced by D. In some embodiments, the compound is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the compounds are 100% deuterated.

In some embodiments, deuterium is present on the indolocarbazole core, an aryl ring, a substituent group on an aryl ring, or combinations thereof.

In some embodiments, the first host is a compound having a single unit of Formula I.

In some embodiments, the first host compound has two or more units of Formula I, linked by aryl groups.

In some embodiments, the first host compound is an oligomer having 2-5 units of Formula I.

In some embodiments, the first host compound is a polymer having more than 5 units of Formula I.

In some embodiments, the first host compound has at least one unit of Formula I-a

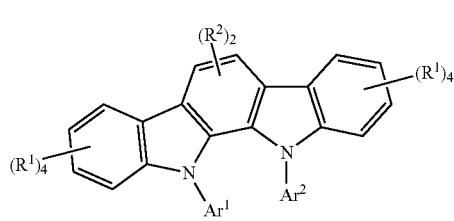

Formula I-a where $Ar^1$, $Ar^2$, $R^1$, and $R^2$ are as defined above for Formula I.

In some embodiments, the first host compound has at least one unit of Formula I-b

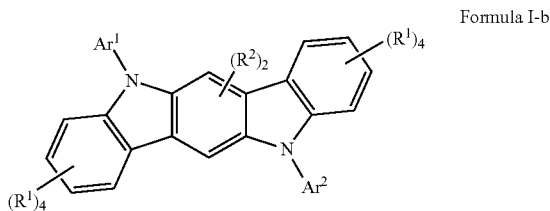

Formula I-b where $Ar^1$, $Ar^2$, $R^1$, and $R^2$ are as defined above for Formula I.

In some embodiments, the first host compound has at least one unit of Formula I-c

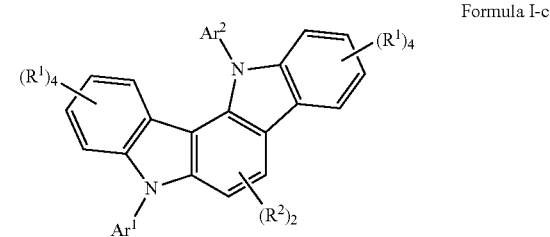

Formula I-c where $Ar^1$, $Ar^2$, $R^1$, and $R^2$ are as defined above for Formula I.

In some embodiments, the first host compound has at least one unit of Formula I-d

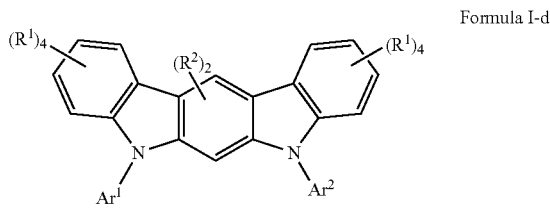

Formula I-d where $Ar^1$, $Ar^2$, $R^1$, and $R^2$ are as defined above for Formula I.

In some embodiments, the first host compound has at least one unit of Formula I-e

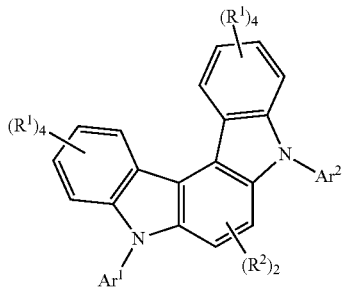

Formula I-e where $Ar^1$, $Ar^2$, $R^1$, and $R^2$ are as defined above for Formula I.

In some embodiments, the compound has at least one unit of Formula I-a or Formula I-b.

In Formulae I and I-a through I-3, $Ar^1$ is selected from the group consisting of aromatic groups including at least one electron-withdrawing group and deuterated analogs thereof. By this it is meant that $Ar^1$ is an aromatic electron-withdrawing group or that $Ar^1$ is an aromatic group having at least one electron-withdrawing substituent.

In some embodiments, $Ar^1$ is an aromatic electron-withdrawing group or a deuterated analog thereof. In some embodiments, the aromatic electron-withdrawing group is selected from the group consisting of N-heterocycles, N,O-heterocycles, N,S-heterocycles, and deuterated analogs thereof.

In some embodiments, $Ar^1$ is an aromatic group having at least one electron-withdrawing substituent.

In some embodiments, the electron-withdrawing substituent is selected from the group consisting of fluoro, cyano, perfluoroalkyl, nitro, —$SO_2R$, where R is alkyl, deuterated alkyl, or perfluoroalkyl, and combinations thereof.

In some embodiments, the electron-withdrawing substituent is and aromatic electron-withdrawing group. In some embodiments, the aromatic electron-withdrawing group is selected from the group consisting of N-heterocycles, N,O-heterocycles, N,S-heterocycles, and deuterated analogs thereof.

In some embodiments, $Ar^1$ is an N-heterocycle, an N,O-heterocycle, or a deuterated analog thereof. Some examples of such nitrogen-containing heteroaromatic groups which are electron withdrawing include, but are not limited to those shown below.

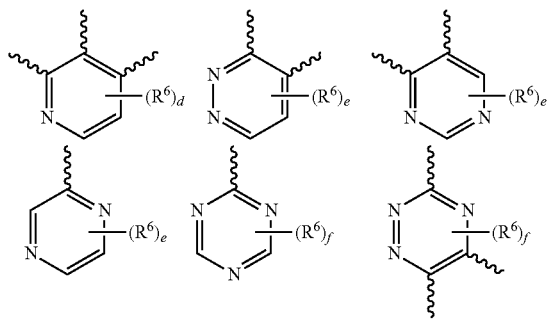

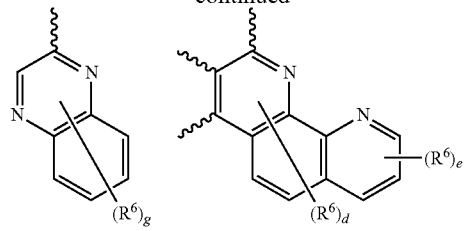

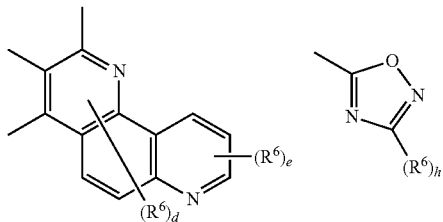

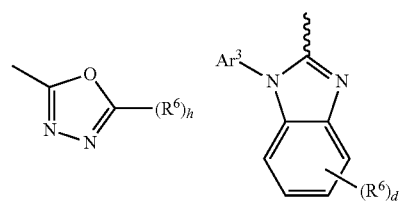

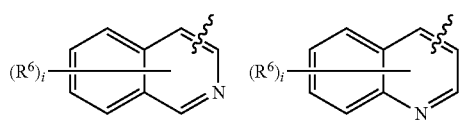
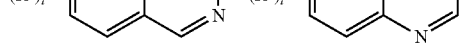

In the above formulae:

$Ar^3$ is an aryl group;

$R^6$ is the same or different at each occurrence and is selected from the group consisting of D, alkyl, alkoxy, aryl, aryloxy, siloxane, and silyl;

d is an integer from 0-4;

e is an integer from 0-3;

f is an integer from 0-2;

g is an integer from 0-5;

h is 0 or 1; and i is an integer from 0-6.

The group can be bonded to the nitrogen on the core at any of the positions indicated with the wavy line.

In some embodiments of Formula I and I-a through I-e, $Ar^1$ is an aryl group having one or more electron-withdrawing substituents. In some embodiments, the aryl group has 6-18 carbons. In some embodiments, the aryl group is phenyl or deuterated phenyl.

In some embodiments of Formula I and I-a through I-e, $Ar^2$ is selected from electron-withdrawing groups and deuterated analogs thereof.

In some embodiments, $Ar^2$ is an N-heterocycle, N,O-heterocycle, as discussed above, or a deuterated analog thereof.

In some embodiments, $Ar^2$ is, phenyl, naphthyl, substituted naphthyl, styryl, pyridine, pyrimidine, triazine, a deuterated analog thereof, or a substituent of Formula III Formula III

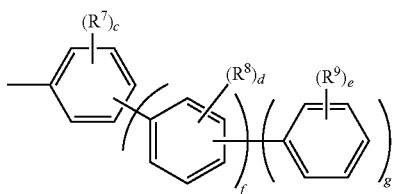

wherein:

R[7], R[8], and R[9] are the same or different at each occurrence and are selected from the group consisting of D, aryl, silyl, alkoxy, aryloxy, cyano, vinyl, allyl, dialkylamine, diarylamine, carbazole, and a deuterated analog thereof, or adjacent R[7], R[8], or R[9] groups can join together to form a 6-membered fused ring;

c is an integer from 0-5, with the proviso that when c=5, f=g=0;

d is an integer from 0-5, with the proviso that when d=5, g=0;

e is an integer from 0-5;

f is an integer from 0-5 g is 0 or 1.

In some embodiments of Formula III, f=0.

In some embodiments, Ar[2] is selected from the group consisting of phenyl, biphenyl, terphenyl, naphthyl, and deuterated analogs thereof.

In some embodiments of Formulae I and I-a through I-e, R[1] is H or D.

In some embodiments of Formulae I and I-a through I-e, R[2] is H or D.

Any of the above embodiments of Formulae I and I-a through I-e can be combined with one or more of the other embodiments, so long as they are not mutually exclusive. For example, the embodiment in which the compound has at least one unit of Formula I-a can be combined with the embodiment in which Ar[1] is an N-heterocycle or an N,O-heterocycle, and further can be combined with the embodiment in which R[1] is H or D. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having at least one unit of Formula I are given below.

Compound H1-1

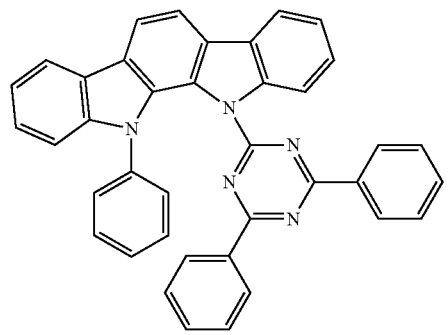

Compound H1-2

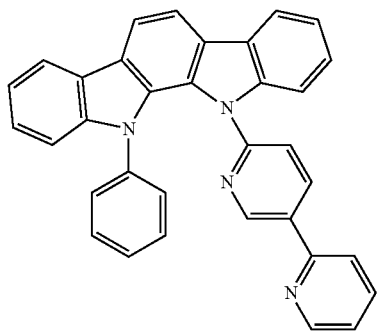

Compound H1-3

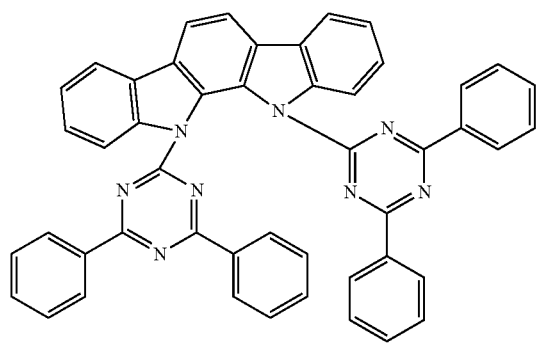

Compound H1-4

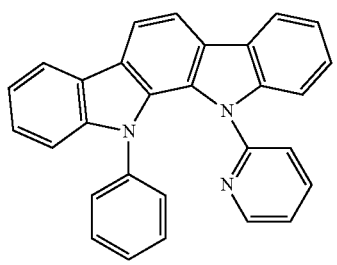

Compound H1-5

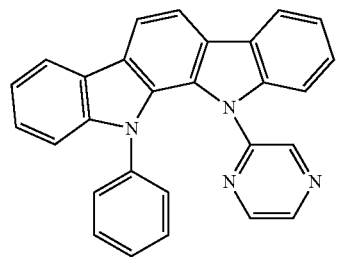

Compound H1-6

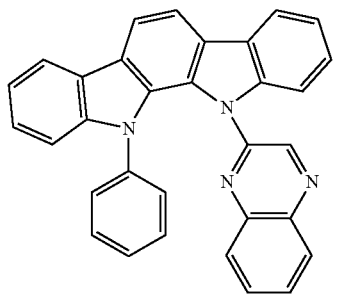

-continued
Compound H1-7
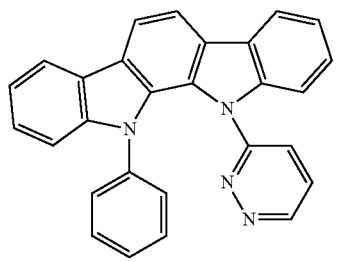
Compound H1-8
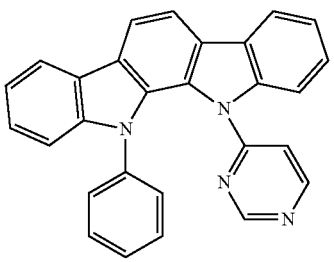
Compound H1-9
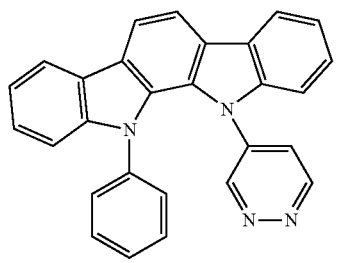
Compound H1-10
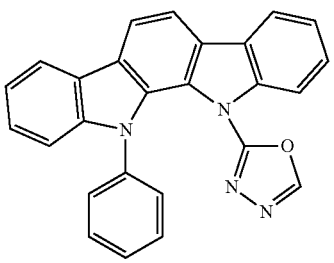
Compound H1-11
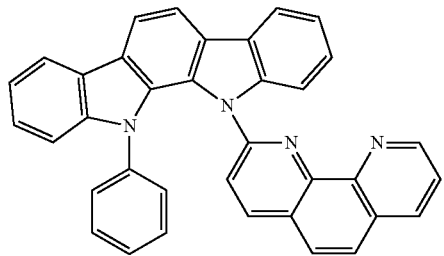
Compound H1-12
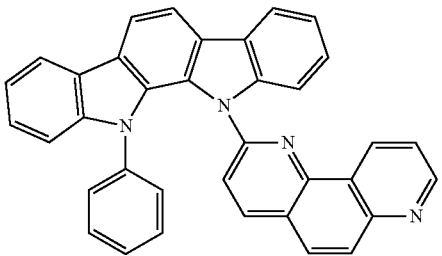
Compound H1-13
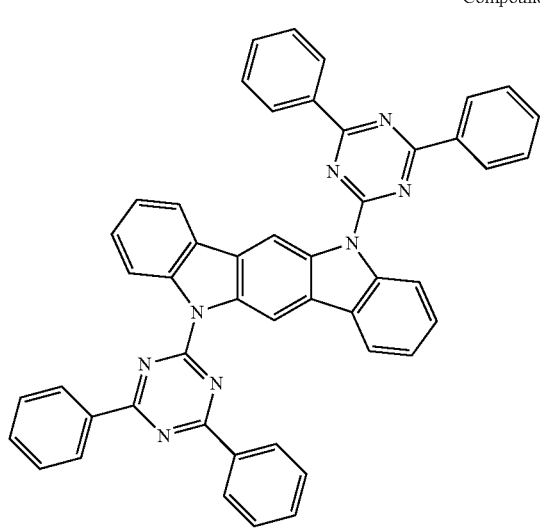
Compound H1-14
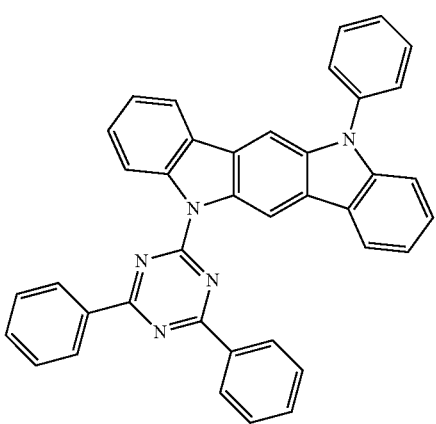

-continued
Compound H1-15
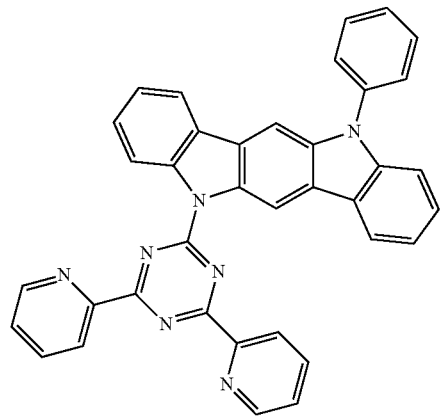
Compound H1-16
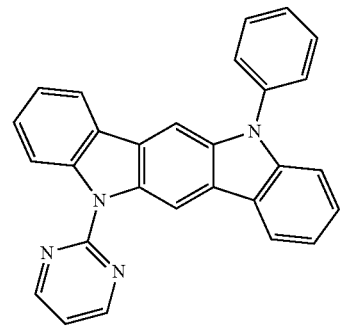
Compound H1-17
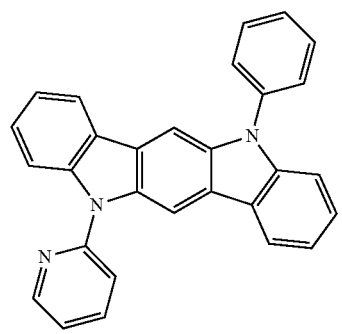
Compound H1-18
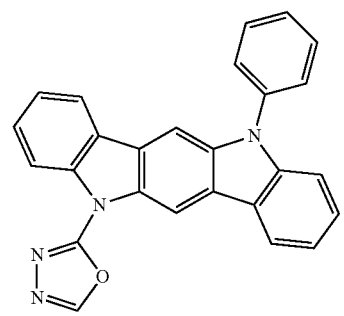
Compound H1-19
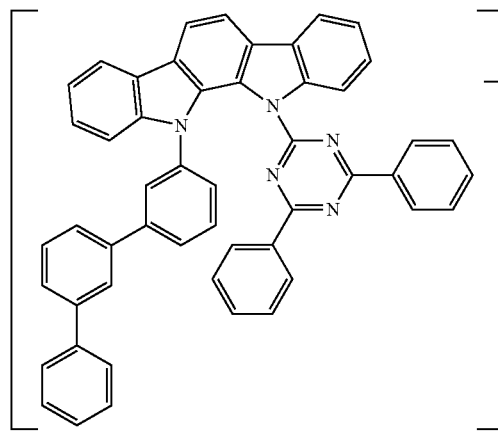
$D_{10-33}$
Compound H1-20
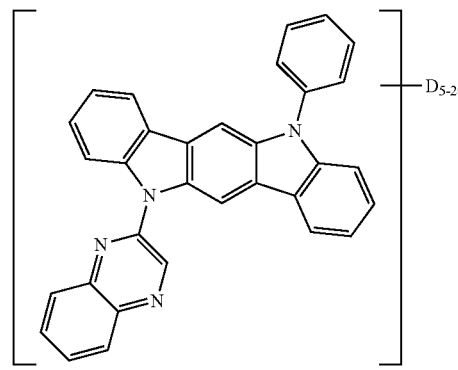
$D_{5-20}$
Compound H1-21
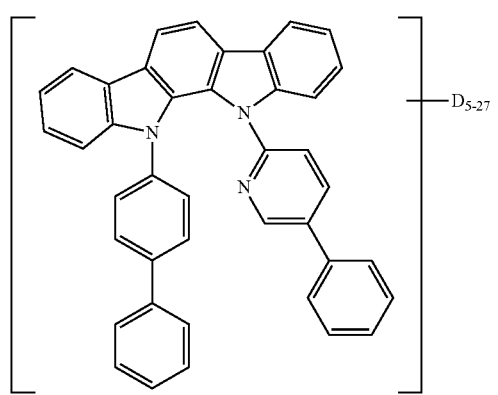
$D_{5-27}$ Compound H1-22

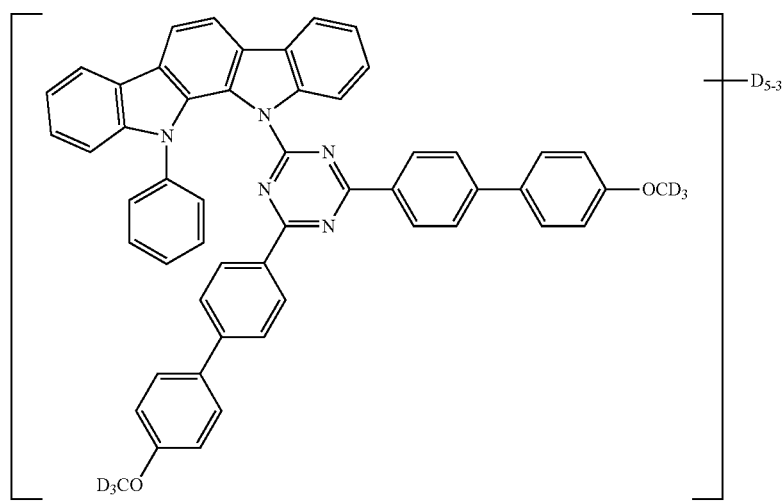

The compounds having Formula I can be prepared by known coupling and substitution reactions. Such reactions are well-known and have been described extensively in the literature. Exemplary references include: Yamamoto, Progress in Polymer Science, Vol. 17, p 1153 (1992); Colon et al., Journal of Polymer Science, Part A, Polymer chemistry Edition, Vol. 28, p. 367 (1990); U.S. Pat. No. 5,962,631, and published PCT application WO 00/53565; T. Ishiyama et al., J. Org. Chem. 1995 60, 7508-7510; M. Murata et al., J. Org. Chem. 1997 62, 6458-6459; M. Murata et al., J. Org. Chem. 2000 65, 164-168; L. Zhu, et al., J. Org. Chem. 2003 68, 3729-3732; Stille, J. K. Angew. Chem. Int. Ed. Engl. 1986, 25, 508; Kumada, M. Pure. Appl. Chem. 1980, 52, 669; Negishi, E. Acc. Chem. Res. 1982, 15, 340.

The deuterated analogs can be prepared in a similar manner using deuterated precursor materials or, more generally, by treating the non-deuterated compound by known deuteration reactions. In some embodiments, the non-deuterated compound is treated with deuterated solvent, such as d6-benzene, in the presence of a Lewis acid H/D exchange catalyst, such as aluminum trichloride or ethyl aluminum chloride, or acids such as $CF_3COOD$, DCI, etc. Deuteration reactions have also been described in copending application published as PCT application WO 2011-053334. The level of deuteration can be determined by NMR analysis and by mass spectrometry, such as Atmospheric Solids Analysis Probe Mass Spectrometry (ASAP-MS). The starting materials of the perdeuterated or partially deuterated aromatic compounds or alkyl compounds can be purchased from the commercial source or can be obtained using known methods.

The compounds described herein can be formed into films using any known deposition technique. In some embodiments, the compounds are formed into films using liquid deposition techniques.

(c) Second Host

The second host has Formula II, as given above.

In some embodiments, the second host is deuterated. In some embodiments, the second host is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the second host is 100% deuterated.

In some embodiments, deuterium is present on the triphenylene core, an aryl ring, a substituent group on an aryl ring, or combinations thereof.

In some embodiments of Formula II, a=1.
In some embodiments of Formula II, a=2.
In some embodiments of Formula II, a=3.
In some embodiments of Formula II, a=4.

In some embodiments of Formula II, at least one $R^3$ is selected from the group consisting of phenyl, biphenyl, terphenyl, tetraphenyl, naphthyl, phenylnaphthyl, naphthylphenyl, substituted derivatives thereof, and deuterated analogs thereof. In some embodiments, the substituent groups are selected from the group consisting of alkyl, alkoxy, aryl, and deuterated analogs thereof.

In some embodiments of Formula II, at least one $R^3$ is selected from the group consisting of biphenyl, terphenyl, tetraphenyl, and deuterated analogs thereof.

In some embodiments of Formula II, at least one $R^3$ has Formula IV

Formula IV

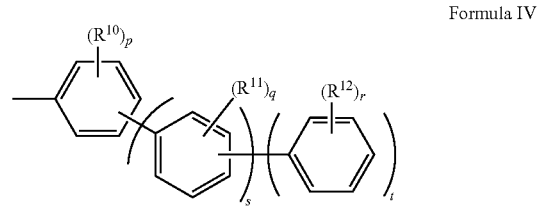

wherein:
$R^{10}$, is the same or different at each occurrence and is selected from the group consisting of D, alkyl, alkoxy, silyl, siloxy, deuterated alkyl, deuterated alkoxy, deuterated silyl, deuterated siloxy, wherein at least one $R^{10}$ is not D;
$R^{11}$ and $R^{12}$ are the same or different at each occurrence and are selected from the group consisting of D, alkyl, aryl, silyl, alkoxy, aryloxy, siloxy, deuterated alkyl, deuterated aryl, deuterated silyl, deuterated alkoxy, deuterated aryloxy, and deuterated siloxy, or adjacent $R^{10}$, $R^{11}$, or $R^{12}$ groups can join together to form a 6-membered fused ring;
p is an integer from 1-4;
q is an integer from 0-5, with the proviso that when q=5, t=0;
r is an integer from 0-5;
s is an integer from 1-4; and
t is 0 or 1.

In some embodiments of Formula II, b=0.
In some embodiments of Formula II, b=1.
In some embodiments of Formula II, b=2.
In some embodiments of Formula II, b=3.
In some embodiments of Formula II, b=4.
In some embodiments of Formula II, at least one $R^4$ is selected from the group consisting of phenyl, biphenyl, terphenyl, tetraphenyl, naphthyl, phenylnaphthyl, naphthylphenyl, substituted derivatives thereof, and deuterated analogs thereof. In some embodiments, the substituent groups are selected from the group consisting of alkyl, alkoxy, aryl, and deuterated analogs thereof.

In some embodiments of Formula II, at least one $R^4$ is selected from the group consisting of biphenyl, terphenyl, tetraphenyl, and deuterated analogs thereof.

In some embodiments of Formula II, at least one $R^4$ has Formula IV, as described above.

In some embodiments of Formula II, c=0.
In some embodiments of Formula II, c=1.
In some embodiments of Formula II, c=2.
In some embodiments of Formula II, c=3.
In some embodiments of Formula II, c=4.

In some embodiments of Formula II, at least one $R^5$ is selected from the group consisting of phenyl, biphenyl, terphenyl, tetraphenyl, naphthyl, phenylnaphthyl, naphthylphenyl, substituted derivatives thereof, and deuterated analogs thereof. In some embodiments, the substituent groups are selected from the group consisting of alkyl, alkoxy, aryl, and deuterated analogs thereof.

In some embodiments of Formula II, at least one $R^5$ is selected from the group consisting of biphenyl, terphenyl, tetraphenyl, and deuterated analogs thereof.

In some embodiments of Formula II, at least one $R^5$ has Formula IV, as described above.

Any of the above embodiments of Formula II can be combined with one or more of the other embodiments, so long as they are not mutually exclusive. For example, the embodiment in which $R^3$ has Formula IV can be combined with the embodiment in which b=1, and further can be combined with the embodiment in which the compound is 10% deuterated. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula II are given below.

Compound H2-1

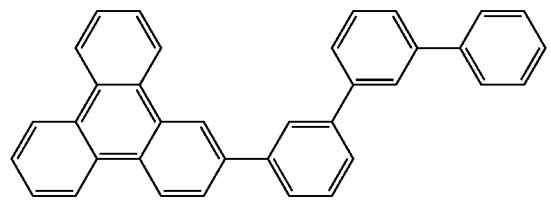

Compound H2-2

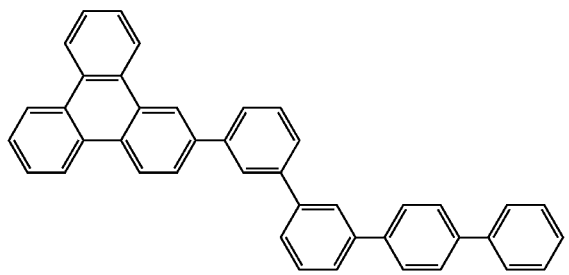

Compound H2-3

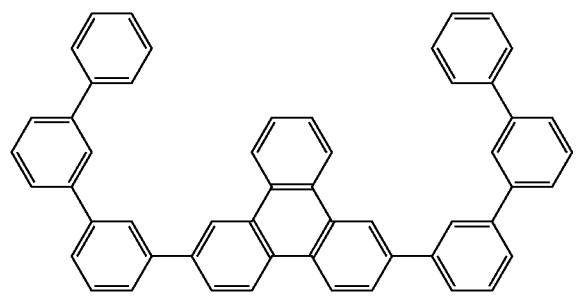

Compound H2-4

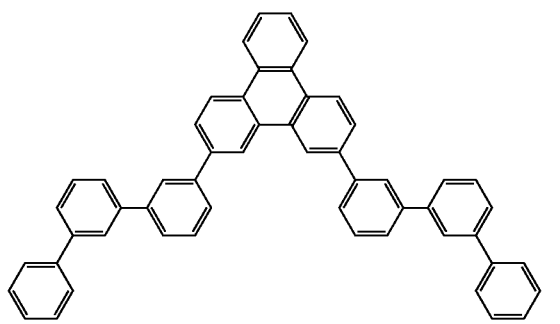

Compound H2-5

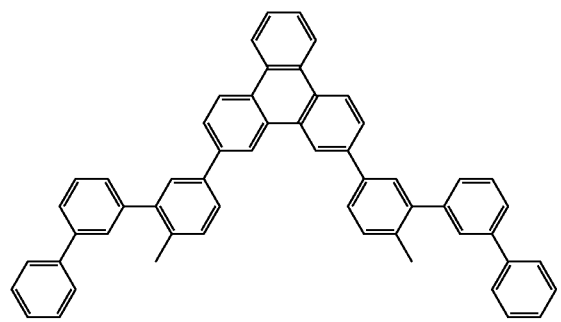

Compound H2-6

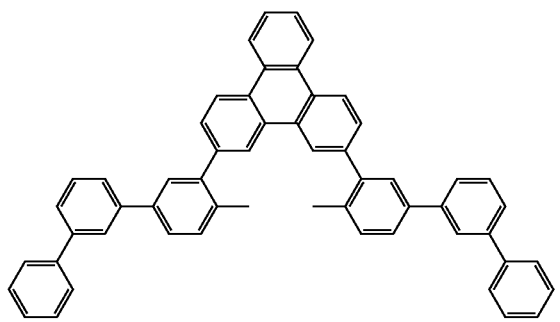

-continued
Compound H2-7
Compound H2-8
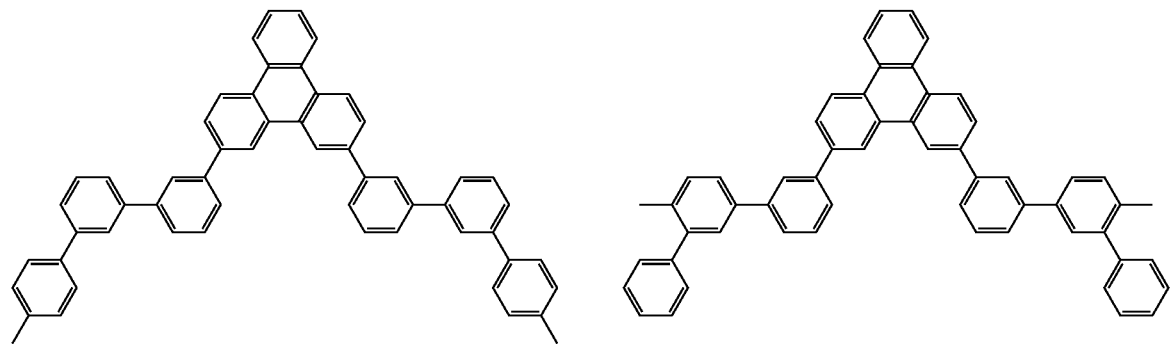
Compound H2-9
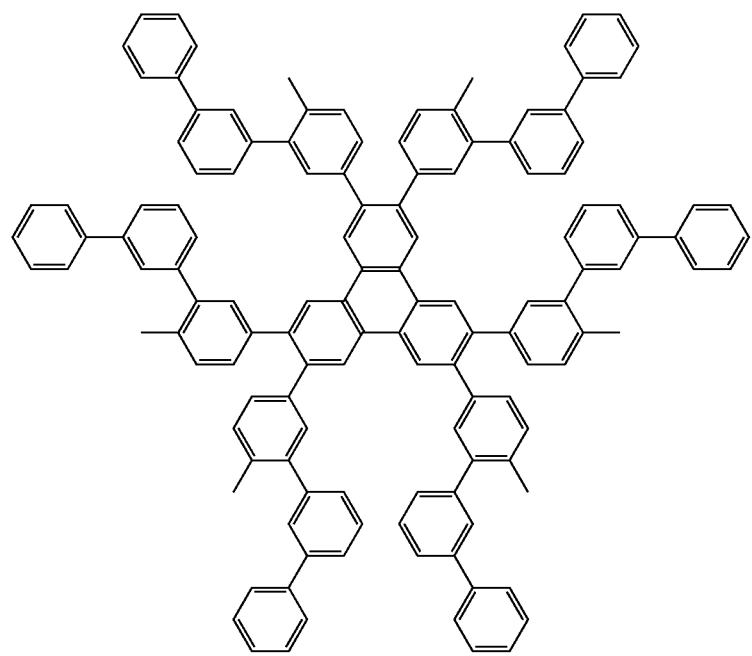
Compound H2-10
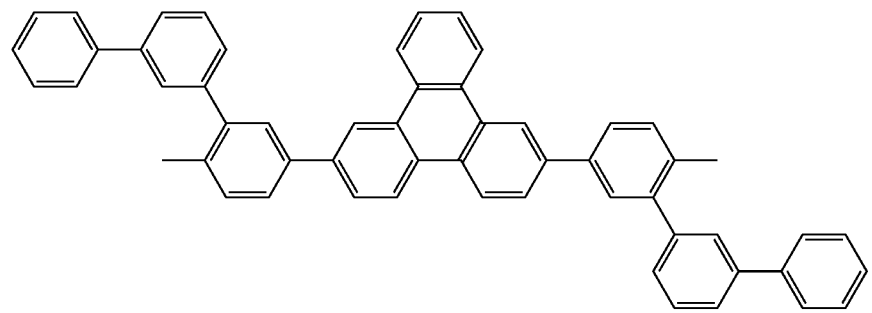
Compound H2-11
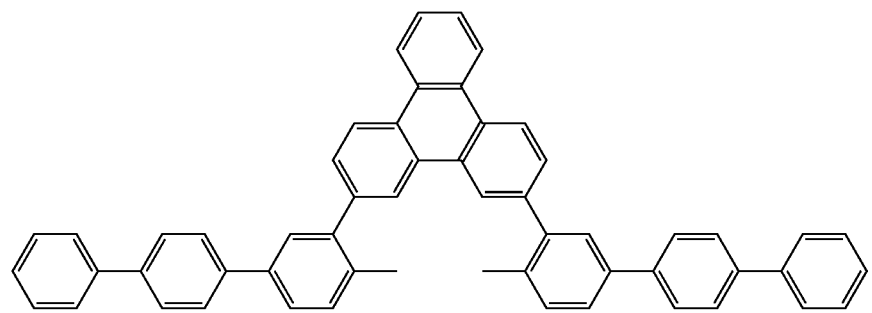

Compound H2-12
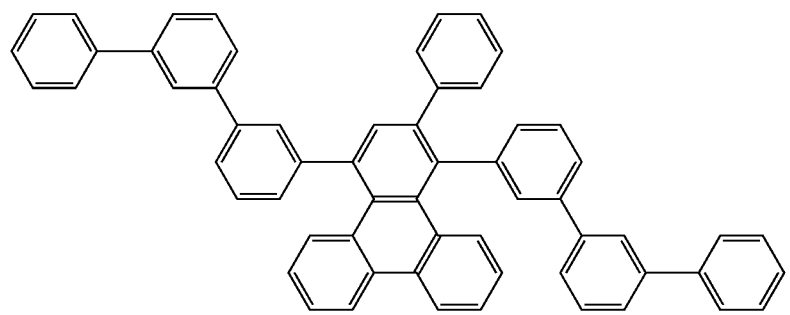
Compound H2-13
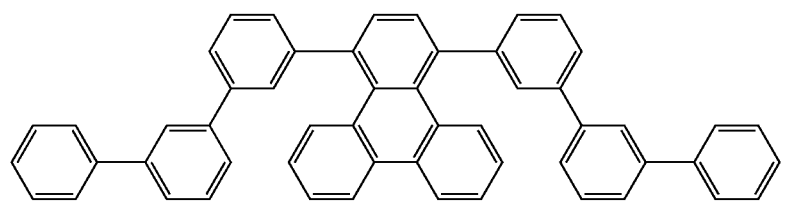
Compound H2-14
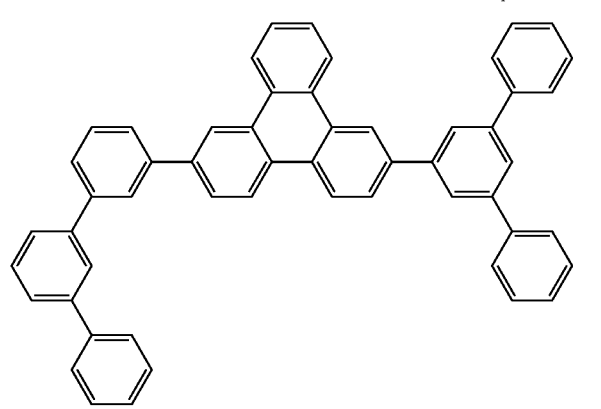
Compound H2-15
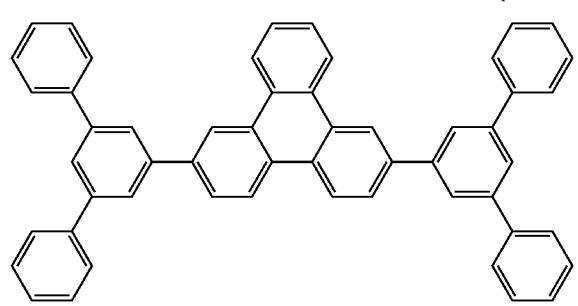
Compound H2-16
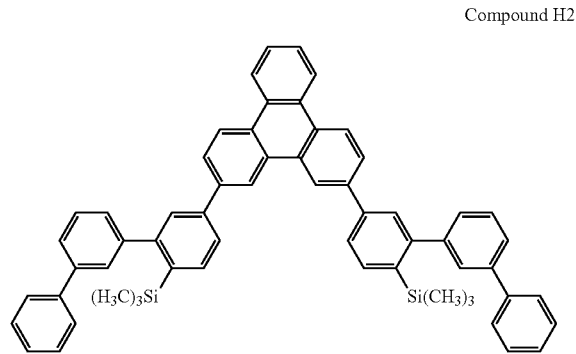
Compound H2-17
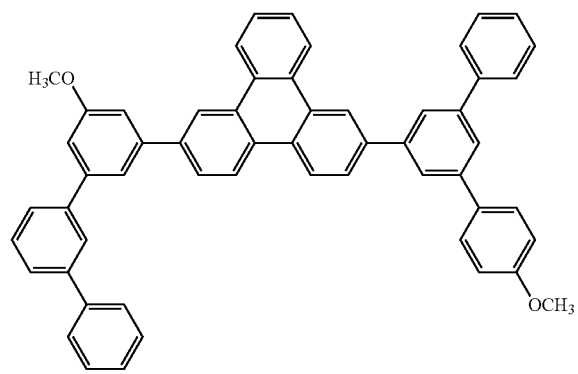

-continued
Compound H2-18
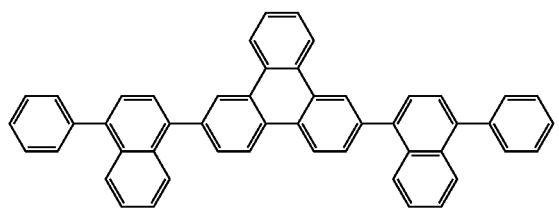
Compound H2-19
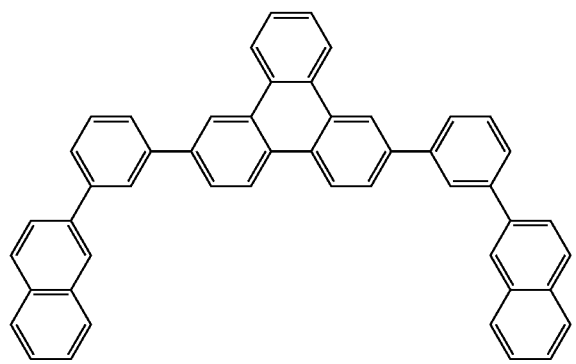
Compound H2-20
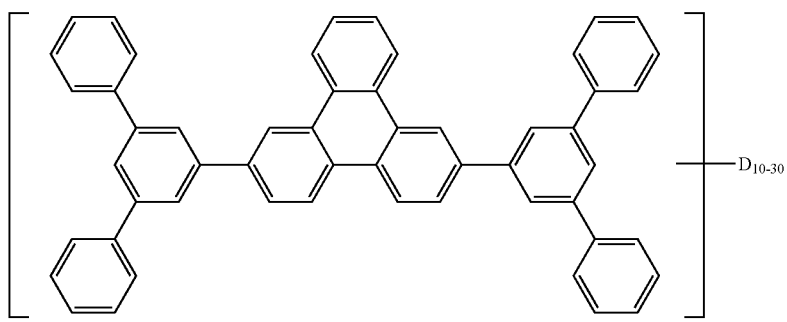
Compound H2-21
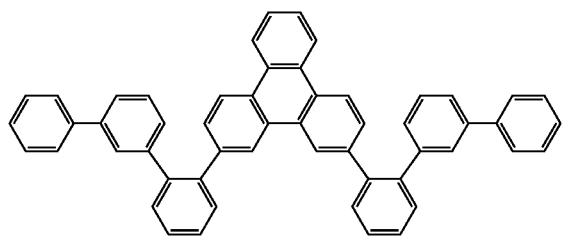
Compound H2-22
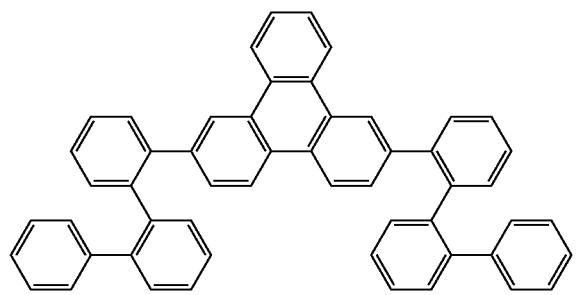
Compound H2-23
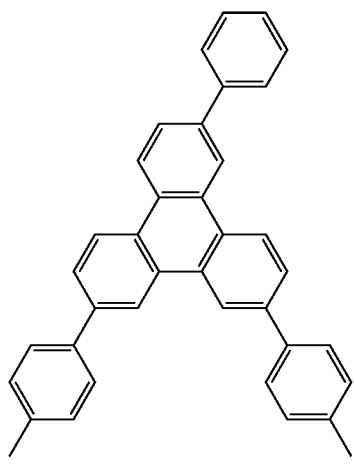
Compound H2-24
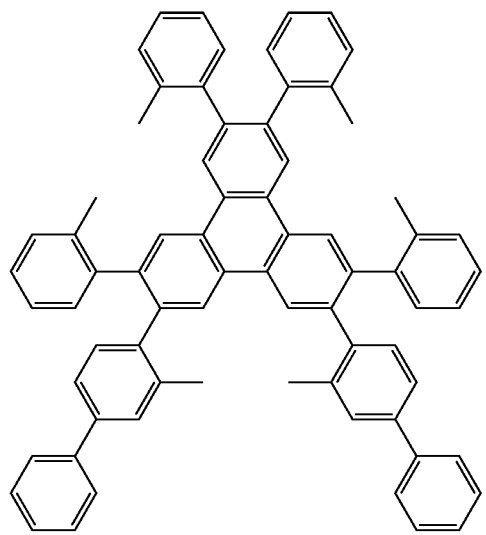

Compound H2-25

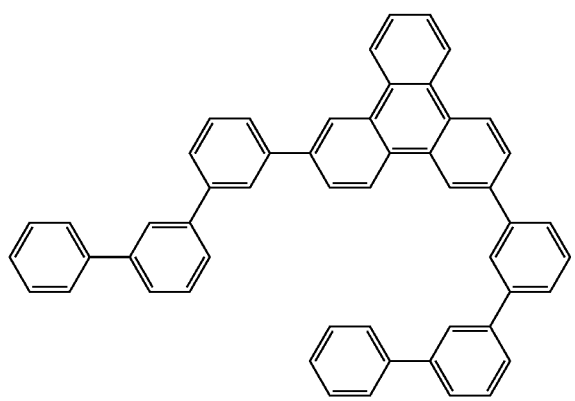

Compound H2-26

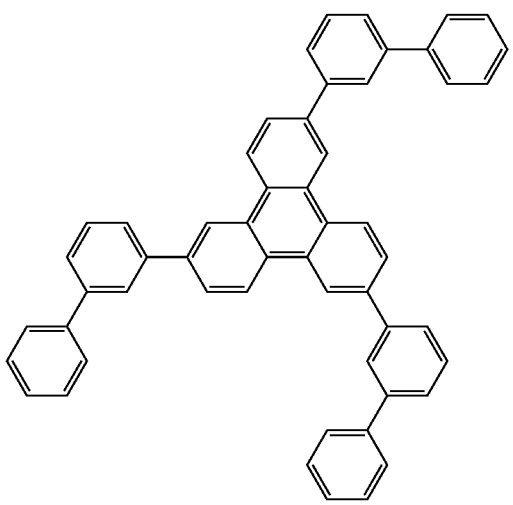

Compound H2-27

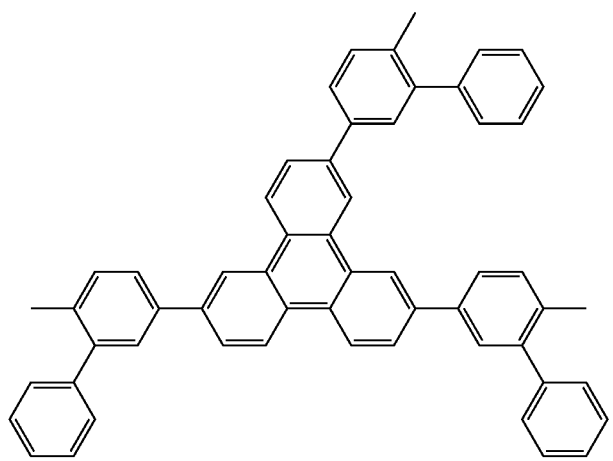

The compounds having Formula II can be prepared by known coupling and substitution reactions. Such reactions are well-known and have been described extensively in the literature, for example, Perez, D.; Guitian, E. *Chem. Soc. Rev.* 2004, 33, 274-283. Other exemplary references include: Yamamoto, Progress in Polymer Science, Vol. 17, p 1153 (1992); Colon et al., Journal of Polymer Science, Part A, Polymer chemistry Edition, Vol. 28, p. 367 (1990); U.S. Pat. No. 5,962,631, and published PCT application WO 00/53565; T. Ishiyama et al., *J. Org. Chem.* 1995 60, 7508-7510; M. Murata et al., *J. Org. Chem.* 1997 62, 6458-6459; M. Murata et al., *J. Org. Chem.* 2000 65, 164-168; L. Zhu, et al., *J. Org. Chem.* 2003 68, 3729-3732; Stille, J. K. *Angew. Chem. Int. Ed. Engl.* 1986, 25, 508; Kumada, M. *Pure. Appl. Chem.* 1980, 52, 669; Negishi, E. *Acc. Chem. Res.* 1982, 15, 340.

The deuterated analogs can be prepared in a similar manner using deuterated precursor materials or, more generally, by treating the non-deuterated compound by known deuteration reactions, as discussed above.

(d) Third Host

In some embodiments, a third host compound is present in the composition.

The third host compound has Formula II, as described above.

The third host compound is different from the second host compound.

The ratio of second host compound to third host compound is in the range of 10:1 to 1:10. In some embodiments, the ratio is 5:1 to 1:5; in some embodiments 3:1 to 1:3

3. Organic Electronic Device

The present invention also relates to an electronic device comprising at least one electroactive layer positioned between two electrical contact layers, wherein the at least one electroactive layer of the device includes the composition described above.

The term "organic electronic device" or sometimes just "electronic device" is intended to mean a device including one or more organic semiconductor layers or materials. An organic electronic device includes, but is not limited to: (1) devices that convert electrical energy into radiation (e.g., a light-emitting diode, light emitting diode display, diode laser, or lighting panel), (2) devices that detect a signal using an electronic process (e.g., a photodetector, a photoconductive cell, a photoresistor, a photoswitch, a phototransistor, a phototube, an infrared ("IR") detector, or a biosensors), (3) devices that convert radiation into electrical energy (e.g., a photovoltaic device or solar cell), (4) devices that convert light of one wavelength to light of a longer wavelength, (e.g., a down-converting phosphor device); (5) devices that include one or more electronic components that include one or more organic semiconductor layers (e.g., a transistor or diode), or any combination of devices in items (1) through (5).

An example of an organic electronic device structure is shown in FIG. 1. The device 100 has a first electrical contact layer, an anode layer 110 and a second electrical contact layer, a cathode layer 160, and a photoactive layer 140 between them. Adjacent to the anode may be a hole injection layer 120. Adjacent to the hole injection layer may be a hole transport layer 130, comprising hole transport material. Adjacent to the cathode may be an electron transport layer 150, comprising an electron transport material. Devices may use one or more additional hole injection or hole transport layers (not shown) next to the anode 110 and/or one or more additional electron injection or electron transport layers (not shown) next to the cathode 160.

Layers 120 through 150 are individually and collectively referred to as the electroactive layers.

Figure 2:
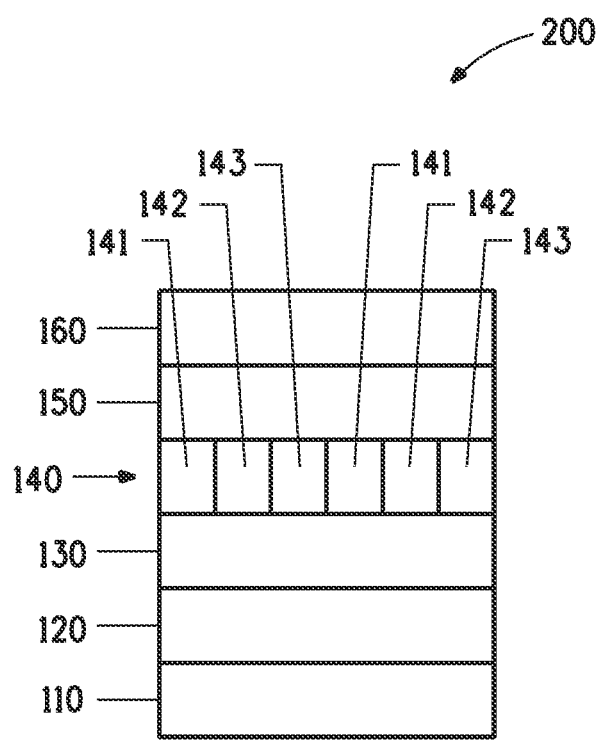
FIG. 2 includes a schematic diagram of another example of an organic electronic device.

In some embodiments, the photoactive layer 140 is pixellated, as shown in FIG. 2. In device 200, layer 140 is divided into pixel or subpixel units 141, 142, and 143 which are repeated over the layer. Each of the pixel or subpixel units represents a different color. In some embodiments, the subpixel units are for red, green, and blue. Although three subpixel units are shown in the figure, two or more than three may be used.

The different layers will be discussed further herein with reference to FIG. 1. However, the discussion applies to FIG. 2 and other configurations as well.

In one embodiment, the different layers have the following range of thicknesses: anode 110, 500-5000 Å, in one embodiment 1000-2000 Å; hole injection layer 120, 50-2000 Å, in one embodiment 200-1000 Å; hole transport layer 130, 50-2000 Å, in one embodiment 200-1000 Å; photoactive layer 140, 10-2000 Å, in one embodiment 100-1000 Å; layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used. In some embodiments, the devices have additional layers to aid in processing or to improve functionality.

Depending upon the application of the device 100, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector), or a layer that converts light of one wavelength to light of a longer wavelength, (such as in a down-converting phosphor device). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966). Devices with light-emitting layers may be used to form displays or for lighting applications, such as white light luminaires.

Photoactive Layer

In some embodiments, the photoactive layer comprises (a) a dopant capable of electroluminescence having an emission maximum between 380 and 750 nm, (b) a first host compound having at least one unit of Formula I, and (c) a second host compound having Formula II.

In some embodiments, the dopant is an organometallic material. In some embodiments, the organometallic material is a complex of Ir or Pt. In some embodiments, the organometallic material is a cyclometallated complex of Ir.

In some embodiments, the first host compound having at least one unit of Formula I, has a purity of at least 99.9%, as measured by ultra-high performance liquid chromatography ("UPLC") with photodiode array detection. In some embodiments, the purity is at least 99.95%.

In some embodiments, the second host compound having Formula II, has a purity of at least 99.9%, as measured by UPLC with photodiode array detection. In some embodiments, the purity is at least 99.95%.

In some embodiments, the second host compound having Formula II, has less than 50 ppm of oxygen-containing impurities (M+16 by mass spec); in some embodiments, less than 20 ppm; in some embodiments, less than 10 ppm.

In some embodiments, the photoactive layer consists essentially of (a) a dopant, (b) a first host compound having at least one unit of Formula I, and (c) a second host compound having Formula II, where additional components that would materially alter the principle of operation or the distinguishing characteristics of the layer are not present.

In some embodiments, the photoactive layer consists essentially of (a) an organometallic complex of Ir or Pt, (b) a first host compound having at least one unit of Formula I, and (c) a second host compound having Formula II, where additional components that would materially alter the principle of operation or the distinguishing characteristics of the layer are not present.

In some embodiments, the photoactive layer consists essentially of (a) a dopant, (b) a first host compound having at least one unit of Formula I, wherein the compound is deuterated, and (c) a second host compound having Formula II, where additional components that would materially alter the principle of operation or the distinguishing characteristics of the layer are not present.

In some embodiments, the photoactive layer consists essentially of (a) an organometallic complex of Ir having an emission maximum at a wavelength in a range of approximately 440-660 nm, (b) a first host compound having at least one unit of Formula I, and (c) a second host compound having Formula II, where additional components that would materially alter the principle of operation or the distinguishing characteristics of the layer are not present.

Any of the compounds having at least one unit of Formula I represented by the embodiments, specific embodiments, specific examples, and combination of embodiments discussed above can be used in the photoactive layer.

Any of the compounds of Formula II represented by the embodiments, specific embodiments, specific examples, and combination of embodiments discussed above can be used in the photoactive layer.

Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," Nature vol. 357, pp 477-479 (11 Jun. 1992). At least one of the anode and cathode is desirably at least partially transparent to allow the generated light to be observed.

The hole injection layer 120 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapour deposited or deposited from liquids which may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can comprise charge transfer compounds, and the like, such as copper phthalocyanine and the tetrathiafulvalene-tetracyanoquinodimethane system (TTF-TCNQ).

In some embodiments, the hole injection layer comprises at least one electrically conductive polymer and at least one fluorinated acid polymer. Such materials have been described in, for example, published U.S. patent applications US 2004/0102577, US 2004/0127637, US 2005/0205860, and published PCT application WO 2009/018009.

In some embodiments, the hole transport layer 130, comprises a compound having at least one unit of Formula I. In some embodiments, the hole transport layer 130 consists essentially of a compound having at least one unit of Formula I. In some embodiments, the hole transport layer 130 comprises a compound having at least one unit of Formula I wherein the compound is deuterated. In some embodiments, the compound is at least 50% deuterated. In some embodiments, the hole transport layer 130 consists essentially of a compound having at least one unit of Formula I wherein the compound is deuterated. In some embodiments, the compound is at least 50% deuterated.

Examples of other hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl) biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino) benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino) styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (α-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. In some embodiments, the hole transport layer further comprises a p-dopant. In some embodiments, the hole transport layer is doped with a p-dopant. Examples of p-dopants include, but are not limited to, tetrafluorotetracyanoquinodimethane (F4-TCNQ) and perylene-3,4,9,10-tetracarboxylic-3,4,9,10-dianhydride (PTCDA).

In some embodiments, the electron transport layer 150 comprises the compound having at least one unit of Formula I. Examples of other electron transport materials which can be used in layer 150 include, but are not limited to, metal chelated oxinoid compounds, including metal quinolate derivatives such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenyl)-5-(4-t-butylphenyl)-1,3,4-oxadiazole (PBD), 3-(4-biphenyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

Layer 150 can function both to facilitate electron transport, and also serve as a buffer layer or confinement layer to prevent quenching of the exciton at layer interfaces. Preferably, this layer promotes electron mobility and reduces exciton quenching.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, electroactive layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device can be prepared by a variety of techniques, including sequential vapor deposition of the individual layers on a suitable substrate. Substrates such as glass, plastics, and metals can be used. Conventional vapor deposition techniques can be used, such as thermal evaporation, chemical vapor deposition, and the like. Alternatively, the organic layers can be applied from solutions or dispersions in suitable solvents, using conventional coating or printing techniques, including but not limited to spin-coating, dip-coating, roll-to-roll techniques, ink-jet printing, screen-printing, gravure printing and the like.

EXAMPLES

The following examples illustrate certain features and advantages of the present invention. They are intended to be illustrative of the invention, but not limiting. All percentages are by weight, unless otherwise indicated.

Synthesis Example 1

The core indolocarbazole materials are shown below.

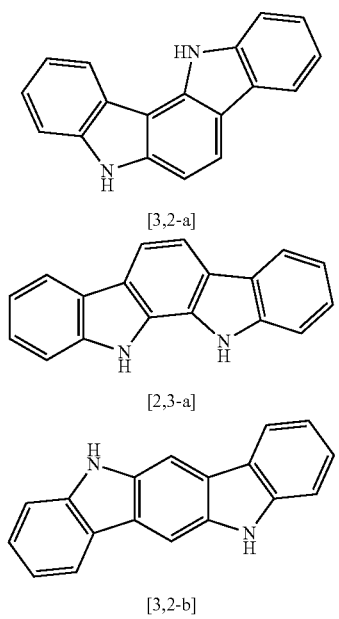

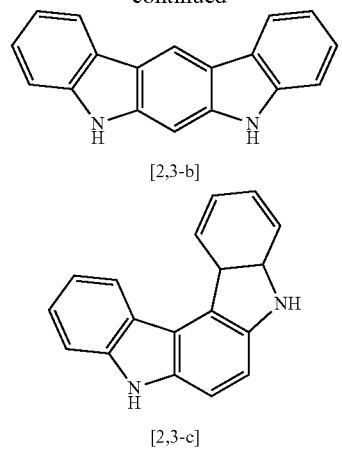

Indolo[3,2-a]carbazole can be synthesized according to a literature procedure from 2,3'-biindolyl: Janosik, T.; Bergman, J. Tetrahedron (1999), 55, 2371. 2,3'-biindolyl was synthesized according to the procedure described in Robertson, N.; Parsons, S.; MacLean, E. J.; Coxall, R. A.; Mount, Andrew R. Journal of Materials Chemistry (2000), 10, 2043.

Indolo[2,3-a]carbazole can be synthesized according to the procedure found in EP2080762A1 (Nippon Steel Co., Ltd.; filed Aug. 11, 2007).

Indolo[3,2-b]carbazole can be synthesized from commercially available 3,3'-methylenediindole according to the procedure found in: Pindur, U.; Müller, J. Arch. Pharm. (1987), 320, 280.

Indolo[2,3-b]carbazole can be synthesized according to the procedure found in Knolker, Hans-Joachim; Reddy, Kethiri R. Tetrahedron Letters (1998), 39(23), 4007-4008.

Indolo[2,3-c]carbazole can be synthesized according to the procedure found in Desarbre, Eric and Bergman, Jan; Journal of the Chemical Society, Perkin Transactions 1: Organic and Bio-Organic Chemistry, (13), 2009-2016; 1998

Synthesis Example 2

This example illustrates the preparation of Compound H1-19.

The non-deuterated analog of the compound was made in a manner analogous to the procedure described in published European Patent Application EP 2080762, Example 1. The structure was confirmed by NMR analysis.

This compound was deuterated by dissolving in $C_6D_6$ and treating with a 5-fold molar excess of triflic acid for several hours. The reaction was quenched with a $D_2O$ solution of NH2-2CO3. The organic layer was washed, extracted, dried, and purified by column chromatography. This method affords Compound H1-19 having 50-55% of the hydrogen atoms exchanged by deuterium.

Synthesis Example 3

This example illustrates the preparation of some intermediate triphenylene compounds.

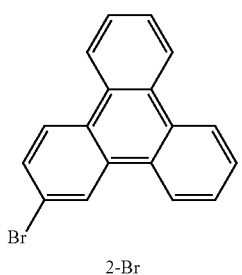

2-Br

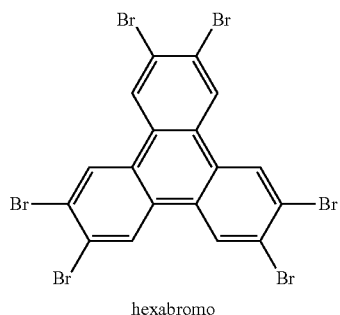

hexabromo

2-Bromotriphenylene was prepared according to the literature method (R. Kwang; et al. U.S. Pat. Appl. Publ., 20100072887, 25 Mar. 2010). The conditions reported on p. 79 therein (Br$_2$, Fe(0), PhNO$_2$, 0° C.) result in a 2.7:1 ratio of desired 2-bromotriphenylene to dibromotriphenylenes.

The hexabromotriphenylene was prepared by a slight modification of the literature procedure (Y. Tanaka, et al. U.S. Pat. Appl. Publ. (2006), US 20060024595, 6 Feb. 2006).

Synthesis Example 4

This example illustrates the preparation of some intermediate triphenylene compounds.

The triphenylene ditriflate cores are shown below (OTf=trifluoromethanesulfonyloxy, OSO$_2$CF$_3$)

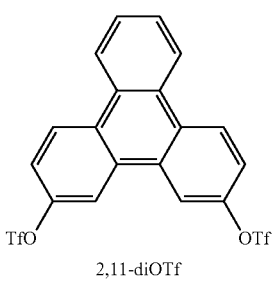

2,11-diOTf

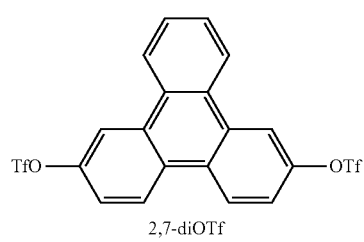

2,7-diOTf

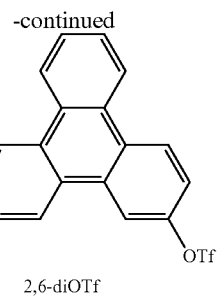

2,6-diOTf

The triphenylene ditriflates were prepared by treatment of the corresponding dihydroxytriphenylenes with triflating reagents such as trifluoromethanesulfonyl anhydride or N-phenyltriflimide in the presence of a pyridine, trialkylamine or alkaline metal carbonate base in yields ranging from 0.62-86%. The corresponding dihydroxytriphenylenes were obtained from the known dimethoxytriphenylene via demethylation with boron tribromide in dichloromethane at 0° C. or pyridinium hydrochloride at 220° C. in yields of 62-80%.

The core dimethoxy triphenylenes are shown below and were prepared according to the literature procedures.

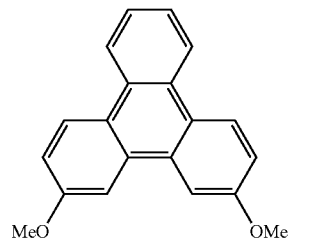

2,11-diOMe

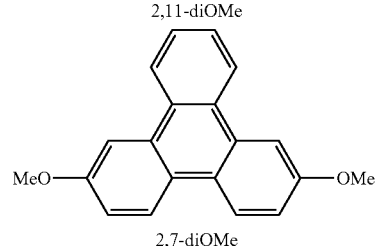

2,7-diOMe

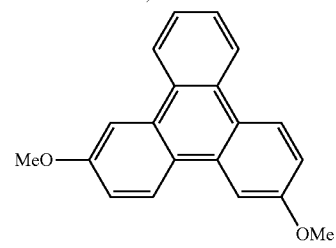

2,6-diOMe 2,11-Dimethoxytriphenylene was prepared as described by B. Ma, et al. in PCT Int. Appl. (2009), WO 2009021126 20090212.). Alternatively, it may be prepared without resort to a photochemical reactor following the procedure of K. Togashi, et al. *J. Mater. Chem.*, 2012, 22, 20689-20695.

2,7-Dimethoxytriphenylene was prepared as described by B. T. King, et al. in *J. Org. Chem.* 2007, 72, 2279-2288.

2,6-Dimethoxytriphenylene was prepared as described by H. Naka, et al. in *New J. Chem.*, 2010, 34, 1700-1706.

The triphenylene ditriflate isomers shown above can, in turn, be converted to the corresponding bis-boronate pinacol esters using the well-known cross coupling conditions (bis(pinacolato)diboron, PdCl$_2$(dppf)-CH$_2$Cl$_2$, potassium acetate in 1,4-dioxane at elevated temperature).

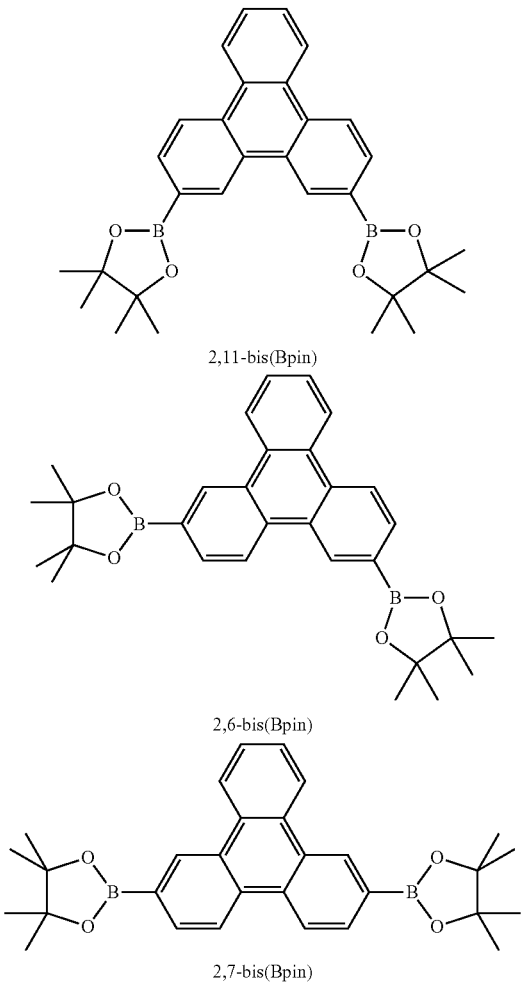

2,11-bis(Bpin)

2,6-bis(Bpin)

2,7-bis(Bpin)

The resulting availability of both triflate- and boronate ester-substituted triphenylenes allows multiple options for attachment of side chains to improve electroluminescence properties. In order to prepare the various substituted triphenylene materials described in this invention, access to appropriately functionalized terphenyls is required. Depending on the functionality present in the triphenylene component, the terphenyl component may contain either a boronic acid or ester thereof, or a triflate or halogen atom such as bromine or iodine. Some non-limiting examples of each are shown below.

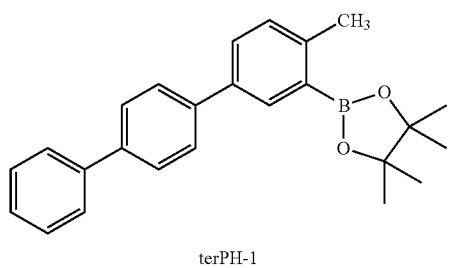

terPH-1

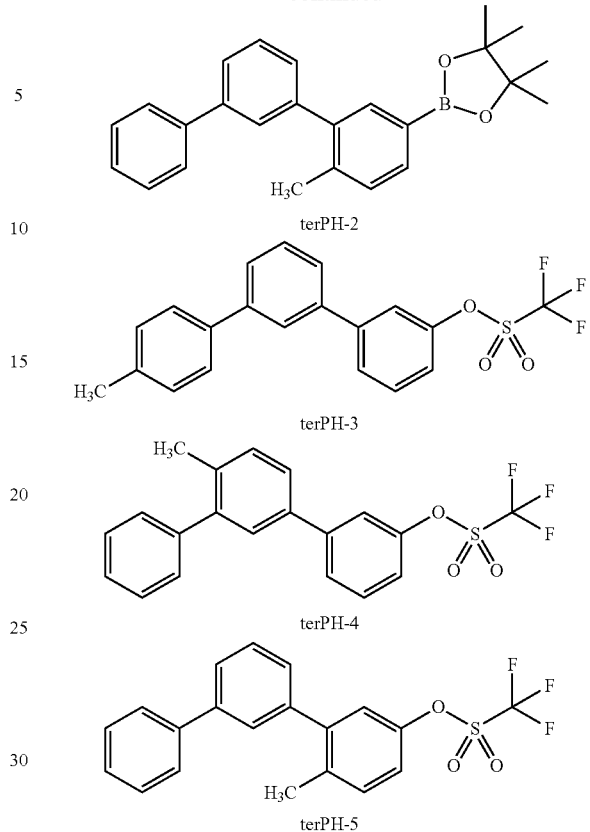

terPH-2 terPH-3 terPH-4 terPH-5

The synthesis of 4,4,5,5-tetramethyl-2-(4-methyl[1,1':4',1"-terphenyl]-3-yl)-1,3,2-dioxaborolane (terPh-1. GAS Reg, No. 1450898-19-7) in two steps has been reported (K. Watanabe, et al. U.S. Pat. Appl. Publ., 20130214259, 22 Aug. 2013, p. 79), Starting with 4-biphenylboronic acid and 2-bromo-4-iodo-1-methylbenzene, under palladium catalyzed cross coupling conditions, the resulting linear terphenyl bromide is converted to the product boronate pinacol ester, terPh-1.

Related methyl-substituted terphenyl boronates having different points of substitution and linkages between the phenyl rings can be prepared by variations on this approach utilizing readily available isomeric starting materials. For example, 4,4,5,5-tetramethyl-2-[4-methyl-3-(3-phenylphenyl)phenyl]-1,3,2-dioxaborolane (terPh-2) was prepared in two steps by coupling of 3-biphenylboronic acid with 4-bromo-2-iodo-1-methylbenzene ((Ph$_3$P)$_4$Pd, Na$_2$CO$_3$, Aliquat™ 336, toluene/water, reflux; 84% yield), followed by debromoborylation with bis(pinacolato)diboron (PdCl$_2$(dppf), KOAc, 1,4-dioxane, reflux; 70% yield).

Terphenyl triflates make good coupling partners with triphenylene boronate esters. The preparation of terphenyl triflates is well-known. For example, the synthesis of [3-[3-(p-tolyl)phenyl]phenyl]trifluoromethanesulfonate (terPh-3, CAS Reg. No. 882971-95-1) has been reported (S. Ishikawa, et al. Chem. Lett, 2006, 35, 164-165). Starting with 3-hydroxyphenylboronic acid and 4-tolyltriflate, under palladium catalyzed cross coupling conditions, the resulting 4'-methylbiphenyl-3-ol is converted to the corresponding biphenyl triflate which is subjected to another iteration of cross coupling product with 3-hydroxyphenylboronic acid followed by triflation with triflic anhydride and pyridine to give terPh-3.

Other terphenyl triflates similar to, but not limited to, terPh-4 and terPh-5 can be prepared using this approach. For example, [3-(4-methyl-3-phenyl-phenyl)phenyl] trifluoromethanesulfonate (terPh-4) was prepared in 4 steps and 27% overall yield starting with 4-bromo-2-iodo-1-methylbenzene which was used to form the center ring of the terphenyl system as shown in the Schemes below.

Synthesis Example 5

This example illustrates the preparation of Compound H2-4.

The compound was prepared as shown in the scheme below:

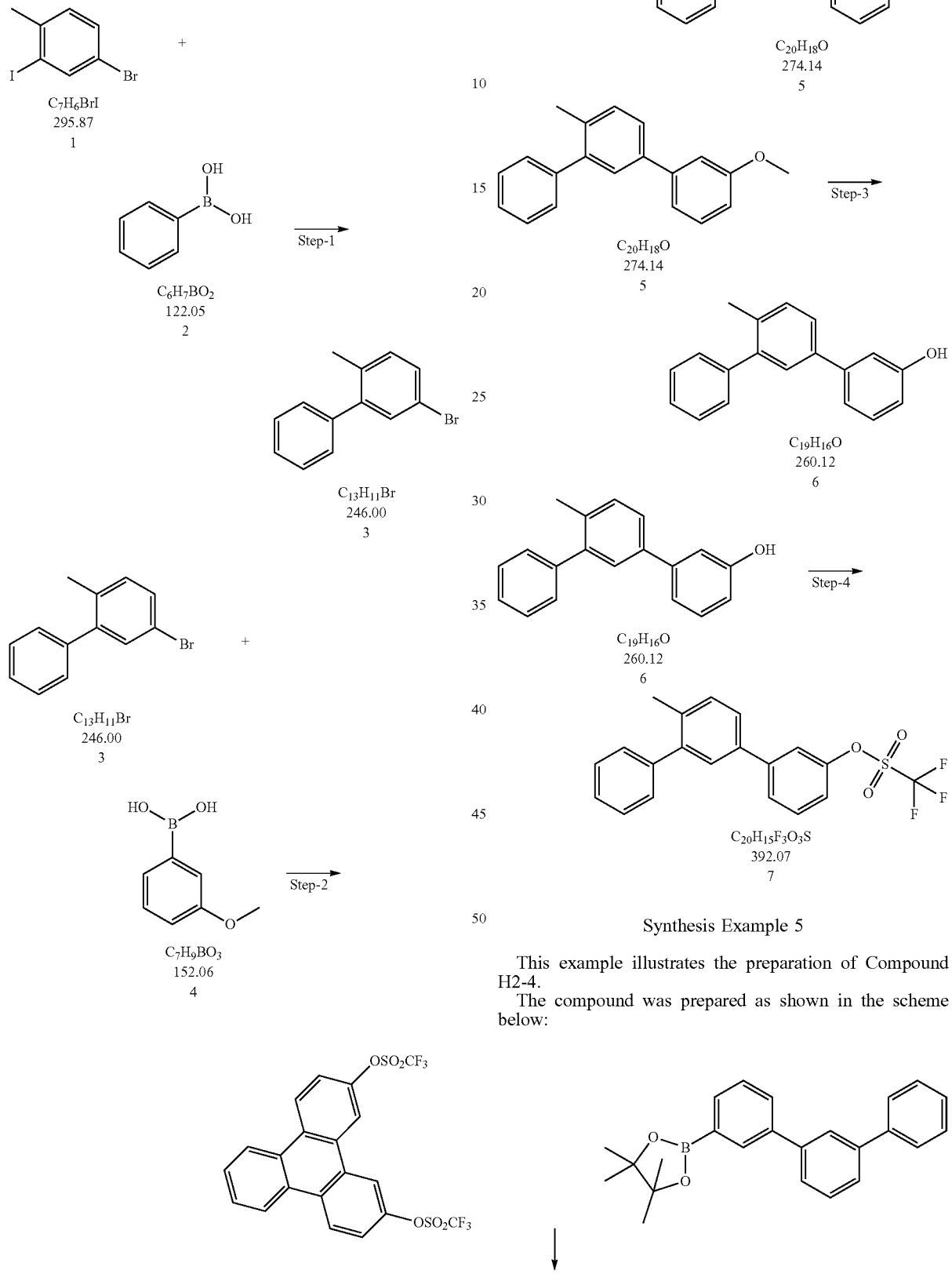

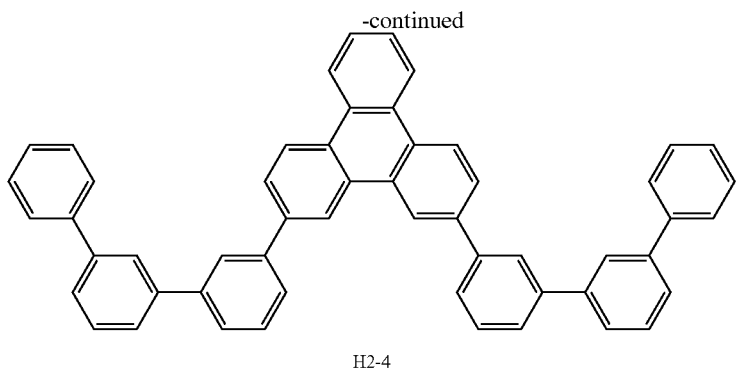

H2-4

In a nitrogen filled glove box, 2.6 g of triphenylene-2,11 ditriflate material and 3.7 g of m,m-terphenyl pinacolboronate were mixed with catalyst consisting of 0.24 g tris(dibenzylideneacetone)dipalladium(0) ["$Pd_2(DBA)_3$"] and 0.14 g tricyclohexylphosphine and these solids were dissolved into a solution of 3.4 g potassium phosphate dissolved in 50 mL dioxane and 25 mL water. The slurry was stirred and heated in the glove box in a mantle at 100° C. for 1 hr then warmed gently (80° C.) under nitrogen overnight. The solution is immediately sandy brown and cloudy but on reaching ~100° C. it is a clear dark red brown. The solution was cooled and removed from the glove box.

Excess water (50 mL) was added and the resulting grey solid was filtered off and suction dried. The grey filter cake was dissolved into dichloromethane ("DCM") and then run through a column of silica/b-alumina/florisil eluting with DCM/toluene to collect a blue photoluminescent band. The collected eluent was evaporated down and an equivalent volume of acetonitrile was added to precipitate a flocculent white material which was filtered and suction dried to 2.3 g white solid. The material was further purified by silica chromatography eluting with toluene and finally purified by high vacuum sublimation prior to device evaluation. Material identity was confirmed by 1H nmr.

Synthesis Example 6

This example illustrates the preparation of Compound H2-5.

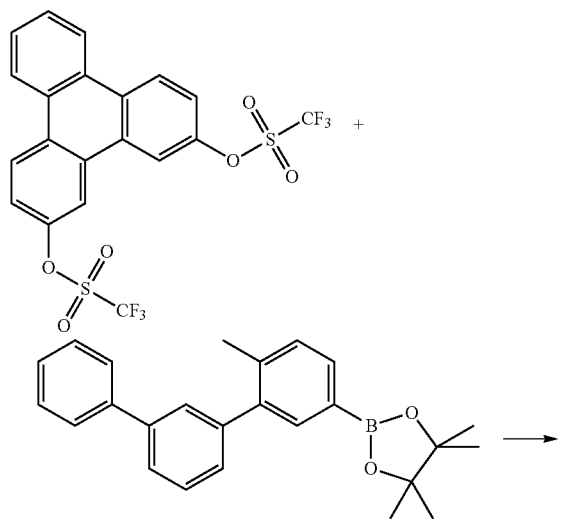

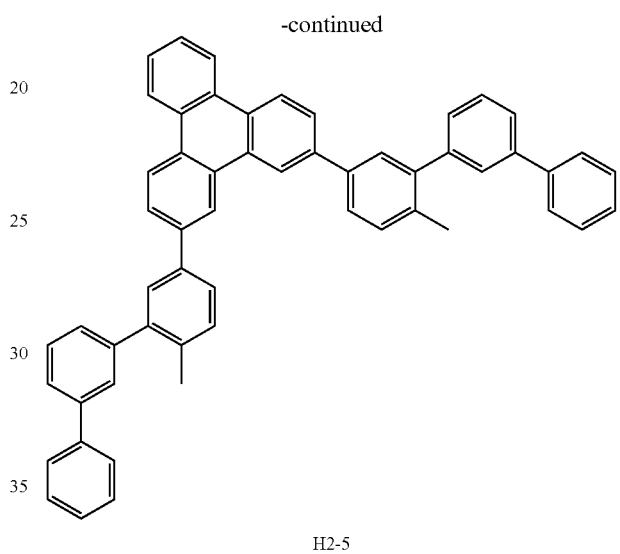

H2-5

Triphenylene-2,11-diyl bistrifluoromethanesulfonate (8.39 g. 16.0 mmol), 4,4,5,5-tetramethyl-2-[4-methyl-3-(3-phenylphenyl)phenyl]-1,3,2-dioxaborolane, prepared in a manner analogous to that described for terPh-2 in Synthesis Example 4 (14.22 g, 38.4 mmol), and a solution of sodium carbonate (10.18 g, 96.0 mmol) and potassium phosphate tribasic monohydrate (22.08 g, 96.0 mmol) in water (48.0 mL) were suspended in 1,4-dioxane (160 mL) with stirring and sparged with nitrogen for 30 minutes. [1,1'-bis(diphenylphosphino)-ferrocene]dichloropalladium(II), complex with dichloromethane (1:1) (0.39 g, 0.48 mmol) was added into the mixture and then heated at reflux for 5½ hrs. The reaction mixture was cooled to room temperature and extracted with ethyl acetate (3×50 mL). The combined organic layer was washed with brine (2×100 mL), dried over magnesium sulfate, and concentrated. The crude brown oil was purified by medium pressure liquid chromatography ("MPLC") eluting with 0-100% dichloromethane in hexane. The fractions eluting at 18-28% dichloromethane in hexane were combined, concentrated to a colorless liquid that was redissolved in toluene and passed through a layered plug of basic alumina/florisil/silica gel, with $N_2$ sparged toluene as eluent. The collected fractions were concentrated to a volume of 30 mL and added dropwise into $N_2$ sparged acetonitrile (300 mL). The precipitate thus obtained was collected by filtration, washed with degassed isopropanol and dried under vacuum to give Compound H2-5 as a white powdery solid (7.08 g, 62.1% isolated yield). Final purification prior to device preparation was accomplished by vacuum sublimation.

Synthesis Example 7

This example illustrates the preparation of Compound H2-6.

a. Synthesis of 2,11-bis-(4,4,5,5-tetramethyl-1,3,2-dioxaborolan-2-yl)triphenylene

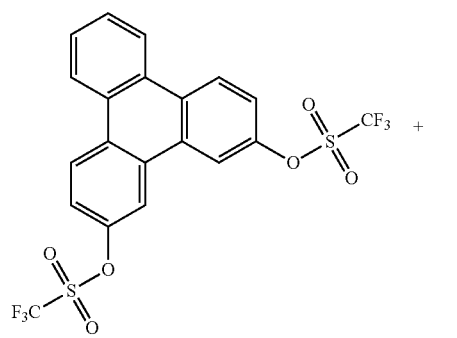

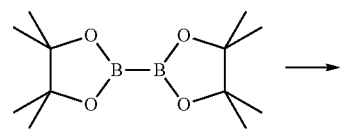

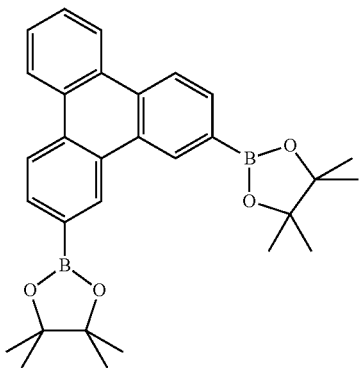

A mixture of triphenylene-2,11-diyl bistrifluoromethanesulfonate (18.88 g. 36.0 mmol), bis(pinacolato)diboron (27.43 g, 108 mmol), and potassium acetate (10.60 g, 108 mmol) in 1,4-dioxane (276.9 mL) was sparged with nitrogen for 30 minutes. Bis(diphenylphosphino)ferrocene]palladium(II) chloride, complex with dichloromethane (1:1) (0.88 g, 1.08 mmol) was added to the mixture and then heated at 80° C. for 22 hrs. The reaction mixture was cooled to room temperature and filtered through a pad of Celite, eluting with dichloromethane. The collected filtrate was concentrated, and the crude brown oil was purified by MPLC eluting with 0-50% dichloromethane in hexane. The fractions eluting at 7-16% dichloromethane in hexane were combined and concentrated to give 2,11-bis-(4,4,5,5-tetramethyl-1,3,2-dioxaborolan-2-yl)triphenylene as an off-white solid (17.0 g, 98.3% isolated yield).

b. Synthesis of 2,11-bis-(5-bromo-2-methylphenyl)triphenylene

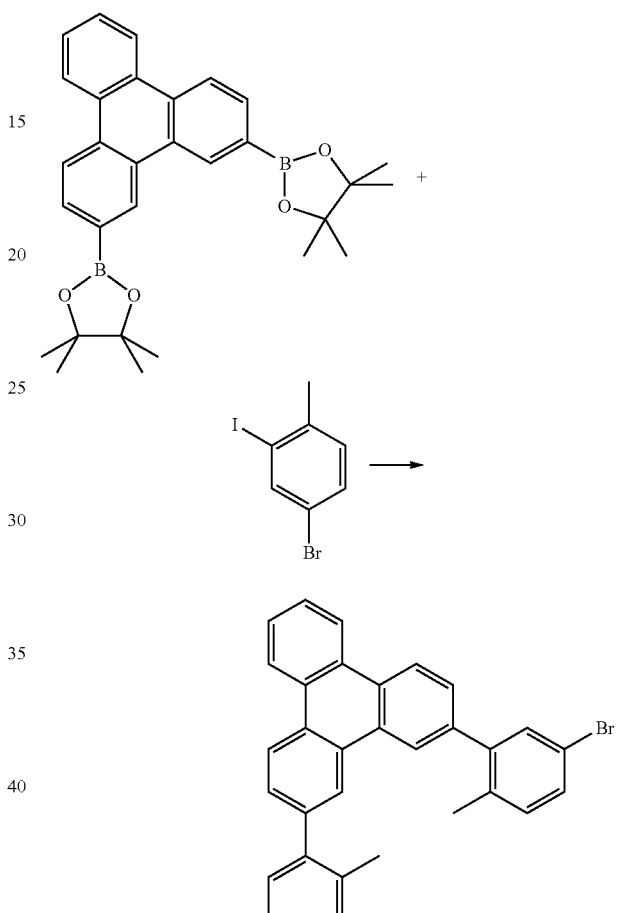

A mixture of 2,11-bis-(4,4,5,5-tetramethyl-1,3,2-dioxaborolan-2-yl)triphenylene (9.60 g, 20.0 mmol), 4-bromo-2-iodotoluene (14.25 g, 48.0 mmol), aqueous sodium carbonate solution (45.5 mL, 2.0 M) in 1,2-DME (90.9 mL) was sparged with nitrogen for 30 minutes. Triphenylphosphine (0.26 g, 1.00 mmol) and palladium acetate (0.11 g, 0.50 mmol) were added to the mixture and then heated at reflux for 20 hrs. The reaction mixture was cooled to room temperature and extracted with ethyl acetate (3×50 mL). The combined organic layer was washed with brine (2×100 mL), dried over magnesium sulfate, and concentrated. The crude brown oil was purified by MPLC eluting with 0-50% dichloromethane in hexane. The fractions eluting at 12-15% dichloromethane in hexane were combined, concentrated, and crystallized from 1:2 toluene:isopropanol to give 2,11-bis-(5-bromo-2-methylphenyl)triphenylene as a white solid (5.88 g, 51.9% isolated yield).

c. Synthesis of 2,11-bis[2-methyl-(5-(3-phenyl)phenyl)phenyl]triphenylene (H2-6)

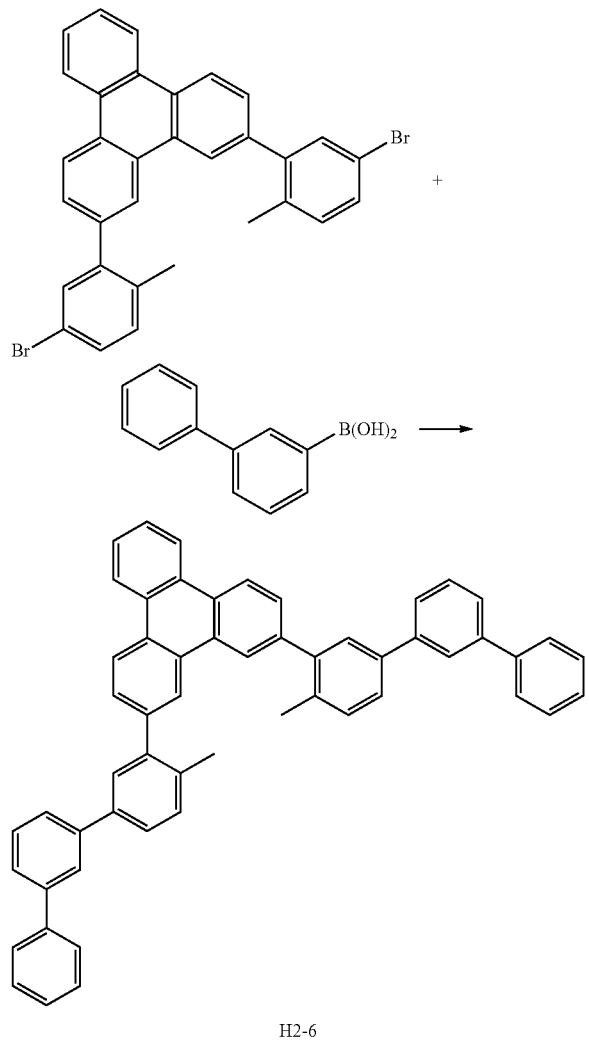

H2-6

A mixture of 2,11-bis-(5-bromo-2-methylphenyl)triphenylene (1.18 g, 2.09 mmol), 3-biphenylboronic acid (0.99 g, 5.01 mmol), Aliquat™ 336 (0.17 g, 0.42 mmol) and sodium carbonate solution (13.1 mL, 2.0 M) in o-xylene (26.1 mL) was sparged with nitrogen for 30 minutes. Pd(PPh$_3$)$_4$ (0.12 g, 0.10 mmol) was added to the mixture and then heated at reflux for 18 hrs. The reaction mixture was cooled to room temperature and extracted with ethyl acetate (3×50 mL). The combined organic layer was washed with brine (2×100 mL), dried over magnesium sulfate, and concentrated. The crude brown oil was purified by MPLC eluting with 0-50% dichloromethane in hexane. The fractions eluting at 21-25% dichloromethane in hexane were combined, concentrated, and precipitated by dropwise addition of a concentrated toluene solution of the purified product into a stirring acetonitrile. The precipitate was collected and washed with isopropanol to give Compound H2-6 as a powdery white solid (0.91 g, 61.3% isolated yield). Final purification prior to device preparation was accomplished by vacuum sublimation.

Synthesis Example 8

This example illustrates the preparation of 2,11-bis[3-[3-(p-tolyl)phenyl]phenyl]triphenylene, Compound H2-7.

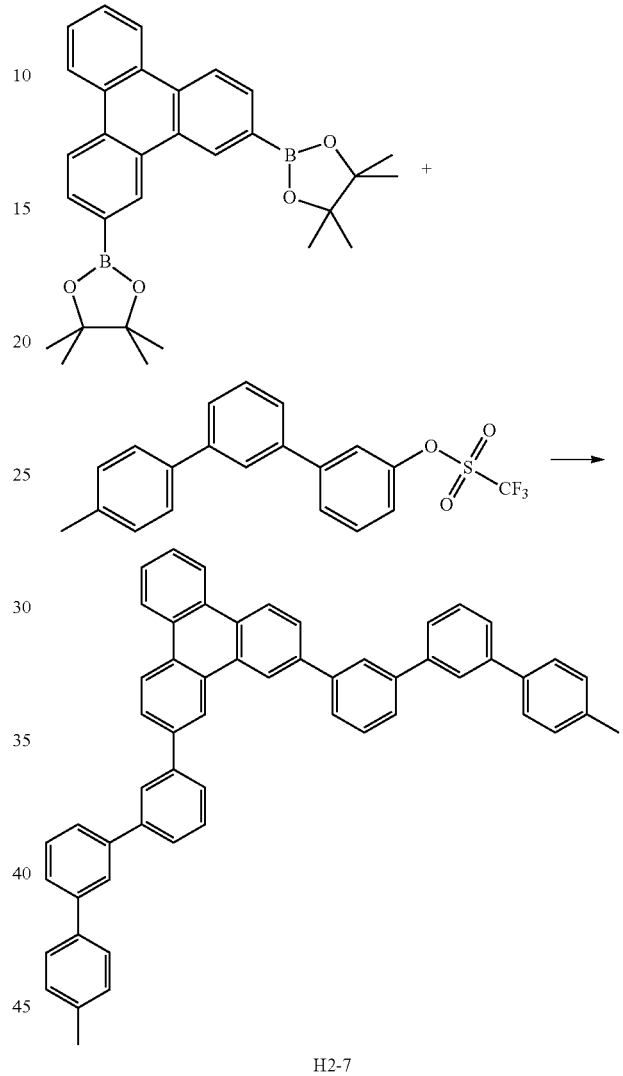

H2-7

2,11-bis-(4,4,5,5-tetramethyl-1,3,2-dioxaborolan-2-yl)triphenylene (3.84 g, 8.00 mmol), [3-[3-(p-tolyl)phenyl]phenyl]trifluoromethanesulfonate (7.53 g, 19.2 mmol), and a solution of sodium carbonate (5.08 g, 48.0 mmol) and potassium phosphate tribasic monohydrate (11.04 g, 48.0 mmol) in water (24.0 mL) were suspended in 1,4-dioxane (80 mL) with stirring and sparged with nitrogen for 30 minutes. [1,1'-bis(diphenylphosphino)-ferrocene]dichloropalladium(II), complex with dichloromethane (1:1) (0.19 g, 0.24 mmol) was added to the mixture and then heated at reflux for 18 hrs. The reaction mixture was cooled to room temperature and the precipitated solid was filtered, washed with water (100 mL) and ethyl acetate (100 mL), and recrystallized from 1:2 toluene:isopropanol to give Compound H2-7 as a white powdery solid (2.31 g, 40.5% isolated yield). Final purification prior to device preparation was accomplished by vacuum sublimation.

Synthesis Example 9

This example illustrates the preparation of 2,3,6,7,10,11-hexa-[4'-methyl-3'-(3"-phenyl-1"-phenyl)phenyl]triphenylene, Compound H2-8.

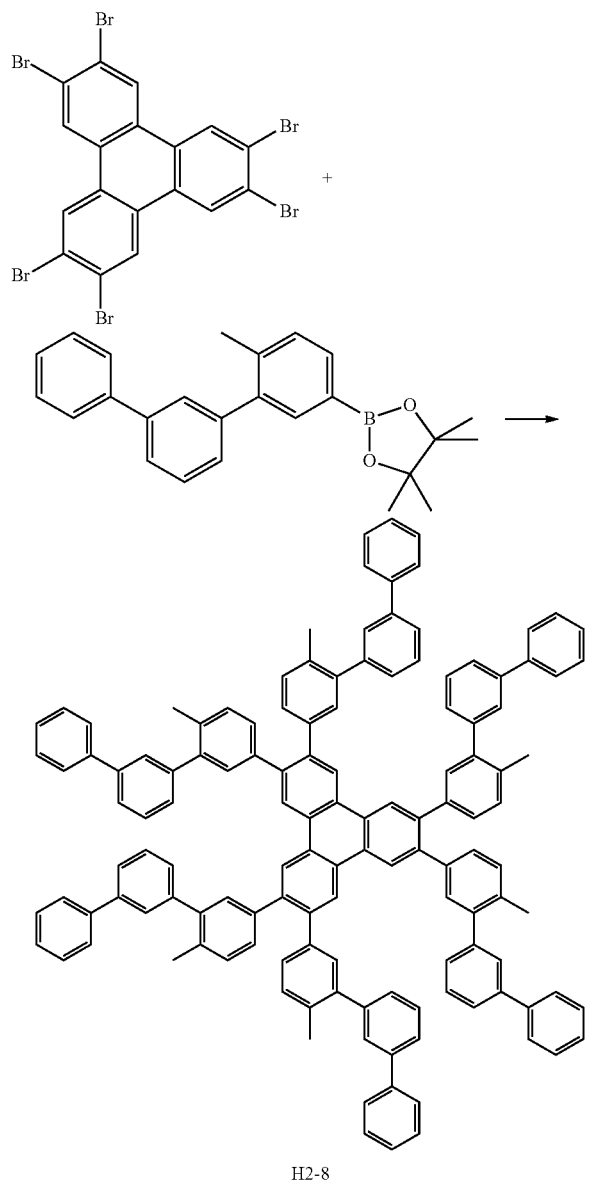

H2-8

A mixture of 2,3,6,7,10,11-hexabromotriphenylene (1.40 g, 2.00 mmol, prepared according to the literature method), 4,4,5,5-tetramethyl-2-[4-methyl-3-(3-phenylphenyl)phenyl]-1,3,2-dioxaborolane, prepared in a manner analogous to that described for terPh-2 in Synthesis Example 4 (5.33 g, 14.4 mmol), Aliquat™ 336 (0.16 g, 0.40 mmol), and aqueous sodium carbonate solution (12.5 mL, 2.0 M) in anisole (25.0 mL) was sparged with nitrogen for 30 minutes. Pd(PPh$_3$)$_4$ (0.11 g, 0.10 mmol) was added into the mixture and then heated at reflux for 18 hrs. The reaction mixture was cooled to room temperature and extracted with ethyl acetate (3×50 mL). The combined organic layer was washed with brine (2×100 mL), dried over magnesium sulfate, and concentrated. The crude brown oil was purified by MPLC eluting with 0-50% dichloromethane in hexane. The fractions eluting at 33-34% dichloromethane in hexane were combined, concentrated, and passed through a plug of silica gel, eluting with warm toluene. The collected eluent was concentrated and precipitated by dropwise addition into stirring acetonitrile. The precipitate was collected and washed with isopropanol to give Compound H2-8 as a powdery white solid (2.16 g, 64.1% isolated yield). Final purification prior to device preparation was accomplished by vacuum sublimation.

Synthesis Example 10

This example illustrates the preparation of 2,11-bis[3-(4-methyl-3-phenyl-phenyl)phenyl]triphenylene, Compound H2-9.

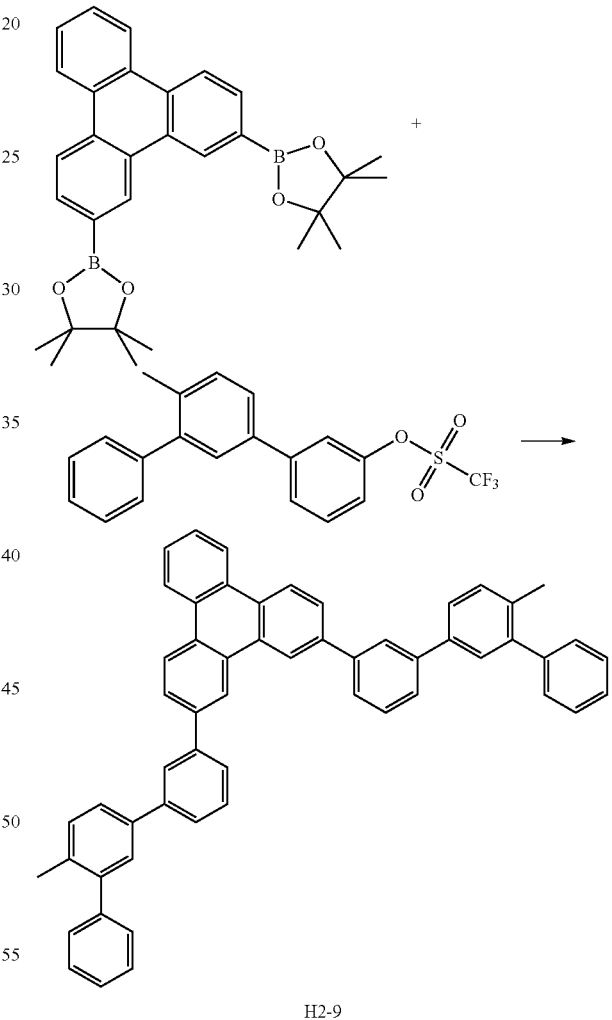

H2-9

Compound H2-9, was prepared under the same conditions as those used to prepare Compound H2-7 (Synthesis Example 8), except that [3-(4-methyl-3-phenyl-phenyl)phenyl]trifluoromethanesulfonate was used in place of [3-[3-(p-tolyl)phenyl]phenyl]trifluoromethanesulfonate. The reaction gave Compound H2-9 as a white powdery solid (2.79 g, 48.9% isolated yield). Final purification prior to device preparation was accomplished by vacuum sublimation.

Synthesis Example 11

This example illustrates the preparation of Compound H2-10.

a. Synthesis of 2,7-bis-(4,4,5,5-tetramethyl-1,3,2-dioxaborolan-2-yl)triphenylene

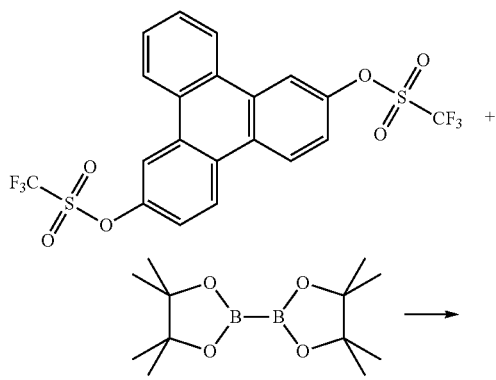

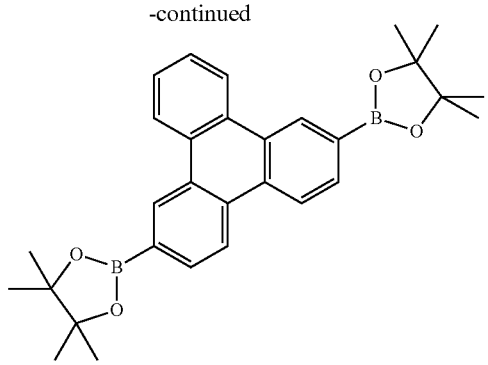

2,7-Bis-(4,4,5,5-tetramethyl-1,3,2-dioxaborolan-2-yl)triphenylene was prepared as described in the synthesis of 2,11-bis-(4,4,5,5-tetramethyl-1,3,2-dioxaborolan-2-yl)triphenylene (see Synthesis Example 7) with the exception that triphenylene-2,7-diyl bistrifluoromethanesulfonate was used as starting material instead of triphenylene-2,11-diyl bistrifluoromethanesulfonate. The reaction gave 2,7-bis-(4,4,5,5-tetramethyl-1,3,2-dioxaborolan-2-yl)triphenylene as an off-white solid (17.0 g, 98.3% isolated yield).

b. Synthesis of 2,7-bis[4-methyl-3-((3-phenyl)phenyl)phenyl]triphenylene (H2-10)

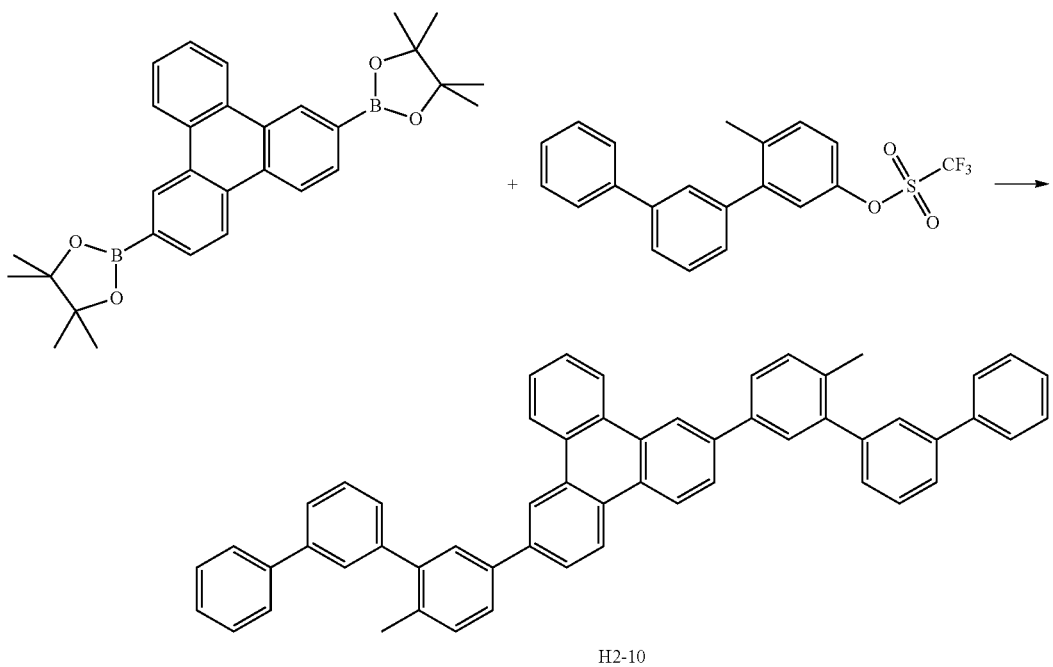

H2-10

2,7-Bis[4-methyl-3-((3-phenyl)phenyl)phenyl]triphenylene was prepared as described in the synthesis of 2,11-bis[3-((4-methyl-5-phenyl)1-phenyl)phenyl]triphenylene (H2-9, see Synthesis Example 10) with the exception that 2,7-bis-(4,4,5,5-tetramethyl-1,3,2-dioxaborolan-2-yl)triphenylene was used as starting material instead of 2,11-bis-(4,4,5,5-tetramethyl-1,3,2-dioxaborolan-2-yl)triphenylene. The reaction gave Compound H2-10 as a white powdery solid (3.07 g, 53.8% isolated yield). Final purification prior to device preparation was accomplished by vacuum sublimation.

Synthesis Example 12

This example illustrates the preparation of 2,11-bis-[2'-methyl-5'-(4''-phenyl-1'''-phenyl)phenyl]triphenylene, Compound H2-11.

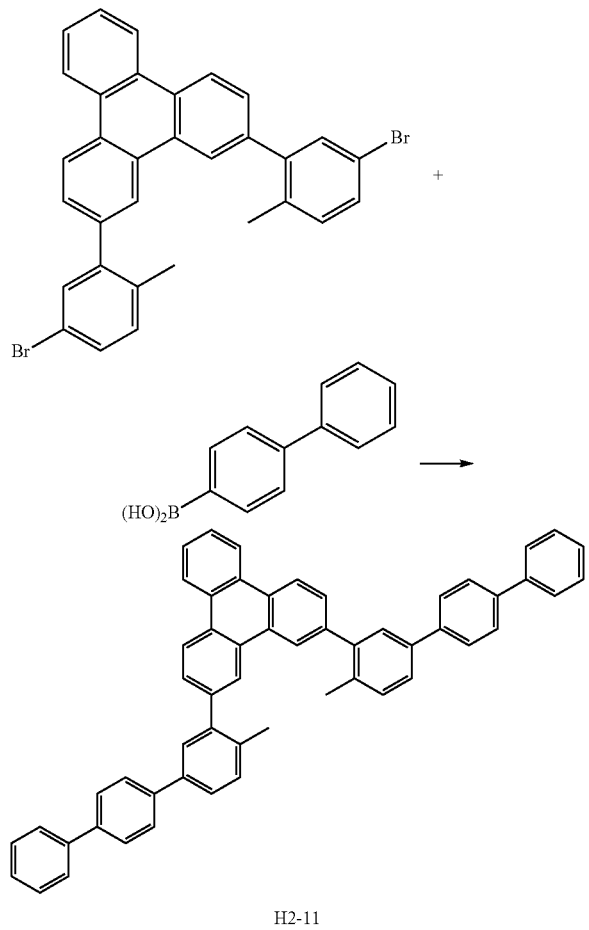

H2-11

In the same manner as described in Synthesis Example 7, 2,11-bis-(5-bromo-2-methylphenyl)triphenylene was reacted with 4-biphenylboronic acid to give H2-11 as a white powdery solid (1.49 g, 52.4% isolated yield). Final purification prior to device preparation was accomplished by vacuum sublimation.

Synthesis Example 13

This example illustrates the preparation of Compound H2-12.

a. Preparation of 1,3-bis[3-bromophenyl]phenanthro[9,10-c]furan

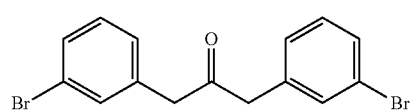

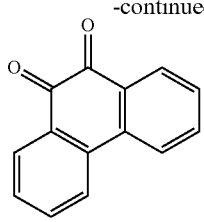

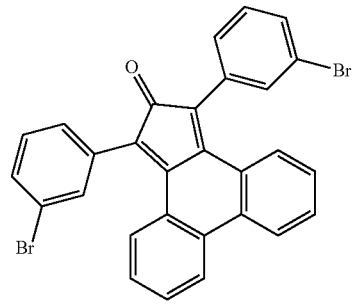

Aqueous potassium hydroxide (45 wt %, 10.37 g, 7 mL) was added via addition funnel over 15 minutes to a suspension of phenanthrene-9,10-dione (17.31 g, 83.1 mmol) and 1,3-bis(3-bromophenyl)-2-propanone (30.0 g. 81.5 mmol) in 450 mL of reagent ethanol (89-91% EtOH, 4-6% MeOH and 4-6% iPrOH). The reaction mixture was stirred overnight at room temperature. The dark gray solids were collected by filtration and washed with reagent ethanol (110 mL), then dried under vacuum overnight to give 1,3-bis[3-bromophenyl]phenanthro[9,10-c]furan (21.7 g, 49% yield).

b. Synthesis of 1,4-bis-(3-bromophenyl)-2-phenyltriphenylene

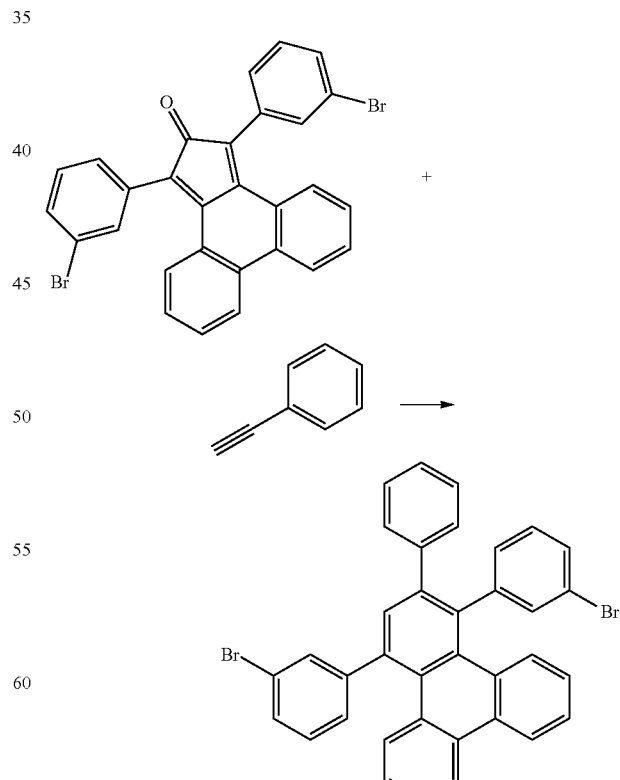

A mixture of 1,3-bis(3-bromophenyl)cyclopenta[l]phenanthren-2-one (5.40 g, 10.0 mmol) and phenylacetylene (1.53 g, 15.0 mmol) in 1,2-dichlorobenzene (50 mL) was heated to 155° C. for 5 hrs. The reaction mixture was cooled to room temperature and concentrated. The red crude oil was purified by MPLC with 0-50% dichloromethane in hexane as the mobile phase. The fractions eluting at 14-19% dichloromethane in hexane were combined, concentrated, and passed through a plug of celite/silica gel eluted with hot toluene. The collected filtrate was concentrated and crystallized from 1:2 dichloromethane:acetonitrile to give 1,4-bis-(3-bromophenyl)-2-phenyltriphenylene as an off-white solid (3.89 g, 63.3% isolated yield).

c. Synthesis of 2-phenyl-1,4-bis[3-(3-phenylphenyl)phenyl]triphenylene (H2-12)

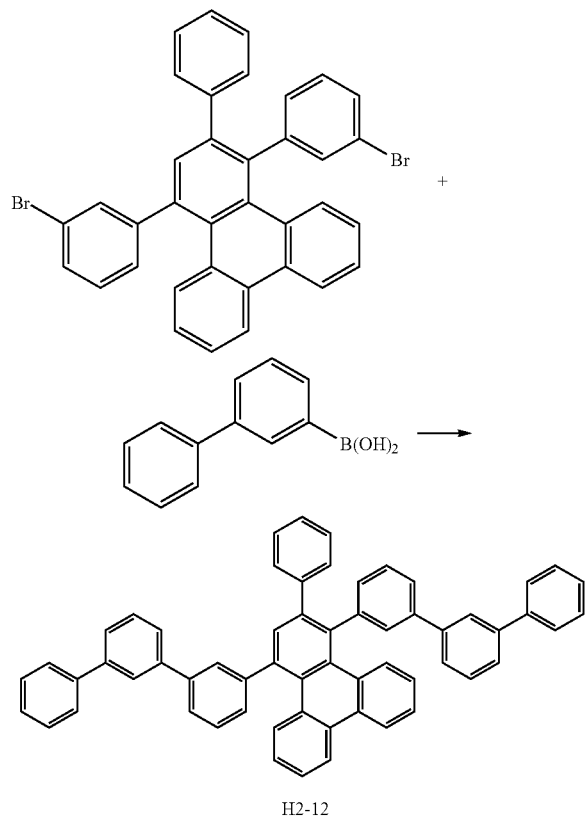

H2-12

A mixture of 1,4-bis-(3-bromophenyl)-2-phenyltriphenylene (1.84 g, 3.00 mmol), 3-biphenylboronic acid (1.43 g, 7.20 mmol), Aliquat™ 336 (0.24 g, 0.60 mmol) and aqueous sodium carbonate solution (18.8 mL, 2.0 M) in o-xylene (37.5 mL) was sparged with nitrogen for 30 minutes. Pd(PPh$_3$)$_4$ (0.17 g, 0.15 mmol) was added to the mixture and then heated at reflux for 18 hrs. The reaction mixture was cooled to room temperature and extracted with ethyl acetate (3×50 mL). The combined organic layer was washed with brine (2×100 mL), dried over magnesium sulfate, and concentrated. The crude brown oil was purified by MPLC eluting with 0-50% dichloromethane in hexane. The fractions eluting at 19-21% dichloromethane in hexane were combined, concentrated, and passed through a plug of silica gel. eluting with warm toluene. The collected filtrate was concentrated and crystallized from 1:2 dichloromethane:acetonitrile to give Compound H2-12 as an off-white solid (1.42 g, 62.3% isolated yield). Final purification prior to device preparation was accomplished by vacuum sublimation.

Synthesis Example 14

This example illustrates the preparation of Compound H2-13.

a. Synthesis of 1,4-bis(3-bromophenyl)triphenylene

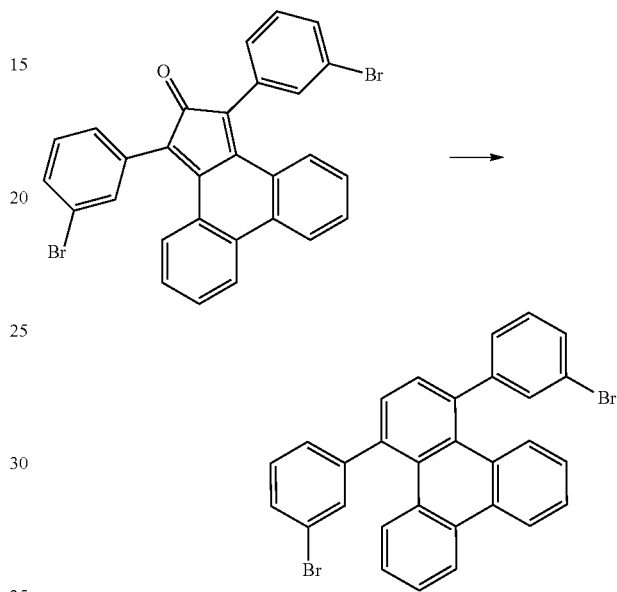

A mixture of 1,3-bis(3-bromophenyl)phenanthro[9,10-c]furan (5.0 g, 9.3 mmol) and norbornadiene (2.56 g, 27.8 mmol) in 1,2-dichlorobenzene (100 mL) was heated to 160° C. for 22 hrs. The reaction mixture was filtered through a plug of silica gel (15 g) on a fritted funnel, eluting with dichloromethane (150 mL). The filtrate was concentrated by rotary evaporation and the flask was fitted with a magnetic stir bar and placed on a Schlenk line. Methanol (25 mL) was introduced and the residue was heated at 45° C. for 30 min with stirring. The flask was removed from heat and stirred at room temperature for 2 hours. The resulting solid was collected by filtration and dried under nitrogen to give 1,4-bis-(3-bromophenyl)triphenylene (3.80 g, 76% isolated yield).

b. Synthesis of 1,4-bis[3-(3-phenylphenyl)phenyl]triphenylene (H2-13)

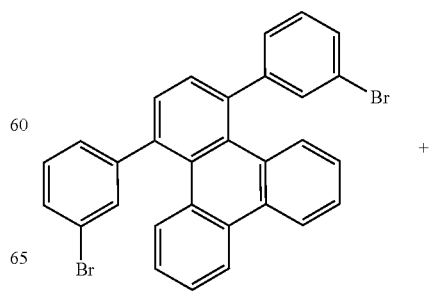

-continued

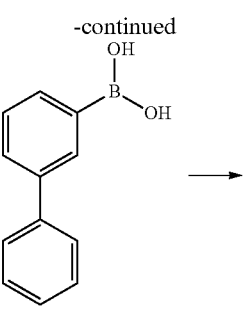

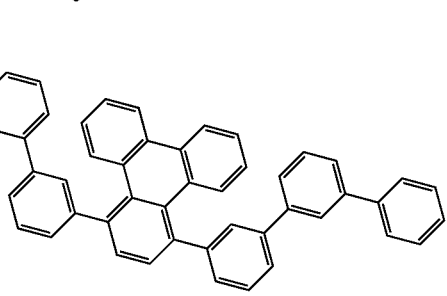

H2-13

A mixture of 1,4-bis-(3-bromophenyl)triphenylene (2.15 g, 3.99 mmol) 3-biphenylboronic acid (1.78 g, 8.99 mmol) and potassium phosphate tribasic (5.09 g, 24.0 mmol) in water (15 mL), ethanol (5 mL) and toluene (15 mL) was sparged with nitrogen for 30 minutes. Palladium acetate (0.03 g, 0.12 mmol) and tricyclohexylphosphine (0.07 g, 0.24 mmol) were added and the reaction mixture was heated at 72° C. for 24 hours, then cooled to room temperature for 1 hour. The reaction mixture was filtered and the solid was washed sequentially with 50% aqueous methanol (15 mL), methanol (15 mL) and toluene (2×5 mL) and then dried under nitrogen flow on the Buchner funnel. The solid was dissolved in dichloromethane (20 mL) and poured through a silica gel plug (10 g), eluting with dichloromethane (150 mL). The eluent was concentrated to an off-white foam that was dissolved in toluene (10 mL) at 55° C. Methanol (20 mL) was added over 20 minutes and the mixture was kept at 40° C. for 30 minutes then cooled to room temperature and allowed to stand under nitrogen overnight. The resulting solid was collected by filtration, washed with methanol (2×5 mL) and dried under vacuum to afford Compound H2-13 (1.53 g, 56% yield). Final purification prior to device preparation was accomplished by vacuum sublimation.

Synthesis Example 15

Compounds H2-1 and H2-2 can be made using a procedure analogous to Synthesis Example 9, starting with the 2-bromotriphenylene.

Synthesis Example 16

Compound H2-3 can be made using a procedure analogous to Synthesis Example 5, starting with the 2,7-ditriflate-triphenylene.

Device Examples (1) Materials

D29 is a green dopant, shown above.

ET-1 is shown below

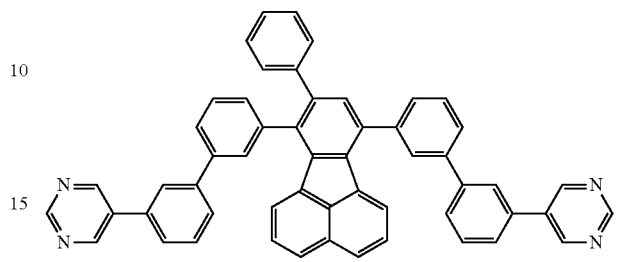

ET-2 is lithium quinolate.
ET-3 is a metal quinolate complex.
ET-4 is CsF.
HIJ-1 is a hole injection material which is made from an aqueous dispersion of an electrically conductive polymer and a polymeric fluorinated sulfonic acid. Such materials have been described in, for example, published U.S. patent applications US 2004/0102577, US 2004/0127637, and US 2005/0205860, and published PCT application WO 2009/018009.
HTM-1 is a hole transport material which is a triarylamine polymer. Such materials have been described in, for example, published US Application 2013-0082251.
Comparative Host-A is shown below.

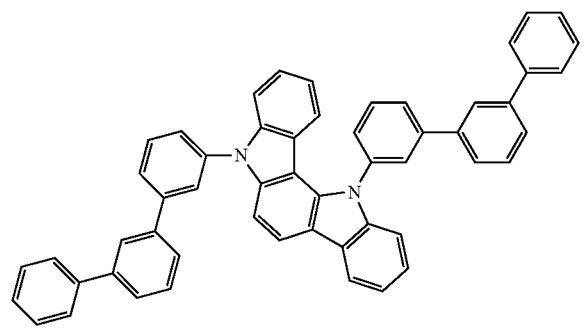 [SMILES: c1ccc(-c2cccc(-c3cccc(-n4c5ccccc5c5c4ccc4c6ccccc6n(-c6cccc(-c7cccc(-c8ccccc8)c7)c6)c45)c3)c2)cc1]

(2) Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a toluene solution of HT-1, and then heated to remove solvent. After cooling the substrates were spin-coated with a methyl benzoate solution of the host and dopant, and heated to remove solvent. The substrates were masked and placed in a vacuum chamber. A layer of electron transport material was deposited by thermal evaporation, followed by a layer of electron injection materail. Masks were then changed in vacuo and a layer of Al was deposited by thermal evaporation. The chamber was vented, and the devices were encapsulated using a glass lid, dessicant, and UV curable epoxy.

(3) Device Characterization

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

Device Examples

Examples 1-3 and Comparative Example A

These examples illustrate the device performance of a device having a photoactive layer including the new composition described above.

Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm); the host composition is given below in Table 1
Electron transport layer: E3 (10 nm)
Electron injection layer: E4 (0.7 nm)
Cathode: Al (100 nm)

TABLE 1

Device performance

| Example | Host | EQE @2000 nits | Voltage @2000 nits, volt | CIE (x, y) | T70@3600 nits, 50 C., hrs |
|---|---|---|---|---|---|
| Comp. A | 100% H1-19 | 19.7% | 6.1 | (0.319, 0.633) | 567 |
| 1 | 80% H1-19 + 20% H2-1 | 19.7% | 6 | (0.315, 0.634) | 694 |
| 2 | 70% H1-19 + 30% H2-1 | 19.2% | 5.9 | (0.313, 0.636) | 800 |
| 3 | 50% H1-19 + 50% H2-1 | 16.8% | 6 | (0.309, 0.638) | 880 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 1, it can be seen that the addition of second host H2-1 to first host H1-19, from 20% to 50%, resulted in enhancement in T70 lifetime from 567 hrs to 880 hrs.

Examples 4-6 and Comparative Example B

These examples illustrate the device performance of a device having a photoactive layer including the new composition described above.

Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm), the host is given below in Table 2
Electron transport layer: ET-3 (10 nm)
Electron injection layer: ET-4 (0.7 nm)
Cathode: Al (100 nm)

TABLE 2

Device performance

| Example | Host | EQE @2000 nits | Voltage @2000 nits, volt | CIE (x, y) | T70@3600 nits, 50 C., hrs |
|---|---|---|---|---|---|
| Comp. B | 100% H1-19 | 21.6% | 5.25 | (0.317, 0.635) | 600 |
| 4 | 80% H1-19 + 20% H2-2 | 22.2% | 5.25 | (0.311, 0.638) | 917 |
| 5 | 70% H1-19 + 30% H2-2 | 18.8% | 5.9 | (0.335, 0.623) | 893 |
| 6 | 50% H1-19 + 50% H2-2 | 19.6% | 6.5 | (0.333, 0.624) | 1060 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 2, it can be seen that the addition of H2-2 to H1-19, from 20% to 50%, resulted in enhancement in T70 lifetime from 600 hrs to 1060 hrs.

Examples 7-9 and Comparative Example C

These examples illustrate the device performance of a device having a photoactive layer including the new composition described above.

Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm), the host composition is given in Table 3 below.
Electron transport layer: ET-3 (10 nm)
Electron injection layer: ET-4 (0.7 nm)
Cathode: Al (100 nm)

TABLE 3

Device performance

| Example | Host | EQE @2000 nits | Voltage @2000 nits, volt | CIE (x, y) | T70@3600 nits, 50 C., hrs |
|---|---|---|---|---|---|
| Comp. C | 100% H1-19 | 25.0% | 5.2 | (0.316, 0.635) | 780 |

TABLE 3-continued

| | | Device performance | | | |
|---|---|---|---|---|---|
| Example | Host | EQE @2000 nits | Voltage @2000 nits, volt | CIE (x, y) | T70@3600 nits, 50 C., hrs |
| 7 | 50% H1-19 + 50% H2-2 | 17.1% | 6.75 | (0.362, 0.603) | 1030 |
| 8 | 40% H1-19 + 60% H2-2 | 19.4% | 5.5 | (0.307, 0.641) | 1460 |
| 9 | 33% H1-19 + 67% H2-2 | 18.0% | 5.3 | (0.289, 0.65) | 1560 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 3, it can be seen that the addition of second host H2-2 to first host H1-19, from 50% to 67%, resulted in enhancement in T70 lifetime from 600 hrs to 1060 hrs.

Examples 10-12 and Comparative Example D

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm), the host composition is given in Table 4 below
Electron transport layer: ET-1 (10 nm)
Electron injection layer: ET-2 (2.5 nm)
Cathode: Al (100 nm)

TABLE 4

| | | Device performance | | | |
|---|---|---|---|---|---|
| Example | Host | EQE @2000 nits | Voltage @2000 nits, volt | CIE (x, y) | T70@3600 nits, 50 C., hrs |
| Comp. D | 100% H1-19 | 23.8% | 4.1 | (0.328, 0.628) | 540 |
| 10 | 70% H1-19 + 30% H2-3 | 22.0% | 4.6 | (0.329, 0.627) | 725 |
| 11 | 50% H1-19 + 50% H2-3 | 20.6% | 5.3 | (0.331, 0.625) | 725 |
| 12 | 40% H1-19 + 60% H2-3 | 19.0% | 5.4 | (0.322, 0.632) | 900 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 4, it can be seen that the addition of second host H2-3 to first host H1-19, from 30% to 60%, resulted in enhancement in T70 lifetime from 540 hrs to 900 hrs.

Examples 13 and 14, and Comparative Example E

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm), the host composition is given in Table 5 below.
Electron transport layer: ET-1 (10 nm)
Electron injection layer: ET-2 (2.5 nm)
Cathode: Al (100 nm)

TABLE 5

| | | Device performance | | | |
|---|---|---|---|---|---|
| Example | Host | EQE @2000 nits | Voltage @2000 nits, volt | CIE (x, y) | T70@3600 nits, 50 C., hrs |
| Comp. E | 100% H1-19 | 25.3% | 4 | (0.316, 0.635) | 620 hrs |
| 13 | 50% H1-19 + 50% H2-4 | 23.7% | 4.9 | (0.302, 0.643) | 1160 hrs |
| 14 | 40% H1-19 + 60% H2-4 | 24.8% | 5.2 | (0.303, 0.643) | 1300 hrs |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 5, it can be seen that the addition of second host H2-4 to first host H1-19, from 50% to 60%, resulted in enhancement in T70 lifetime from 620 hrs to 1300 hrs.

Example 15 and Comparative Example F

This example illustrates the device performance of a device having a photoactive layer including the new composition described above. Device structure, in order (all percentages are by weight, based on the total weight of the layer):
Glass substrate
Anode: ITO (50 nm)
Hole injection layer: HIJ-1 (50 nm)
Hole transport layer: HTM-1 (20 nm)
Photoactive layer: 9% of D29+91% of host (60 nm), the host composition is given in Table 6 below.
Electron transport layer: ET-1 (10 nm)
Electron injection layer: ET-2 (2.5 nm)
Cathode: Al (100 nm)

TABLE 6

| | | Device performance | | | |
|---|---|---|---|---|---|
| Example | Host | EQE @2000 nits | Voltage @2000 nits, volt | CIE (x, y) | T70@4900 nits, 50 C., hrs |
| Comp. F | 100% H2-4 | 16% | 8.9 | (0.317, 0.634) | 460 |
| 15 | 25% H1-19 + 75% H2-4 | 20.3% | 6.7 | (0.318, 0.634) | 1200 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 6, it can be seen that the use of second host H2-4 with first host H1-19, results in a device with longer lifetimes, higher efficiency, and lower voltage than the device using the H2-4 host alone.

Examples 16-18 and Comparative Example G

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 7 below.
Electron transport layer: ET-1 (20 nm)
Electron injection layer: ET-2 (2.5 nm)
Cathode: Al (100 nm)

TABLE 7

Device performance

| Example | Host | EQE @2000 nits | Voltage @2000 nits, volt | CIE (x, y) | T70@ 5 mA/cm2, 50 C. (hrs) |
| --- | --- | --- | --- | --- | --- |
| Comp. G | 50% H1-19 + 50% Host-A | 26.2% | 5.2 | (0.284, 0.666) | 750 |
| 16 | 20% H1-19 + 80% H2-4 | 23.3% | 6.9 | (0.306, 0.652) | 2500 |
| 17 | 25% H1-19 + 75% H2-4 | 23.5% | 6.3 | (0.303, 0.654) | 2100 |
| 18 | 29% H1-19 + 71% H2-4 | 24.2% | 6.2 | (0.301, 0.656) | 2000 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 7, it can be seen that the devices with a first host H1-19 and a second host H2-4, had longer lifetimes than the comparative device with first host H1-19 and second host Host-A.

Examples 19-21 and Comparative Example H

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 8 below.
Electron transport layer: ET-1 (20 nm)
Electron injection layer: ET-2 (2.5 nm)
Cathode: Al (100 nm)

TABLE 8

Device performance

| Example | Host | EQE @2000 nits | Voltage @2000 nits, volt | CIE (x, y) | T70@ 5 mA/cm2, 50 C. (hrs) |
| --- | --- | --- | --- | --- | --- |
| Comp. H | 50% H1-19 + 50% Host-A | 22.6% | 5.3 | (0.33, 0.633) | 620 |
| 19 | 25% H1-19 + 75% H2-5 | 20.0% | 7 | (0.345, 0.622) | 800 |
| 20 | 29% H1-19 + 71% H2-5 | 21.0% | 6.8 | (0.339, 0.627) | 800 |
| 21 | 40% H1-19 + 60% H2-5 | 21.5% | 6 | (0.336, 0.63) | 700 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 8, it can be seen that the use of first host H1-19 combined with second host H2-5 resulted in devices with longer lifetimes than the comparative device with first host H1-19 combined with comparative Host-A.

Examples 22-24 and Comparative Example I

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 9 below.
Electron transport layer: ET-1 (20 nm)
Electron injection layer: ET-2 (2.5 nm)
Cathode: Al (100 nm)

TABLE 9

Device performance

| Example | Host | EQE @2000 nits | Voltage @2000 nits, volt | CIE (x, y) | T70@ 5 mA/cm2, 50 C. (hrs) |
| --- | --- | --- | --- | --- | --- |
| Comp. I | 50% H1-19 + 50% Host-A | 24.0% | 5.4 | (0.317, 0.644) | 710 |
| 22 | 25% H1-19 + 75% H2-6 | 22.7% | 6.8 | (0.327, 0.636) | 870 |
| 23 | 29% H1-19 + 71% H2-6 | 22.5% | 6.7 | (0.327, 0.636) | 880 |
| 24 | 40% H1-19 + 60% H2-6 | 22.8% | 6 | (0.327, 0.636) | 780 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 9, it can be seen that the use of first host H1-19 in combination with second host H2-6 results in devices with longer lifetimes than the comparative device with host H1-19 in combination with Host-A.

Examples 25-27 and Comparative Example J

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 10 below.
Electron transport layer: ET-1 (20 nm)
Electron injection layer: ET-2 (2.5 nm)
Cathode: Al (100 nm)

TABLE 10

Device performance

| Example | Host | EQE @2000 nits | Voltage @2000 nits, volt | CIE (x, y) | T70 @5 mA/cm2, 50 C. (hrs) |
|---|---|---|---|---|---|
| Comp. J | 50% H1-19 + 50% Host-A | 23.9% | 5.6 | (0.325, 0.638) | 690 |
| 25 | 25% H1-19 + 75% H2-7 | 20.0% | 7.7 | (0.345, 0.62) | 690 |
| 26 | 29% H1-19 + 71% H2-7 | 20.5% | 7.2 | (0.344, 0.624) | 820 |
| 27 | 40% H1-19 + 60% H2-7 | 20.6% | 6.5 | (0.34, 0.628) | 920 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 10, it can be seen that the use of first host H1-19 in combination with second host H2-7 resulted in devices with comparable or longer lifetimes than the comparative devices with first host H1-19 in combination with second Host-A.

Examples 28 and 29 and Comparative Example K

These examples illustrate the device performance of a device having a photoactive layer including the new composition described above.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 11 below.
Electron transport layer: ET-1 (20 nm)
Electron injection layer: ET-2 (2.5 nm)
Cathode: Al (100 nm)

TABLE 11

Device performance

| Example | Host | EQE @2000 nits | Voltage @2000 nits, volt | CIE (x, y) | T70 @5 mA/cm2, 50 C. (hrs) |
|---|---|---|---|---|---|
| Comp. K | 50% H1-19 + 50% Host-A | 23.0% | 5.7 | (0.33, 0.635) | 730 |
| 28 | 25% H1-19 + 75% H2-8 | 21.6% | 7.3 | (0.335, 0.632) | 1000 |
| 29 | 29% H1-19 + 71% H2-8 | 22.0% | 6.9 | (0.33, 0.635) | 900 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 11, it can be seen that the use of first host H1-19 in combination with second host H2-8 resulted in devices with longer lifetimes than the comparative device with host H1-19 in combination with comparative Host-A.

Examples 30 and 31 and Comparative Example L

These examples illustrate the device performance of a device having a photoactive layer including the new composition described above. In Example 31, the composition has a third host compound having Formula II.
Device structure, in order (all percentages are by weight, based on the total weight of the layer):
Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 12 below.
Electron transport layer: ET-1 (20 nm)
Electron injection layer: ET-2 (2.5 nm)
Cathode: Al (100 nm)

TABLE 12

Device performance

| Example | Host | EQE @2000 nits | Voltage @2000 nits, volt | CIE (x, y) | T70 @5 mA/cm2, 50 C. (hrs) |
|---|---|---|---|---|---|
| Comp. L | 50% H1-19 + 50% Host-A | 21.9% | 5.9 | (0.257, 0.668) | 417 |
| 30 | 25% H1-19 + 75% H2-5 | 21.4% | 6.9 | (0.256, 0.672) | 550 |
| 31 | 25% H1-19 + 56% H2-4 + 19% H2-5 | 21.9% | 6.8 | (0.257, 0.673) | 1200 |

Host % is the percent by weight based on the total weight of host material;
EQE = external quantum efficiency;
CIEx and CIEy are the x and y color coordinates according to the C.I.E. chromaticity scale (Commission Internationale de L'Eclairage, 1931).
T70 is the time in hours for a device to reach 70% of the initial luminance under the conditions indicated.

Based on the results in Table 12, it can be seen that the use of first host H1-19 in combination with second host H2-5 resulted in devices with longer lifetimes than the comparative device with host H1-19 in combination with comparative Host-A. The use of a third host having Formula II in Example 31, resulted is a device with even longer lifetime.

Examples 32 and 33 and Comparative Example M

These examples illustrate the device performance of a device having a photoactive layer including the new composition described above. In Example 33, the composition has a third host compound having Formula II.

Device structure, in order (all percentages are by weight, based on the total weight of the layer):

Glass substrate
Anode: ITO (50 nm)
Hole injection layer: HIJ-1 (100 nm)
Hole transport layer: HTM-1 (126 nm)
Photoactive layer: 9% of D29+91% of host (60 nm), the host composition is given in Table 13 below.
Electron transport layer: ET-1 (20 nm)
Electron injection layer: ET-2 (2.5 nm)
Cathode: Al (100 nm)

TABLE 13

Device performance

| Example | Host | EQE @2000 nits | Voltage @2000 nits, volt | CIE (x, y) | T95@ 5 mA/cm² 50 C. (hrs) | solubility |
|---|---|---|---|---|---|---|
| Comp. M | 50% H1-19 + 50% Host-A, | 23.7% | 5.1 | (0.268, 0.669) | 80 | Soluble at room temp |
| 32 | 25% H1-19 + 75% H2-4 comparative | 23.6% | 6.2 | (0.277, 0.667) | 135 | Soluble at 110 C. |
| 33 | 25% H1-19 + 56% H2-4 + 19% H2-5 | 23.6% | 6.3 | (0.27, 0.669) | 172 | Soluble at room temp |

Host % is the percent by weight based on the total weight of host material; EQE = external quantum efficiency; CIEx and CIEy are the x and y color coordinates according to the C.I.E. chromaticity scale (Commission Internationale de L'Eclairage, 1931). T70 is the time in hours for a device to reach 70% of the initial luminance under the conditions indicated.

Based on the results in Table 13, it can be seen that the use of first host H1-19 in combination with second host H2-4 resulted in devices with longer lifetimes than the comparative device with host H1-19 in combination with comparative Host-A. The use of a third host having Formula II in Example 31, H2-5, resulted is a device with even longer lifetime. The solubility of the ternary host in Example 33 is also higher compared to the binary host of Example 32.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A composition comprising (a) a dopant capable of electroluminescence having an emission maximum between 380 and 750 nm, (b) a first host compound having at least one unit of Formula I

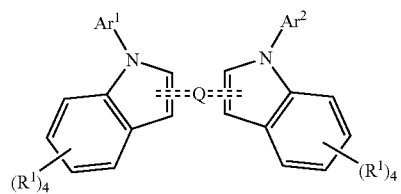

Formula I wherein:

Q is a fused ring linkage having the formula

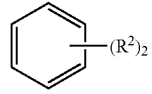

$Ar^1$ is selected from the group consisting of aromatic groups including at least one electron-withdrawing group and deuterated analogs thereof;

$Ar^2$ is selected from the group consisting of aryl groups, aromatic groups including electron transporting groups, and deuterated analogs thereof; and $R^1$ and $R^2$ are the same or different at each occurrence and are selected from the group consisting of H, D, aryl, and deuterated aryl; and (c) a second host compound having Formula II

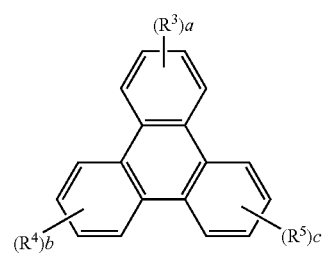

Formula II wherein:

$R^3$ is the same or different at each occurrence and has Formula IV

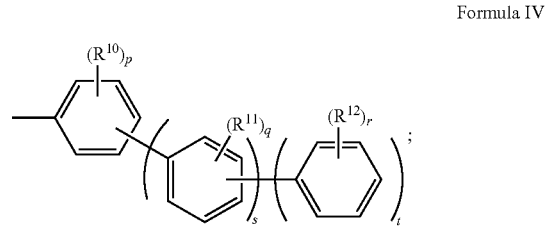

Formula IV $R^4$ and $R^5$ are the same or different at each occurrence and are selected from the group consisting of D, hydrocarbon aryl, and deuterated hydrocarbon aryl;

$R^{10}$, is the same or different at each occurrence and is selected from the group consisting of D, alkyl, alkoxy, silyl, siloxy, deuterated alkyl, deuterated alkoxy, deuterated silyl, deuterated siloxy, wherein at least one $R^{10}$ is not D;

$R^{11}$ and $R^{12}$ are the same or different at each occurrence and are selected from the group consisting of D, alkyl, hydrocarbon aryl, silyl, alkoxy, aryloxy, siloxy, deuterated alkyl, deuterated hydrocarbon aryl, deuterated silyl, deuterated alkoxy, deuterated aryloxy, and deuterated siloxy, or adjacent $R^{10}$, $R^{11}$, or $R^{12}$ groups can join together to form a 6-membered fused ring;

a is an integer from 1-4;
b and c are the same or different and are an integer from 0-4;
p is an integer from 1-4;
g is an integer from 0-5, with the proviso that when g=5, t=0;
r is an integer from 0-5;
s is an integer from 1-4; and
t is 0 or 1.

2. The composition of claim 1, wherein the first host compound is at least 10% deuterated.

3. The composition of claim 1, wherein the ratio of first host compound to the total amount of second host compound is in the range of 1:20 to 20:1.

4. The composition of claim 1, wherein the first host compound has at least one unit of Formula I-a or Formula I-b

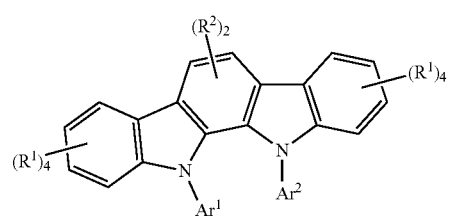

Formula I-a

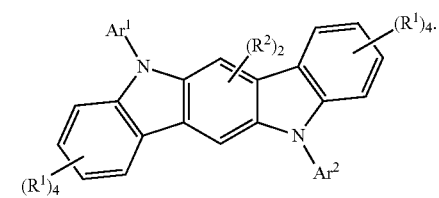

Formula I-b

5. The composition of claim 1, wherein $Ar^1$ is selected from the group consisting of N-heterocycles, an N,O-heterocycles, and deuterated analogs thereof.

6. The composition of claim 1, wherein Ar² is selected from the group consisting of D, phenyl, naphthyl, substituted naphthyl, styryl, pyridine, pyrimidine, triazine, a deuterated analog thereof, and a substituent of Formula III

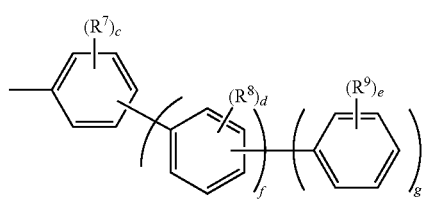

Formula III wherein:
$R^7$, $R^8$, and $R^9$ are the same or different at each occurrence and are selected from the group consisting of D, aryl, silyl, alkoxy, aryloxy, cyano, vinyl, allyl, dialkylamine, diarylamine, carbazole, and a deuterated analog thereof, or adjacent $R^7$, $R^8$, or $R^9$ groups can join together to form a 6-membered fused ring;

c is an integer from 0-5, with the proviso that when c=5, f=g=0;
d is an integer from 0-5, with the proviso that when d=5, g=0;
e is an integer from 0-5;
f is an integer from 0-5
g is 0 or 1.

7. The composition of claim 1, wherein at least one $R^5$ is selected from the group consisting of biphenyl, terphenyl, tetraphenyl, and deuterated analogs thereof.

8. The composition of claim 1, wherein $R^4$ and $R^5$ have Formula IV

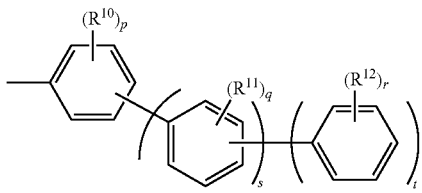

Formula IV wherein:
$R^{10}$, is the same or different at each occurrence and is selected from the group consisting of D, alkyl, alkoxy, silyl, siloxy, deuterated alkyl, deuterated alkoxy, deuterated silyl, deuterated siloxy, wherein at least one $R^{10}$ is not D;
$R^{11}$ and $R^{12}$ are the same or different at each occurrence and are selected from the group consisting of D, alkyl, hydrocarbon aryl, silyl, alkoxy, aryloxy, siloxy, deuterated alkyl, deuterated hydrocarbon aryl, deuterated silyl, deuterated alkoxy, deuterated aryloxy, and deuterated siloxy, or adjacent $R^{10}$, $R^{11}$, or $R^{12}$ groups can join together to form a 6-membered fused ring;
p is an integer from 1-4;
q is an integer from 0-5, with the proviso that when q=5, t=0;
r is an integer from 0-5;
s is an integer from 1-4; and
t is 0 or 1.

9. The composition of claim 1, wherein at least one $R^4$ is selected from the group consisting of biphenyl, terphenyl, tetraphenyl, and deuterated analogs thereof.

10. The composition of claim 1, further comprising (d) a third host compound having Formula II, wherein the third host compound is different from the second host compound.

11. An organic electronic device comprising a first electrical contact layer, a second electrical contact layer, and a photoactive layer therebetween, wherein the photoactive layer comprises (a) a dopant capable of electroluminescence having an emission maximum between 380 and 750 nm,
(b) a first host compound having at least one unit of Formula I

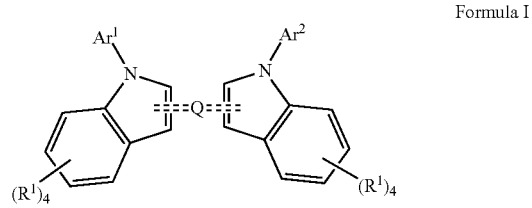

Formula I wherein:

Q is a fused ring linkage having the formula

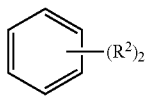

Ar$^1$ is selected from the group consisting of aromatic groups including at least one electron-withdrawing group and deuterated analogs thereof;

Ar$^2$ is selected from the group consisting of aryl groups, aromatic groups including electron transporting groups, and deuterated analogs thereof; and R$^1$ and R$^2$ are the same or different at each occurrence and are selected from the group consisting of H, D, aryl, and deuterated aryl; and (c) a second host compound having Formula II

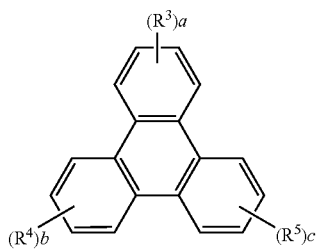

Formula II wherein:

R$^3$ is the same or different at each occurrence and has Formula IV

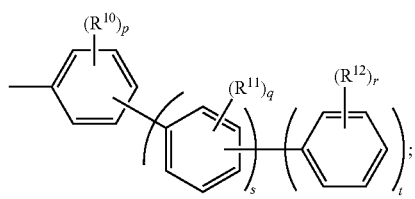

Formula IV

R$^4$ and R$^5$ are the same or different at each occurrence and are selected from the group consisting of D, hydrocarbon aryl, and deuterated hydrocarbon aryl;

R$^{10}$, is the same or different at each occurrence and is selected from the group consisting of D, alkyl, alkoxy, silyl, siloxy, deuterated alkyl, deuterated alkoxy, deuterated silyl, deuterated siloxy, wherein at least one R$^{10}$ is not D;

R$^{11}$ and R$^{12}$ are the same or different at each occurrence and are selected from the group consisting of D, alkyl, hydrocarbon aryl, silyl, alkoxy, aryloxy, siloxy, deuterated alkyl, deuterated hydrocarbon aryl, deuterated silyl, deuterated alkoxy, deuterated aryloxy, and deuterated siloxy, or adjacent R$^{10}$, R$^{11}$, or R$^{12}$ groups can join together to form a 6-membered fused ring;

a is an integer from 1-4;

b and c are the same or different and are an integer from 0-4;

p is an integer from 1-4;

g is an integer from 0-5, with the proviso that when g=5, t=0;

r is an integer from 0-5;

s is an integer from 1-4; and t is 0 or 1.

12. The device of claim 11, wherein the dopant is a cyclometalated complex of iridium or platinum.

13. The device of claim 11, wherein the first host compound has a purity of at least 99.9% as measured by UPLC with photodiode array detection.

14. The device of claim 11, where the second host compound has a purity of at least 99.9% as measured by UPLC with photodiode array detection.

15. The device of claim 11, wherein the second host compound has less than 50 ppm of oxygen-containing impurities.

16. The device of claim 11, wherein the photoactive layer further comprises (d) a third host compound having Formula II, where the third host compound is different from the second host compound.

17. The composition of claim 1, wherein the second host is selected from the group consisting of Compounds H2-5, H2-6, H2-9 through H2-11, H2-16, H2-17, H2-18, H2-24, and H2-27

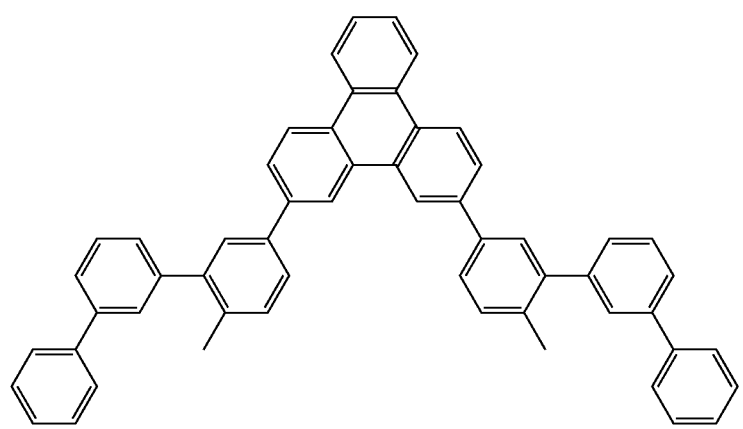

Compound H2-5

Compound H2-6
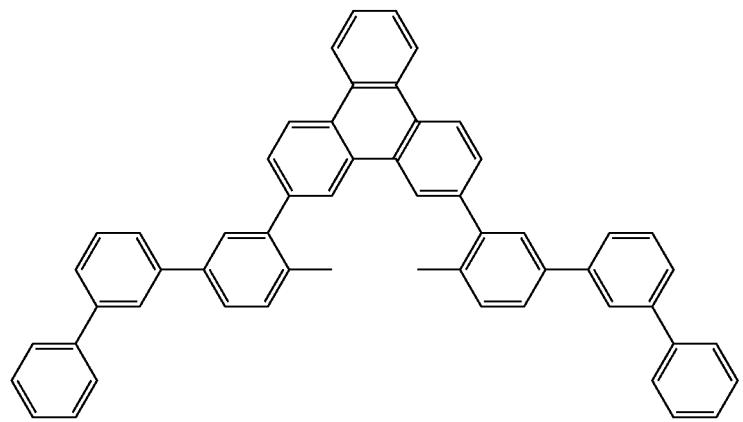
Compound H2-9
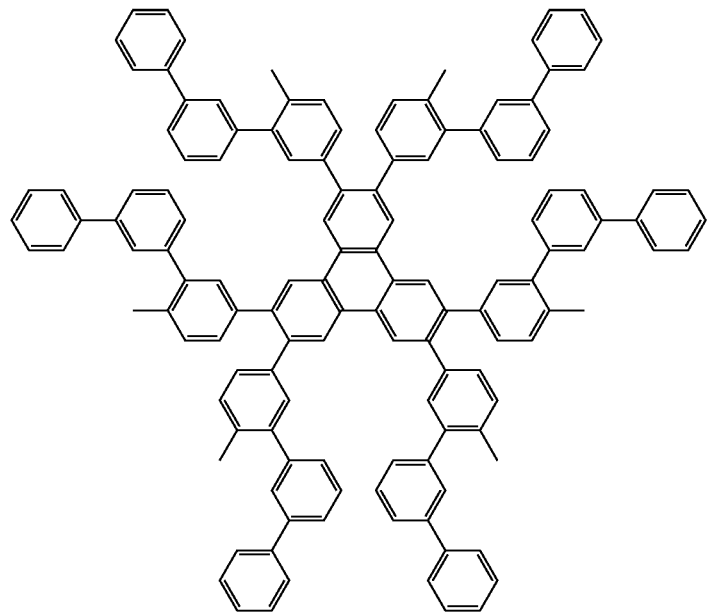
Compound H2-10
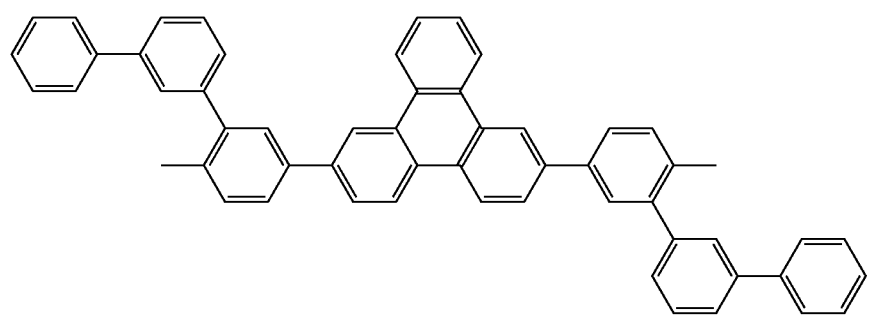
Compound H2-11
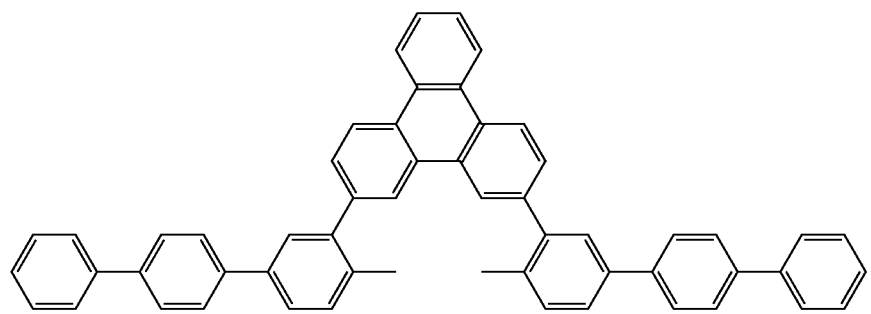

-continued
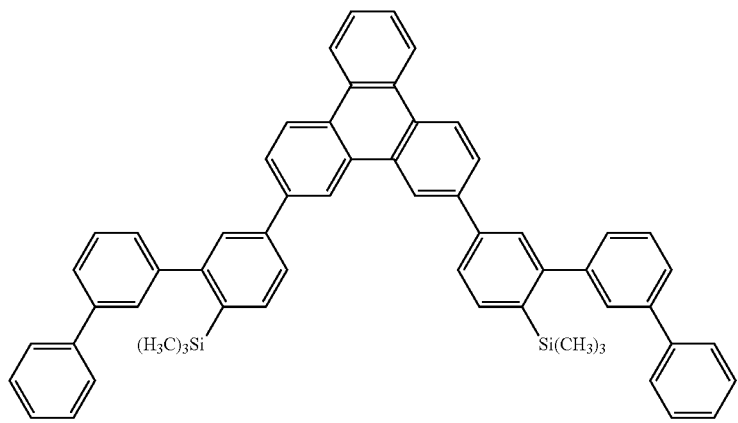
Compound H2-16
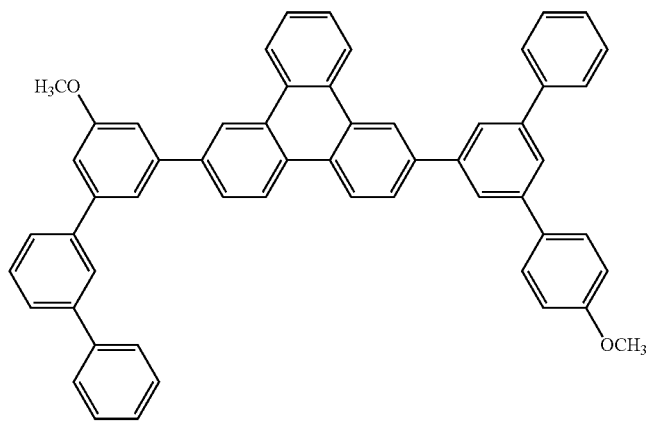
Compound H2-17
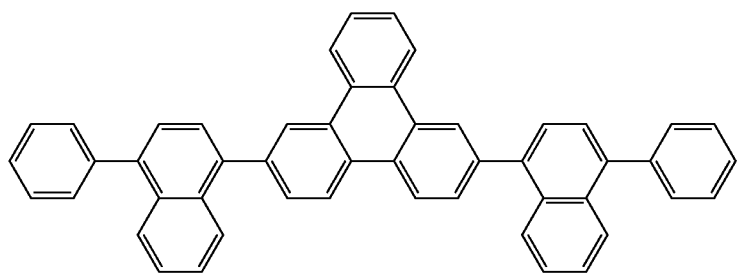
Compound H2-18
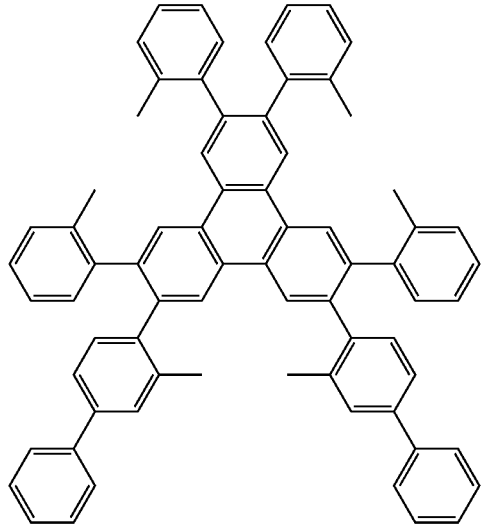
Compound H2-24

-continued
Compound H2-27
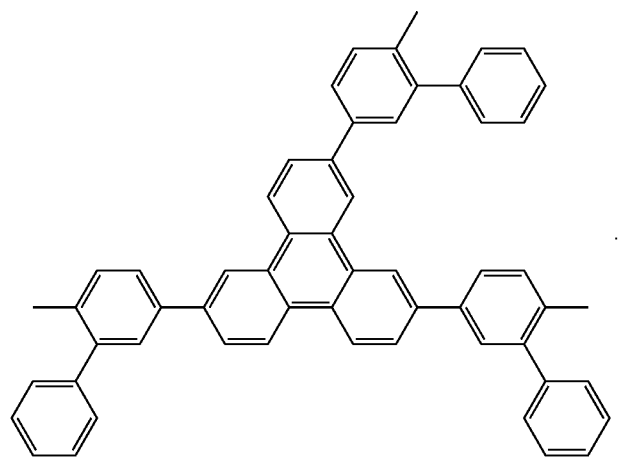
18. The device of claim 11, wherein the second host is selected from the group consisting of Compounds H2-5, H2-6, H2-9 through H2-11, H2-16, H2-17, H2-18, H2-24, and H2-27
Compound H2-5
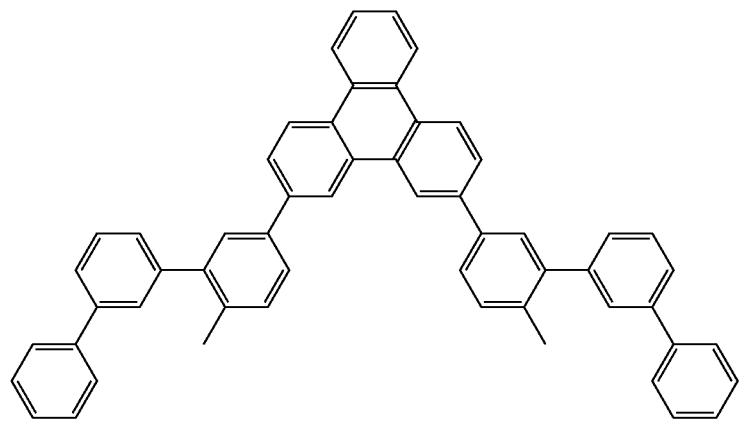
Compound H2-6
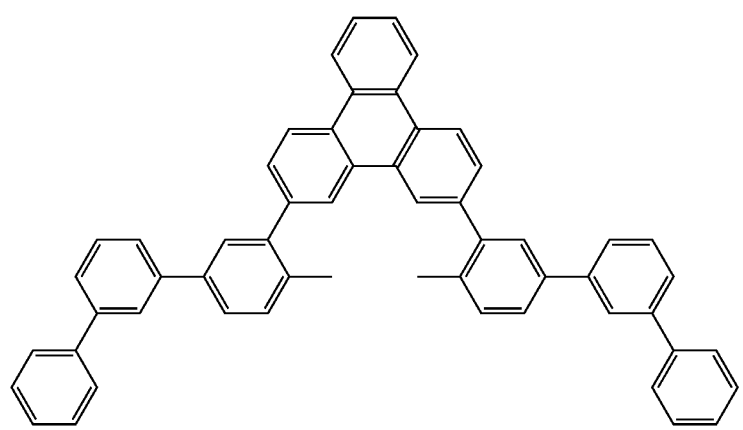

-continued
Compound H2-9
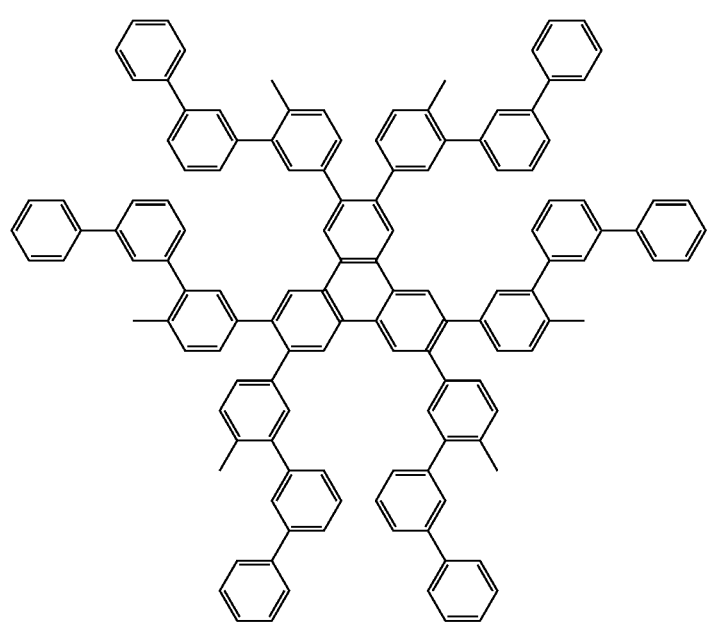
Compound H2-10
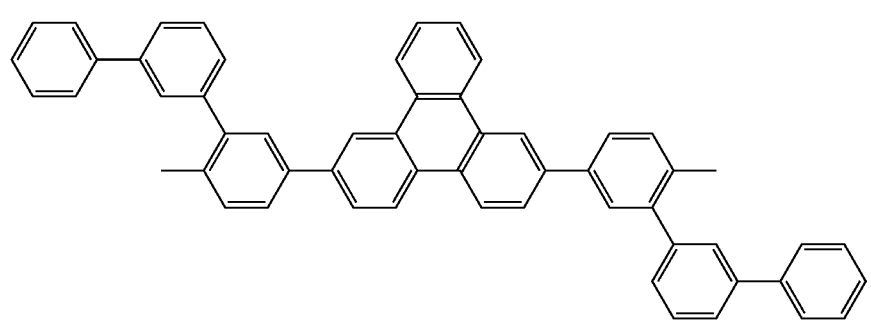
Compound H2-11
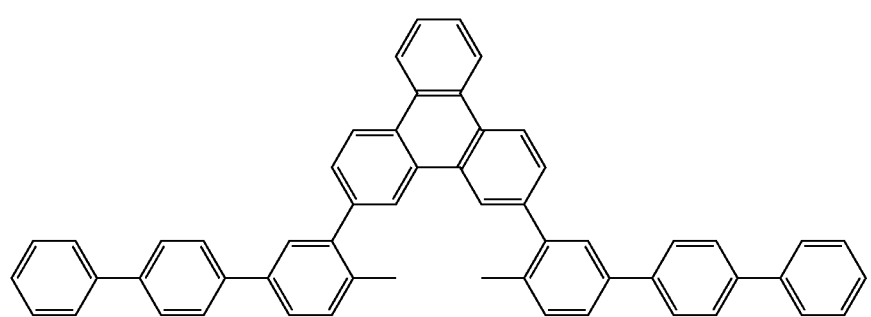
Compound H2-16
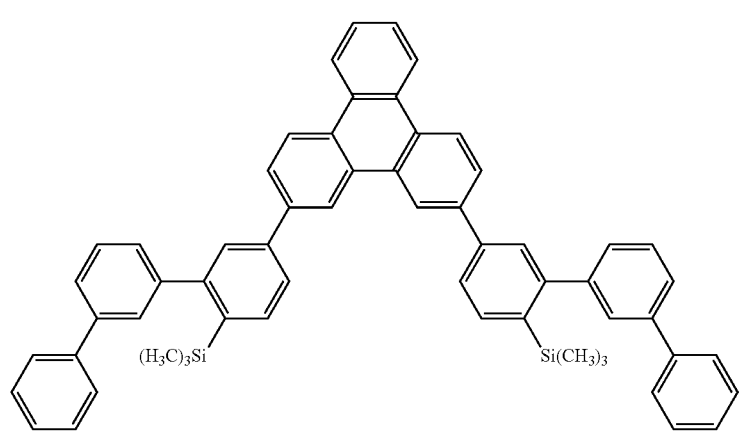

-continued
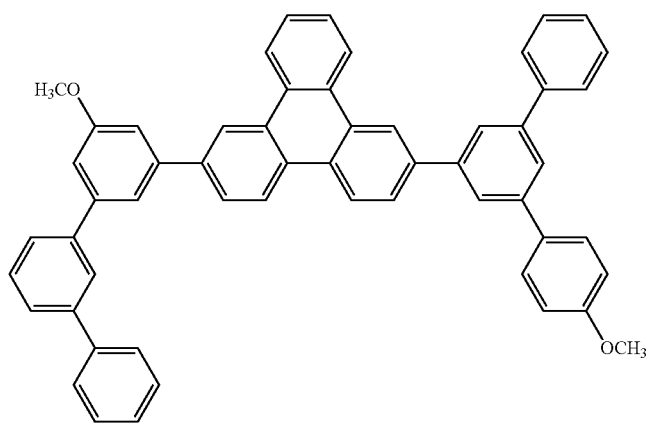
Compound H2-17
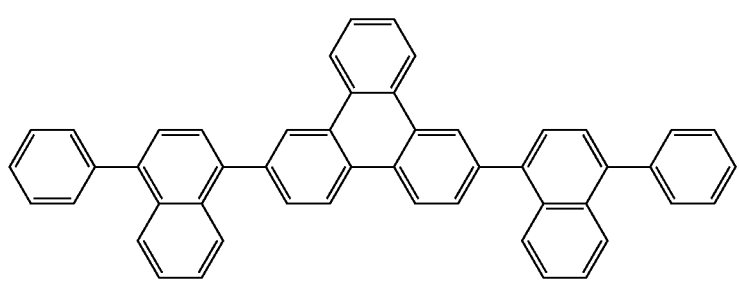
Compound H2-18
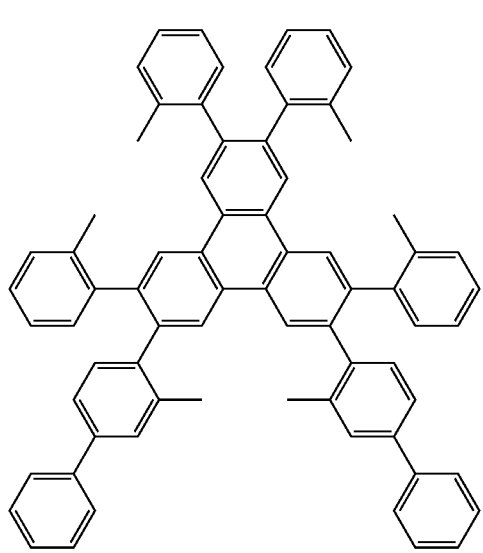
Compound H2-24

-continued

Compound H2-27

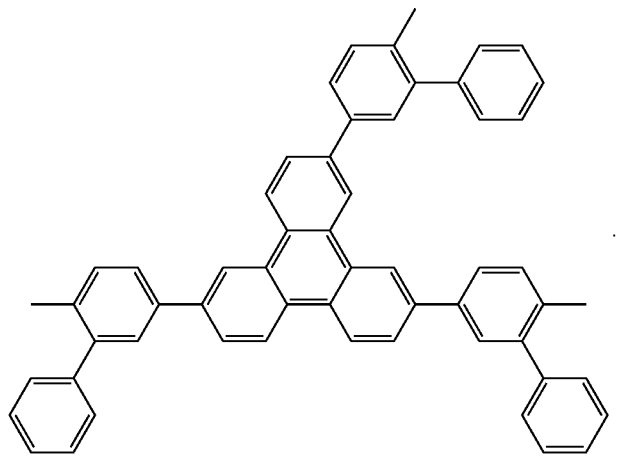

19. The device of claim 11, wherein $R^4$ and $R^5$ are selected from the group consisting of biphenyl, terphenyl, tetraphenyl, and deuterated analogs thereof.

20. The device of claim 11, wherein $R^4$ and $R^5$ have Formula IV

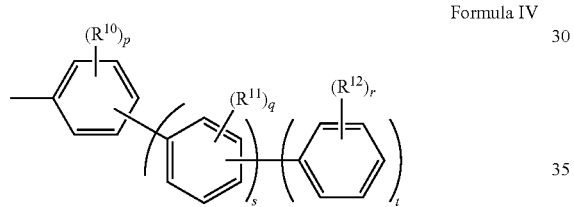

Formula IV wherein:

$R^{10}$, is the same or different at each occurrence and is selected from the group consisting of D, alkyl, alkoxy, silyl, siloxy, deuterated alkyl, deuterated alkoxy, deuterated silyl, deuterated siloxy, wherein at least one $R^{10}$ is not D;

$R^{11}$ and $R^{12}$ are the same or different at each occurrence and are selected from the group consisting of D, alkyl, hydrocarbon aryl, silyl, alkoxy, aryloxy, siloxy, deuterated alkyl, deuterated hydrocarbon aryl, deuterated silyl, deuterated alkoxy, deuterated aryloxy, and deuterated siloxy, or adjacent $R^{10}$, $R^{11}$, or $R^{12}$ groups can join together to form a 6-membered fused ring;

p is an integer from 1-4;

q is an integer from 0-5, with the proviso that when q=5, t=0;

r is an integer from 0-5;

s is an integer from 1-4; and t is 0 or 1.

* * * * *